United States Patent
Kang et al.

(10) Patent No.: US 12,054,565 B2
(45) Date of Patent: Aug. 6, 2024

(54) POLYMER AND ORGANIC LIGHT EMITTING DEVICE COMPRISING THE SAME

(71) Applicant: LG Chem, Ltd., Seoul (KR)

(72) Inventors: Esder Kang, Daejeon (KR); Jaesoon Bae, Daejeon (KR); Jaechol Lee, Daejeon (KR); Jiyeon Shin, Daejeon (KR); Beomgoo Kang, Daejeon (KR); Minseob Seo, Daejeon (KR); Hyungil Park, Daejeon (KR)

(73) Assignee: LG Chem, Ltd., Seoul (KR)

( * ) Notice: Subject to any disclaimer, the term of this patent is extended or adjusted under 35 U.S.C. 154(b) by 1163 days.

(21) Appl. No.: 16/652,899

(22) PCT Filed: Jul. 31, 2019

(86) PCT No.: PCT/KR2019/009568
§ 371 (c)(1),
(2) Date: Apr. 1, 2020

(87) PCT Pub. No.: WO2020/027589
PCT Pub. Date: Feb. 6, 2020

(65) Prior Publication Data
US 2020/0291175 A1    Sep. 17, 2020

(30) Foreign Application Priority Data

Jul. 31, 2018  (KR) .......... 10-2018-0089565
Jul. 30, 2019  (KR) .......... 10-2019-0092669

(51) Int. Cl.
| | | |
|---|---|---|
| *C08F 212/32* | (2006.01) | |
| *C08F 212/14* | (2006.01) | |
| *H01L 51/54* | (2006.01) | |
| *H10K 85/10* | (2023.01) | |
| *H10K 50/15* | (2023.01) | |
| *H10K 85/60* | (2023.01) | |

(52) U.S. Cl.
CPC .......... *C08F 212/32* (2013.01); *C08F 212/28* (2020.02); *H10K 85/141* (2023.02); *H10K 85/151* (2023.02); *H10K 50/15* (2023.02); *H10K 85/615* (2023.02); *H10K 85/633* (2023.02); *H10K 85/6572* (2023.02)

(58) Field of Classification Search
None
See application file for complete search history.

(56) References Cited

U.S. PATENT DOCUMENTS

| | | | |
|---|---|---|---|
| 2004/0251816 A1 | 12/2004 | Leo et al. | |
| 2004/0258953 A1* | 12/2004 | Kido | H10K 85/141 |
| | | | 428/917 |
| 2007/0063191 A1 | 3/2007 | Inbasekaran et al. | |
| 2011/0127516 A1* | 6/2011 | Nakatani | C08G 61/12 |
| | | | 524/610 |
| 2013/0112957 A1* | 5/2013 | Adhikari | C09B 69/101 |
| | | | 257/40 |
| 2015/0171335 A1* | 6/2015 | Kim | H10K 85/6572 |
| | | | 257/40 |
| 2016/0133842 A1 | 5/2016 | Fujiyama et al. | |
| 2017/0186950 A1 | 6/2017 | Ito | |
| 2019/0214568 A1 | 7/2019 | Kang et al. | |
| 2019/0280206 A1 | 9/2019 | Lee et al. | |

FOREIGN PATENT DOCUMENTS

| | | |
|---|---|---|
| JP | 2006152263 A | 6/2006 |
| JP | 2013014770 A | 1/2013 |
| JP | 2017119785 A | 7/2017 |
| KR | 20000051826 A | 8/2000 |
| KR | 20110043717 A | 4/2011 |
| KR | 20170077774 A | 7/2017 |
| KR | 20180059187 A | 6/2018 |
| KR | 20180059379 A | 6/2018 |
| TW | 201823188 A | 7/2018 |
| WO | 03012890 A2 | 2/2003 |
| WO | 2014185079 A1 | 11/2014 |
| WO | 2017031622 A1 | 3/2017 |
| WO | 2017107117 A1 | 6/2017 |
| WO | 2018005318 A1 | 1/2018 |

OTHER PUBLICATIONS

Cho et al. "Diversification of Carbazoles by LiCl-mediated Catalytic CuI Reaction", Bulletin of the Korean Chemical Society, Jul. 2011, vol. 32, No. 7, pp. 2461-2464.
International Search Report from Application No. PCT/KR2019/009568 mailed Nov. 18, 2019, 2 pages.
Taiwanese Search Report for Application No. 108127222, dated May 8, 2020, 1 page.

* cited by examiner

*Primary Examiner* — Andrew K Bohaty
(74) *Attorney, Agent, or Firm* — Lerner David LLP

(57) ABSTRACT

The present invention provides a novel polymer and an organic light emitting device including the same.

18 Claims, 1 Drawing Sheet

[FIG. 1]
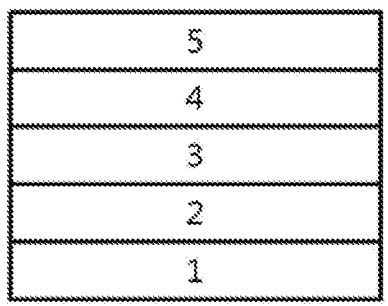
[FIG. 2]
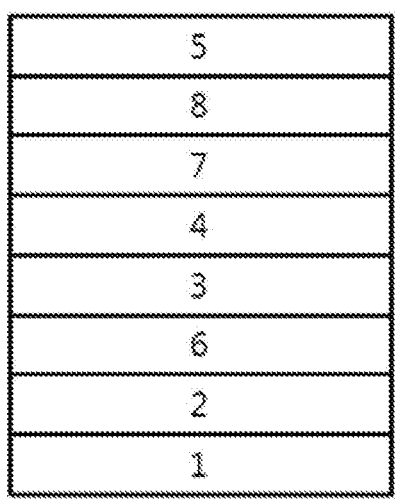

POLYMER AND ORGANIC LIGHT EMITTING DEVICE COMPRISING THE SAME

CROSS-REFERENCE TO RELATED APPLICATIONS

This application is a national phase entry under 35 U.S.C. § 371 of International Application No. PCT/KR2019/009568 filed Jul. 31, 2019, which claims priority from Korean Patent Application Nos. 10-2018-0089565 filed Jul. 31, 2018, and 10-2019-0092669 filed Jul. 30, 2019, all of which are incorporated herein by reference.

TECHNICAL FIELD

The present invention relates to a novel polymer and an organic light emitting device comprising the same.

BACKGROUND ART

In general, an organic light emitting phenomenon refers to a phenomenon where electric energy is converted into light energy by using an organic material. The organic light emitting device using the organic light emitting phenomenon has characteristics such as a wide viewing angle, an excellent contrast, a fast response time, an excellent luminance, driving voltage and response speed, and thus many studies have proceeded.

The organic light emitting device generally has a structure which comprises an anode, a cathode, and an organic material layer interposed between the anode and the cathode. The organic material layer frequently has a multilayered structure that comprises different materials in order to enhance efficiency and stability of the organic light emitting device, and for example, the organic material layer may be formed of a hole injection layer, a hole transport layer, a light emitting layer, an electron transport layer, an electron injection layer and the like. In the structure of the organic light emitting device, if a voltage is applied between two electrodes, the holes are injected from an anode into the organic material layer and the electrons are injected from the cathode into the organic material layer, and when the injected holes and electrons meet each other, an exciton is formed, and light is emitted when the exciton falls to a ground state again.

There is a continuing need for the development of new materials for the organic materials used in the organic light emitting devices described above.

Meanwhile, recently, in order to reduce process costs, an organic light emitting device using a solution process, particularly an inkjet process, has been developed instead of a conventional deposition process. In the initial stage of development, attempts have been made to develop organic light emitting devices by coating all organic light emitting device layers by a solution process, but current technology has limitations. Therefore, only HIL, HTL, and EML are processed in a layer device structure by a solution process, and a hybrid process utilizing traditional deposition processes is being studied as a subsequent process.

Accordingly, the present invention provides a novel material for organic light emitting devices capable of being deposited by a solution process while being used for an organic light emitting device.

PRIOR ART LITERATURE

Patent Literature (Patent Literature 0001) Korean Patent Laid-open Publication No. 10-2000-0051826

DETAILED DESCRIPTION OF THE INVENTION

Technical Problem

It is an object of the present invention to provide a novel polymer and an organic light emitting device including the same.

Technical Solution

In one aspect of the invention, there is provided a polymer including a repeating unit represented by the following Chemical Formula 1, a repeating unit represented by the following Chemical Formula 2, and a repeating unit represented by the following Chemical Formula 3.

[Chemical Formula 1]

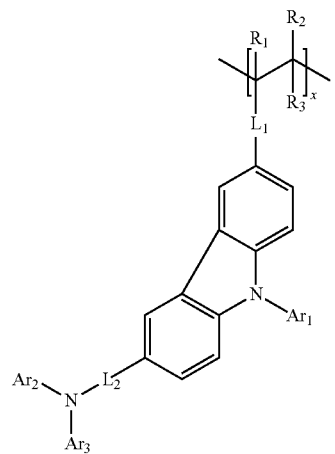

in Chemical Formula 1, $R_1$ to $R_3$ are each independently hydrogen, or a $C_{1-10}$ alkyl, $L_1$ is a substituted or unsubstituted $C_{6-60}$ arylene; or a substituted or unsubstituted $C_{2-60}$ heteroarylene containing one or more selected from the group consisting of N, O and S, $L_2$ is a single bond; a substituted or unsubstituted $C_{6-60}$ arylene; or a substituted or unsubstituted $C_{2-60}$ heteroarylene containing one or more selected from the group consisting of N, O and S, $Ar_1$ is a substituted or unsubstituted $C_{6-60}$ aryl, or a substituted or unsubstituted $C_{2-60}$ heteroaryl containing one or more selected from the group consisting of N, O and S, $Ar_2$ and $Ar_3$ are each independently a substituted or unsubstituted $C_{1-60}$ alkoxy, a substituted or unsubstituted $C_{6-60}$ aryl, or a substituted or unsubstituted $C_{2-60}$ heteroaryl containing one or more selected from the group consisting of N, O and S,

[Chemical Formula 2]

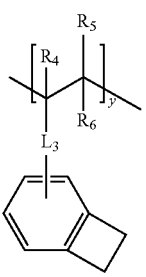

wherein, in Chemical Formula 2, $R_4$ to $R_6$ are each independently hydrogen, or a $C_{1-10}$ alkyl, $L_3$ is a single bond; a substituted or unsubstituted $C_{6-60}$ arylene; (substituted or unsubstituted $C_{6-60}$ arylene)—O—; (substituted or unsubstituted $C_{6-60}$ arylene)-O—(substituted or unsubstituted $C_{1-60}$ alkylene); or a substituted or unsubstituted $C_{2-60}$ heteroarylene containing one or more selected from the group consisting of N, O and S,

[Chemical Formula 3]

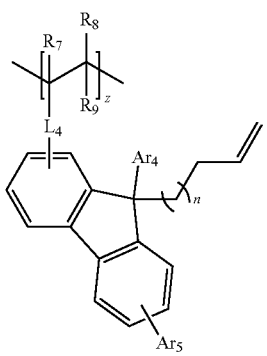

wherein, in Chemical Formula 3, $R_7$ to $R_9$ are each independently hydrogen, or a $C_{1-10}$ alkyl, $L_4$ is a single bond; a substituted or unsubstituted $C_{6-60}$ arylene; or a substituted or unsubstituted $C_{2-60}$ heteroarylene containing one or more selected from the group consisting of N, O and S, $Ar_4$ is a substituted or unsubstituted $C_{3-60}$ cycloalkyl, a substituted or unsubstituted $C_{6-60}$ aryl, or a substituted or unsubstituted $C_{2-60}$ heteroaryl containing one or more selected from the group consisting of N, O and S, $Ar_5$ is hydrogen, or a substituted or unsubstituted $C_{6-60}$ aryl, and n is an integer of 0 to 5.

In another aspect of the invention, there is provided an organic light emitting device including an anode; a cathode provided opposite to the anode; a light emitting layer provided between the anode and the cathode; and a hole transport layer provided between the anode and the light emitting layer, wherein the hole transport layer includes the above-mentioned polymer.

Advantageous Effects

The polymer according to the present invention can be used as a material of a hole transport layer of an organic light emitting device, is capable of being deposited by a solution process, and can improve the efficiency, achieve low driving voltage and/or improve lifetime characteristics in the organic light emitting device.

BRIEF DESCRIPTION OF DRAWINGS

FIG. 1 shows an example of an organic light emitting device comprising a substrate 1, an anode 2, a hole transport layer 3, a light emitting layer 4, and a cathode 5.

FIG. 2 shows an example of an organic light emitting device comprising a substrate 1, an anode 2, a hole injection layer 6, a hole transport layer 3, a light emitting layer 4, an electron transport layer 7, an electron injection layer 8 and a cathode 5.

DETAILED DESCRIPTION OF THE EMBODIMENTS

Hereinafter, the present invention will be described in more detail to help understanding of the present invention.

As used herein, the notation

means a bond linked to another substituent group.

As used herein, the term "substituted or unsubstituted" means being unsubstituted or substituted with one or more substituents selected from the group consisting of deuterium; a halogen group; a nitrile group; a nitro group; a hydroxy group; a carbonyl group; an ester group; an imide group; an amino group; a phosphine oxide group; an alkoxy group; an aryloxy group; an alkylthioxy group; an arylthioxy group; an alkylsulfoxy group; an arylsulfoxy group; a silyl group; a boron group; an alkyl group; a cycloalkyl group; an alkenyl group; an aryl group; an aralkyl group; an aralkenyl group; an alkylaryl group; an alkylamine group; an aralkylamine group; a heteroarylamine group; an arylamine group; an arylphosphine group; and a heterocyclic group containing at least one of N, O and S atoms, or being unsubstituted or substituted with a substituent to which two or more substituents are linked among the substituents exemplified above. For example, "the substituent to which two or more substituents are linked" may be a biphenyl group. That is, the biphenyl group may be interpreted as an aryl group, or a substituent to which two phenyl groups are linked.

In the present specification, the number of carbon atoms of a carbonyl group is not particularly limited, but is preferably 1 to 40. Specifically, the carbonyl group may be a compound having the following structural formulae, but is not limited thereto.

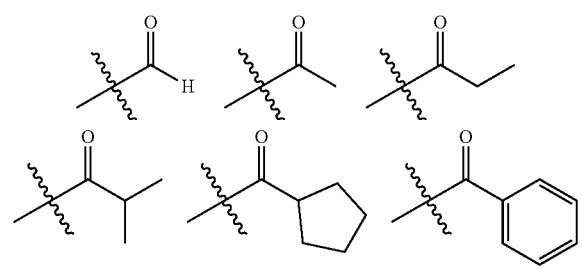

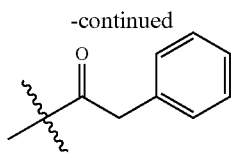

In the present specification, an ester group may have a structure in which oxygen of the ester group may be substituted by a straight-chain, branched-chain, or cyclic alkyl group having 1 to 25 carbon atoms, or an aryl group having 6 to 25 carbon atoms. Specifically, the ester group may be a compound having the following structural formulae, but is not limited thereto.

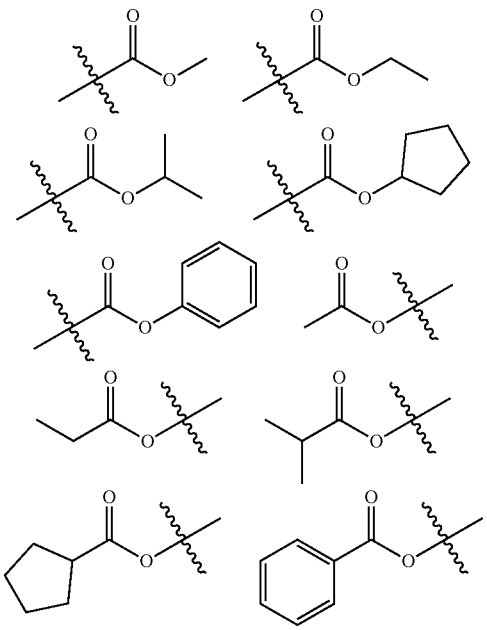

In the present specification, the number of carbon atoms of an imide group is not particularly limited, but is preferably 1 to 25. Specifically, the imide group may be a compound having the following structural formulae, but is not limited thereto.

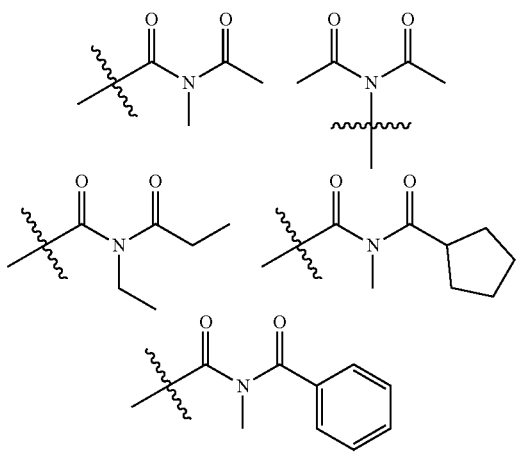

In the present specification, a silyl group specifically includes a trimethylsilyl group, a triethylsilyl group, a t-butyldimethylsilyl group, a vinyldimethylsilyl group, a propyldimethylsilyl group, a triphenylsilyl group, a diphenylsilyl group, a phenylsilyl group and the like, but is not limited thereto.

In the present specification, a boron group specifically includes a trimethylboron group, a triethylboron group, a t-butyldimethylboron group, a triphenylboron group, and a phenylboron group, but is not limited thereto.

In the present specification, examples of a halogen group include fluorine, chlorine, bromine, or iodine.

In the present specification, the alkyl group may be a straight chain or branched chain, and the number of carbon atoms thereof is not particularly limited, but is preferably 1 to 40. According to one embodiment, the number of carbon atoms of the alkyl group is 1 to 20. According to another embodiment, the number of carbon atoms of the alkyl group is 1 to 10. According to another embodiment, the number of carbon atoms of the alkyl group is 1 to 6. Specific examples of the alkyl group include methyl, ethyl, propyl, n-propyl, isopropyl, butyl, n-butyl, isobutyl, tert-butyl, sec-butyl, 1-methyl-butyl, 1-ethyl-butyl, pentyl, n-pentyl, isopentyl, neopentyl, tert-pentyl, hexyl, n-hexyl, 1-methylpentyl, 2-methylpentyl, 4-methyl-2-pentyl, 3,3-dimethylbutyl, 2-ethylbutyl, heptyl, n-heptyl, 1-methylhexyl, cyclopentylmethyl, cyclohexylmethyl, octyl, n-octyl, tert-octyl, 1-methylheptyl, 2-ethylhexyl, 2-propylpentyl, n-nonyl, 2,2-dimethylheptyl, 1-ethyl-propyl, 1,1-dimethyl-propyl, isohexyl, 2-methylpentyl, 4-methylhexyl, 5-methylhexyl, and the like, but are not limited thereto.

In the present specification, the alkenyl group may be a straight chain or branched chain, and the number of carbon atoms thereof is not particularly limited, but is preferably 2 to 40. According to one embodiment, the number of carbon atoms of the alkenyl group is 2 to 20. According to another embodiment, the number of carbon atoms of the alkenyl group is 2 to 10. According to still another embodiment, the number of carbon atoms of the alkenyl group is 2 to 6. Specific examples thereof include vinyl, 1-propenyl, isopropenyl, 1-butenyl, 2-butenyl, 3-butenyl, 1-pentenyl, 2-pentenyl, 3-pentenyl, 3-methyl-1-butenyl, 1,3-butadienyl, allyl, 1-phenylvinyl-1-yl, 2-phenylvinyl-1-yl, 2,2-diphenylvinyl-1-yl, 2-phenyl-2-(naphthyl-1-yl)vinyl-1-yl, 2,2-bis(diphenyl-1-yl)vinyl-1-yl, a stilbenyl group, a styrenyl group, and the like, but are not limited thereto.

In the present specification, a cycloalkyl group is not particularly limited, but the number of carbon atoms thereof is preferably 3 to 60. According to one embodiment, the number of carbon atoms of the cycloalkyl group is 3 to 30. According to another embodiment, the number of carbon atoms of the cycloalkyl group is 3 to 20. According to still another embodiment, the number of carbon atoms of the cycloalkyl group is 3 to 6. Specific examples thereof include cyclopropyl, cyclobutyl, cyclopentyl, 3-methylcyclopentyl, 2,3-dimethylcyclopentyl, cyclohexyl, 3-methylcyclohexyl, 4-methylcyclohexyl, 2,3-dimethylcyclohexyl, 3,4,5-trimethylcyclohexyl, 4-tert-butylcyclohexyl, cycloheptyl, cyclooctyl, and the like, but are not limited thereto.

In the present specification, an aryl group is not particularly limited, but preferably has 6 to 60 carbon atoms, and may be a monocyclic aryl group or a polycyclic aryl group. According to one embodiment, the number of carbon atoms of the aryl group is 6 to 30. According to one embodiment, the number of carbon atoms of the aryl group is 6 to 20. The aryl group may be a phenyl group, a biphenyl group, a terphenyl group or the like as the monocyclic aryl group, but is not limited thereto. Examples of the polycyclic aryl group include a naphthyl group, an anthracenyl group, a phenanthryl group, a pyrenyl group, a perylenyl group, a chrysenyl group, a fluorenyl group, or the like, but is not limited thereto.

In the present specification, a fluorenyl group may be substituted, and two substituent groups may be linked to each other to form a spiro structure. In the case where the fluorenyl group is substituted,

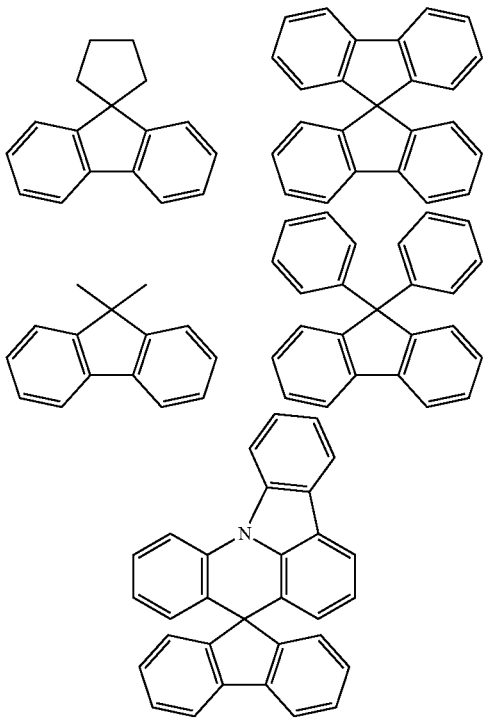

and the like can be formed. However, the structure is not limited thereto.

In the present specification, a heterocyclic group is a heterocyclic group including one or more of O, N, Si and S as a heteroatom, and the number of carbon atoms thereof is not particularly limited, but is preferably 2 to 60. Examples of the heterocyclic group include a thiophene group, a furan group, a pyrrole group, an imidazole group, a thiazole group, an oxazol group, an oxadiazol group, a triazol group, a pyridyl group, a bipyridyl group, a pyrimidyl group, a triazine group, an acridyl group, a pyridazine group, a pyrazinyl group, a quinolinyl group, a quinazoline group, a quinoxalinyl group, a phthalazinyl group, a pyridopyrimidinyl group, a pyridopyrazinyl group, a pyrazinopyrazinyl group, an isoquinoline group, an indole group, a carbazole group, a benzoxazole group, a benzimidazole group, a benzothiazol group, a benzocarbazole group, a benzothiophene group, a dibenzothiophene group, a benzofuranyl group, a phenanthroline group, an isoxazolyl group, a thiadiazolyl group, a phenothiazinyl group, a dibenzofuranyl group, and the like, but are not limited thereto.

In the present specification, the aryl group in the aralkyl group, the aralkenyl group, the alkylaryl group, and the arylamine group is the same as the aforementioned examples of the aryl group. In the present specification, the alkyl group in the aralkyl group, the alkylaryl group and the alkylamine group is the same as the aforementioned examples of the alkyl group. In the present specification, the heteroaryl in the heteroarylamine can be applied to the aforementioned description of the heterocyclic group. In the present specification, the alkenyl group in the aralkenyl group is the same as the aforementioned examples of the alkenyl group. In the present specification, the aforementioned description of the aryl group may be applied except that the arylene is a divalent group. In the present specification, the aforementioned description of the heterocyclic group can be applied except that the heteroarylene is a divalent group. In the present specification, the aforementioned description of the aryl group or cycloalkyl group can be applied except that the hydrocarbon ring is not a monovalent group but formed by combining two substituent groups. In the present specification, the aforementioned description of the heterocyclic group can be applied, except that the heterocycle is not a monovalent group but formed by combining two substituent groups.

In one embodiment of the invention, there is provided a polymer including a repeating unit represented by Chemical Formula 1, a repeating unit represented by Chemical Formula 2, and a repeating unit represented by Chemical Formula 3.

The materials for solution deposition process commonly used in the art have solubility in solvents, but there is a problem that the materials are dissolved in a solvent used for subsequent layer deposition and layers are mixed to degrade device performance.

However, as described in detail below, the polymer according to the present invention has excellent hole transfer properties due to the repeating unit represented by Chemical Formula 1, has solvent orthogonality by curing the repeating unit represented by Chemical Formula 2 after deposition of the polymer to thereby inhibit interlayer mixing, and can improve the solubility and lower the curing temperature in the solution process due to the repeating unit represented by Chemical Formula 3. Hereinafter, each repeating unit will be described.

(First Repeating Unit)

As used herein, the term "first repeating unit" is a repeating unit represented by Chemical Formula 1 contained in the polymer according to the present invention, and has excellent hole transfer properties.

Preferably, $R_1$ to $R_3$ are each independently hydrogen, or methyl, more preferably all of them are hydrogen.

Preferably, $L_1$ is a substituted or unsubstituted $C_{6-12}$ arylene, more preferably phenylene, or biphenylylene, most preferably 1,4-phenylene, or 4,4'-biphenylylene.

Preferably, $L_2$ is a single bond, a substituted or unsubstituted $C_{6-18}$ arylene, more preferably phenylene, biphenylylene, or terphenylylene, most preferably 1,4-phenylene, 1,1'-biphenylylene, or

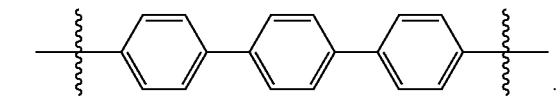

Preferably, $Ar_1$ is phenyl, biphenylyl, dimethylfluorenyl, or diphenylfluorenyl, and the $Ar_1$ is unsubstituted or substituted with $C_{1-4}$ alkyl or $C_{1-4}$ alkoxy. More preferably, $Ar_1$ is phenyl, biphenylyl, dimethylfluorenyl, or diphenylfluorenyl, and the $Ar_1$ is unsubstituted or substituted with methyl, ethyl, propyl, isopropyl, butyl, isobutyl, tertbutyl, methoxy, ethoxy, propoxy, butoxy, isobutoxy, or neobutoxy.

Preferably, $Ar_2$ and $Ar_3$ are each independently $C_{6-25}$ aryl, more preferably each independently phenyl, biphenylyl, dimethylfluorenyl, or diphenylfluorenyl.

Preferably, the Chemical Formula 1 is any one selected from the group consisting of repeating units represented by the following:

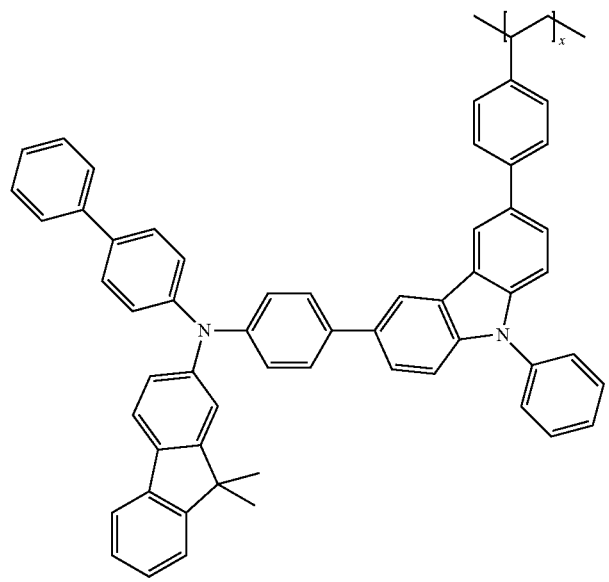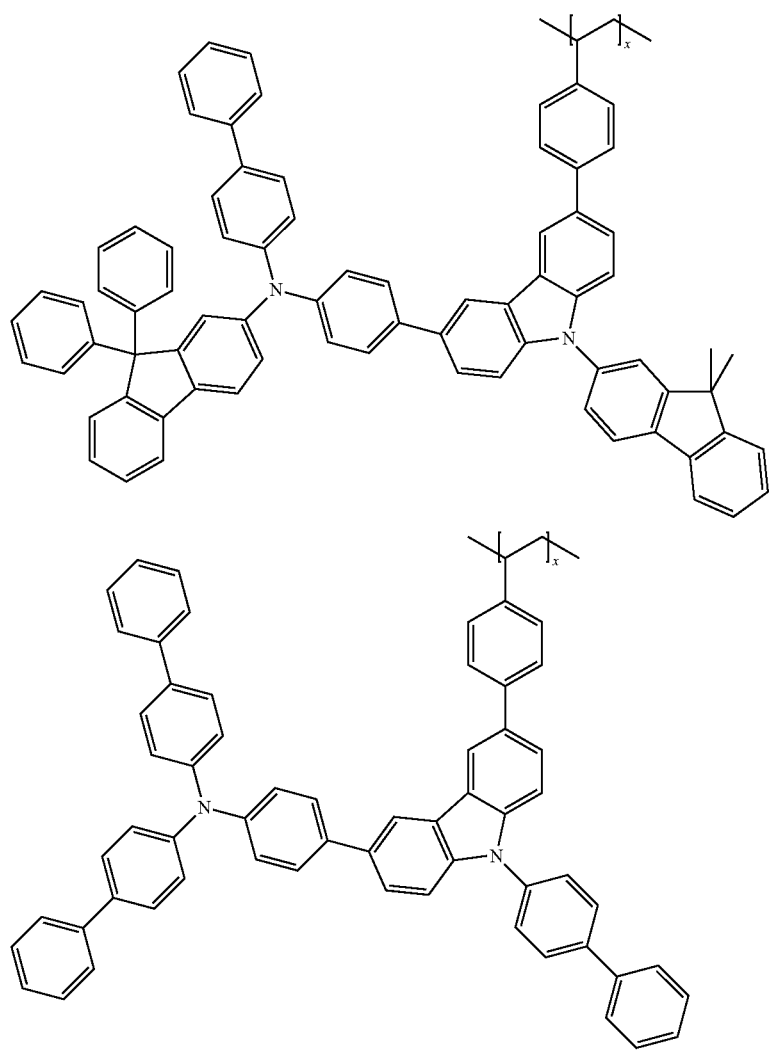

-continued
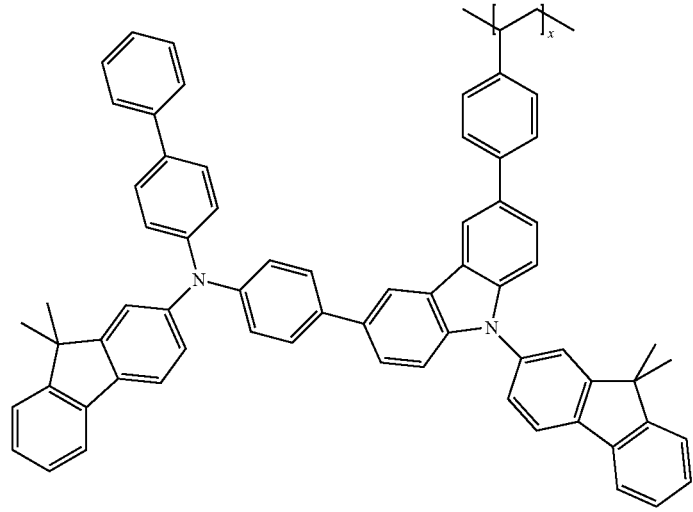
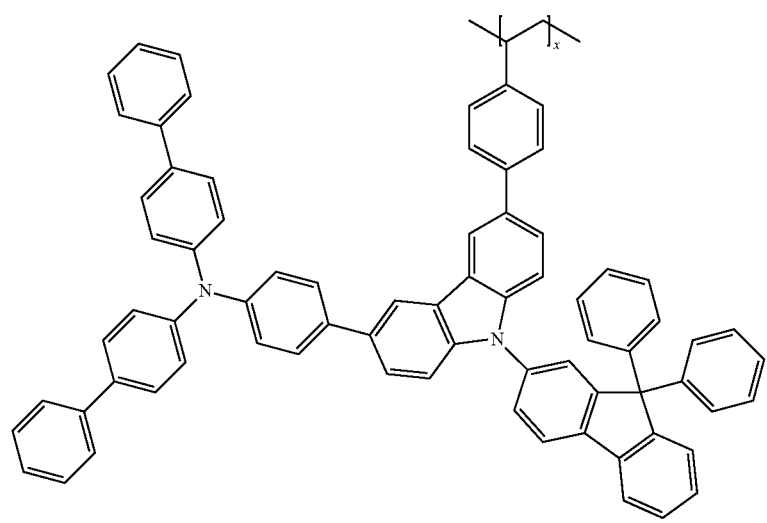
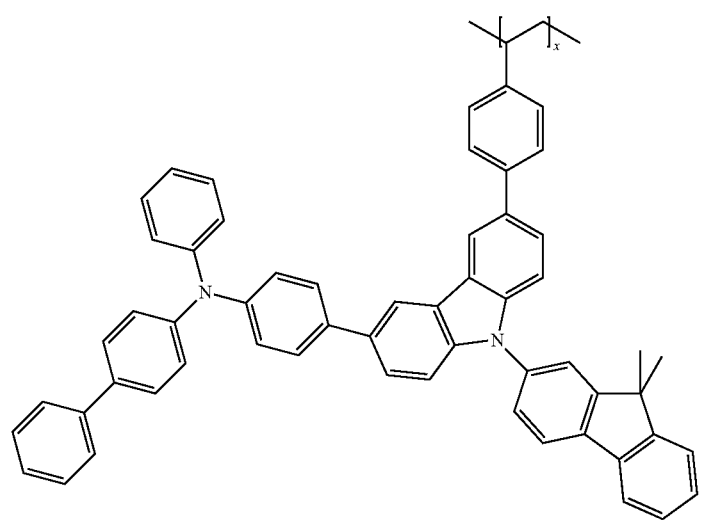

-continued
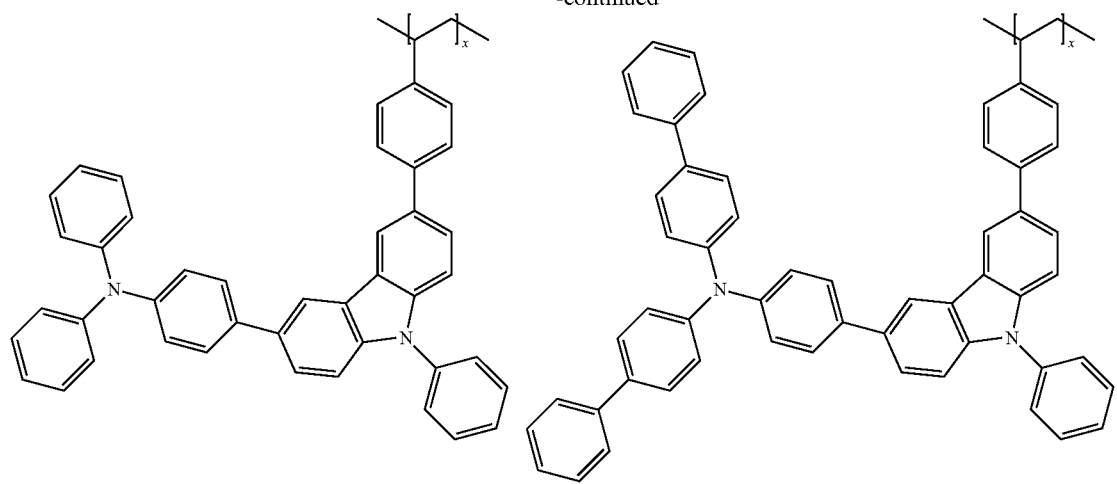
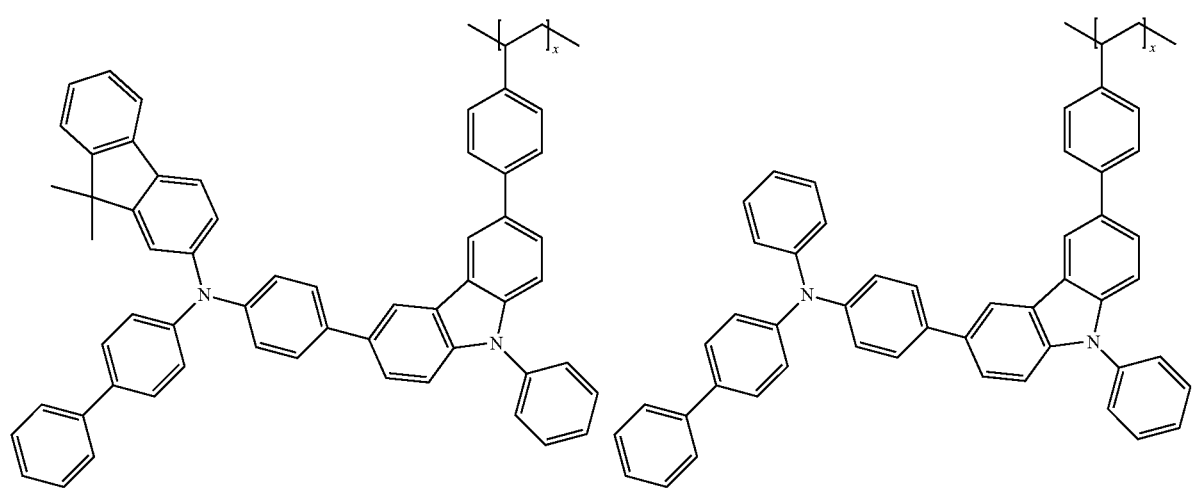
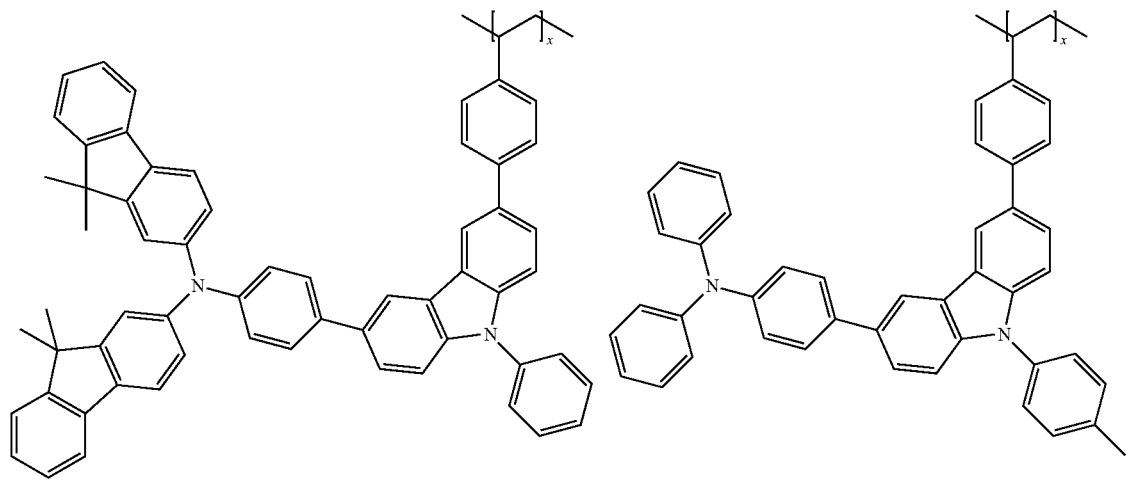

-continued
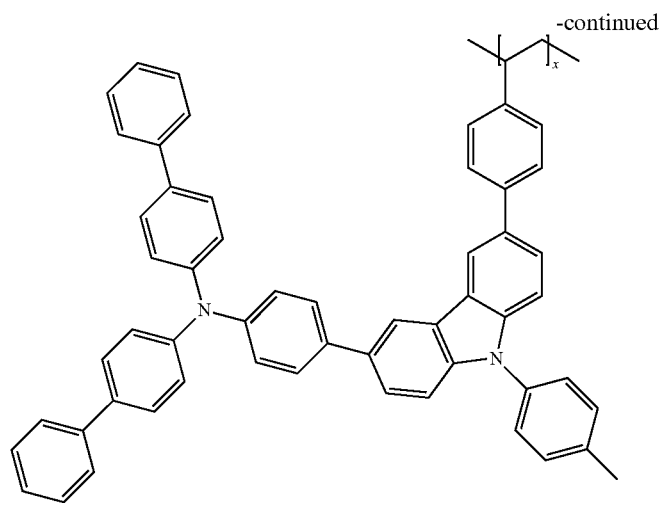
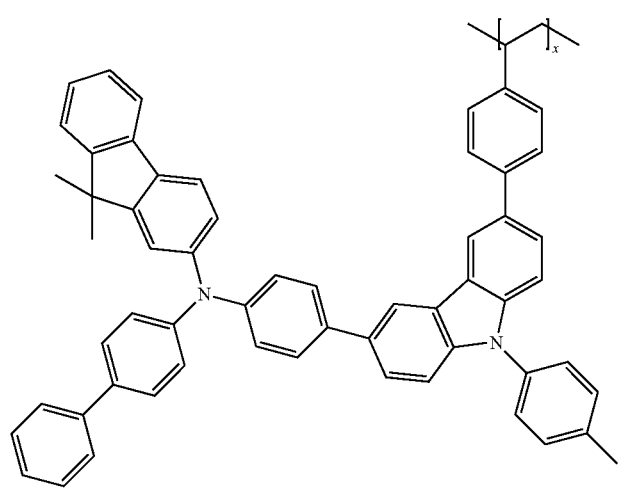
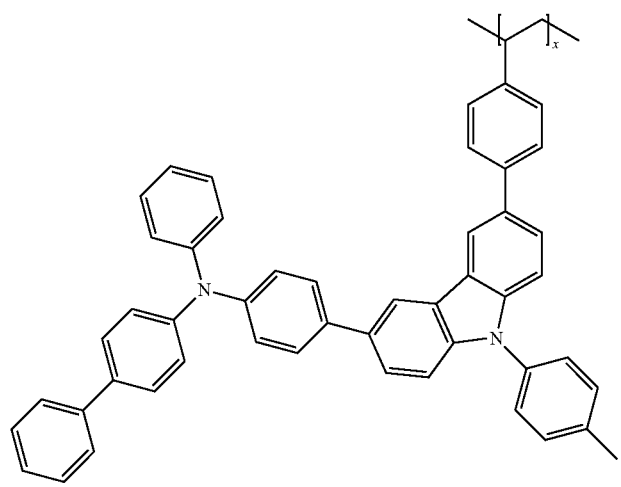

-continued
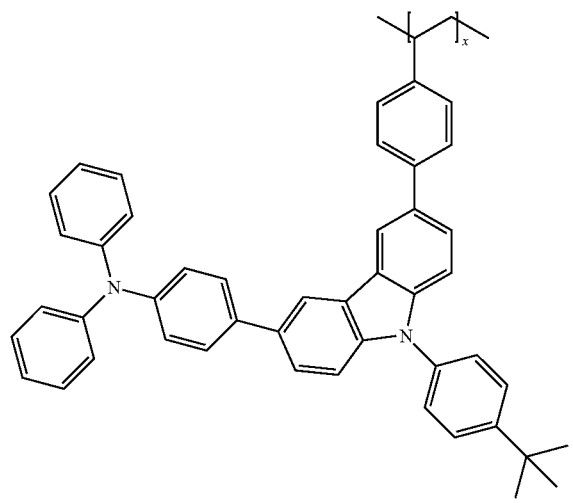
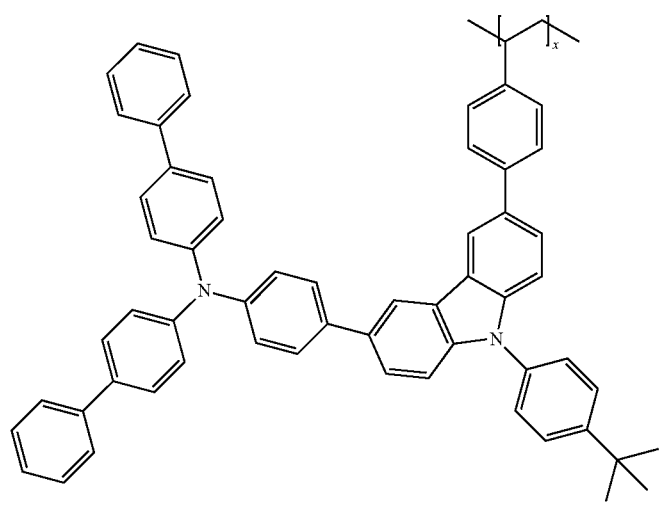
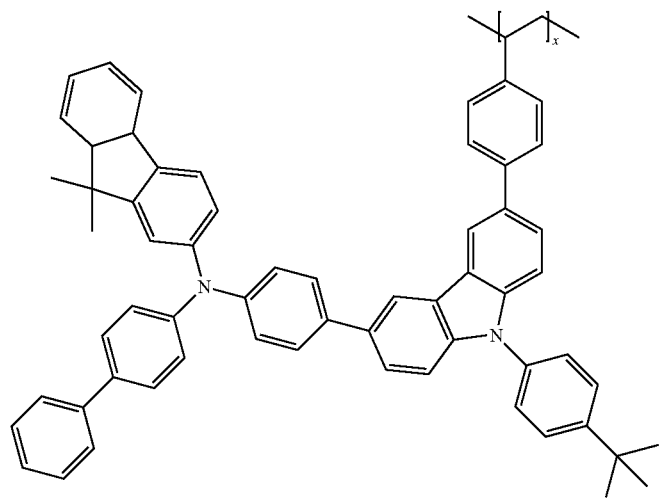

-continued
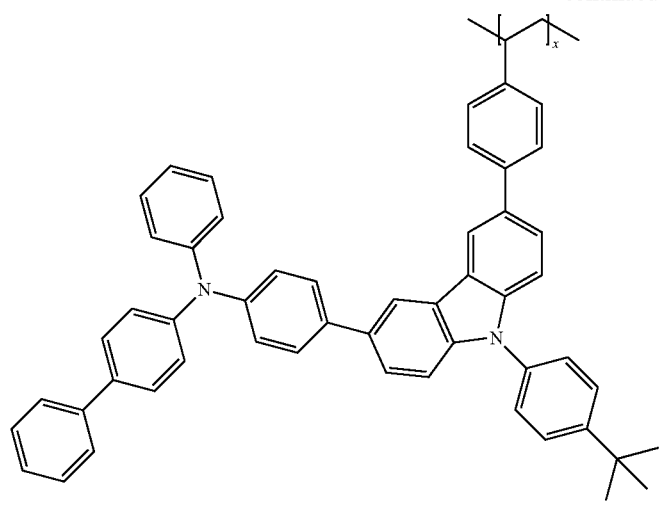
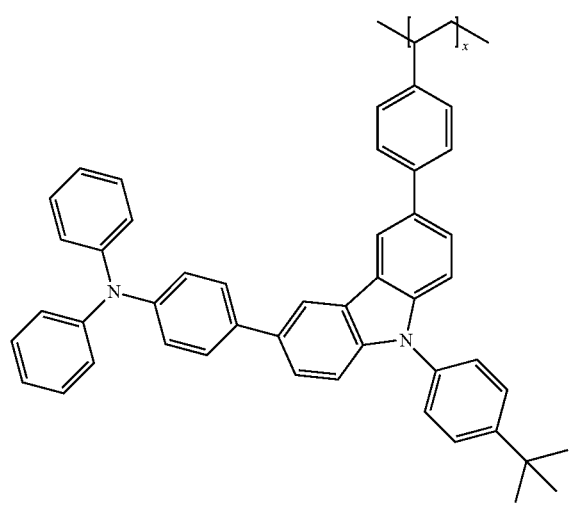
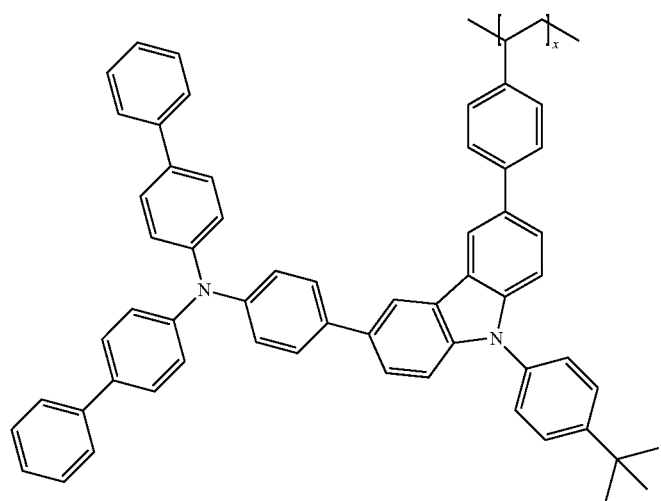

-continued
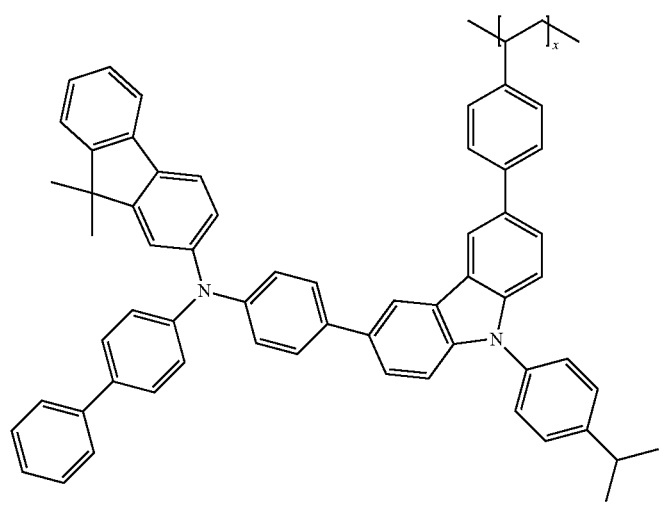
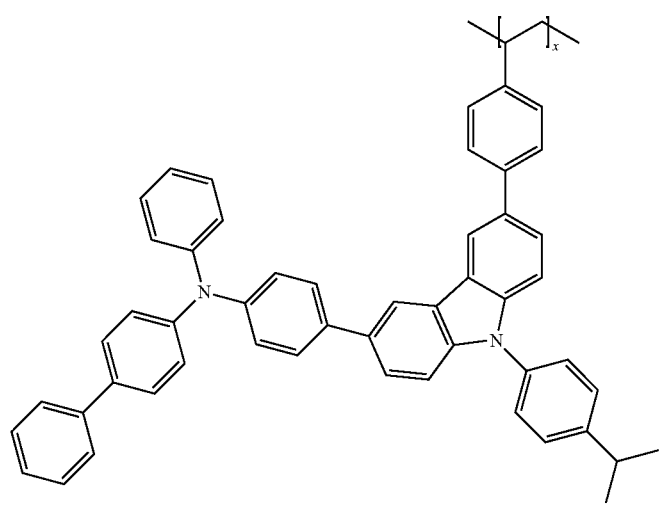
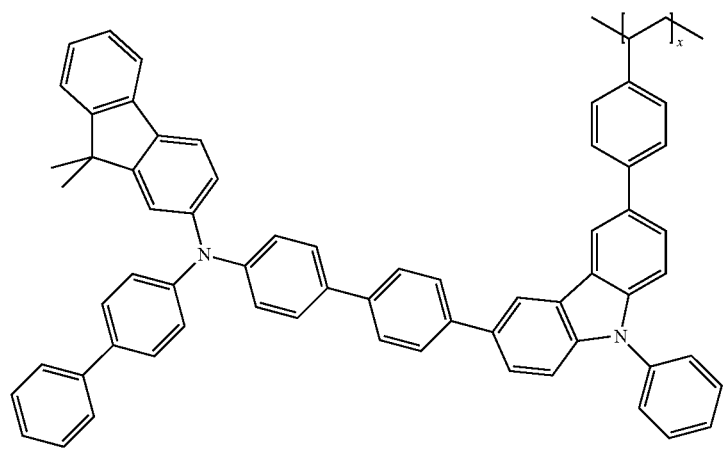

23 24
-continued
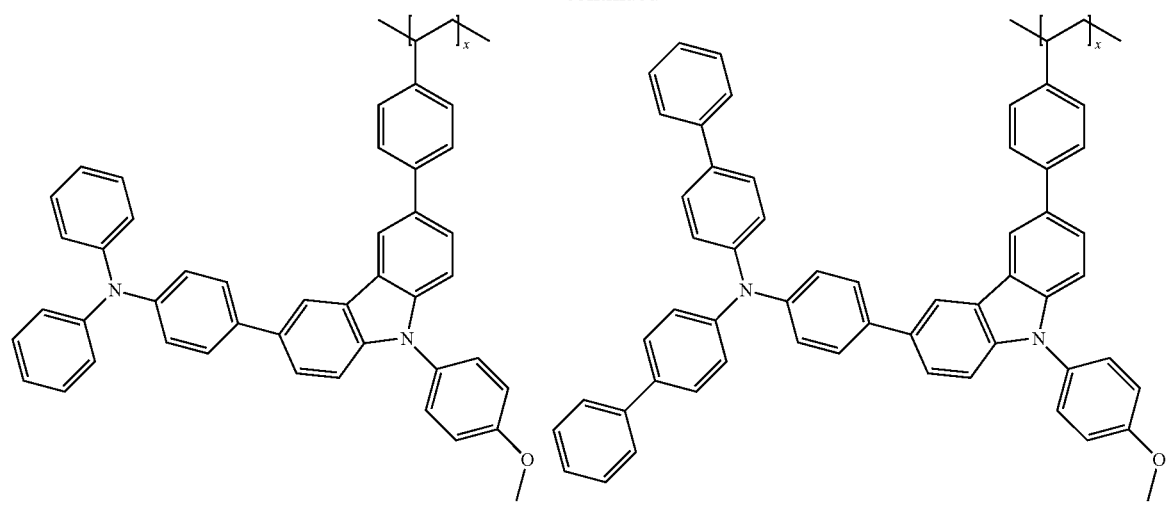
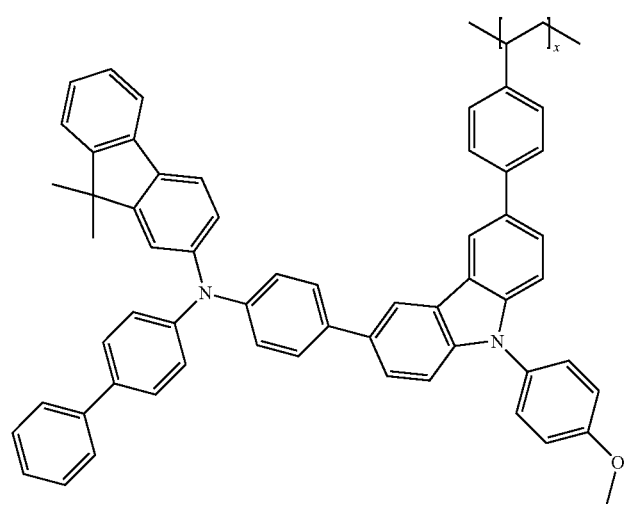
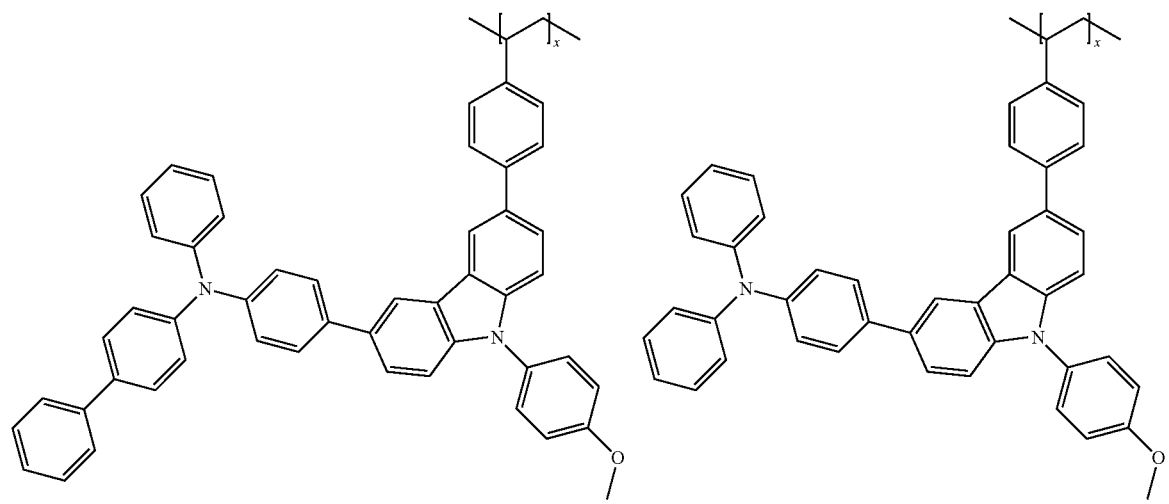

-continued
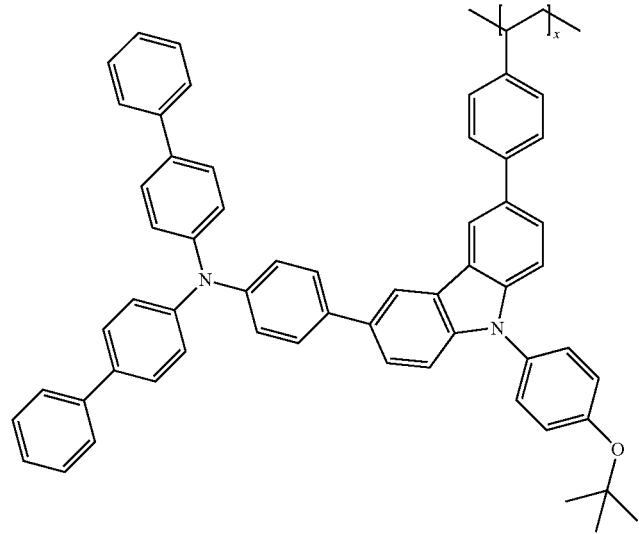
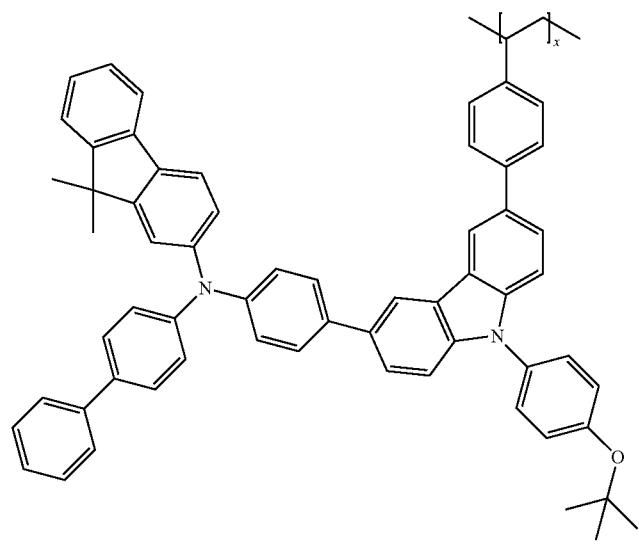
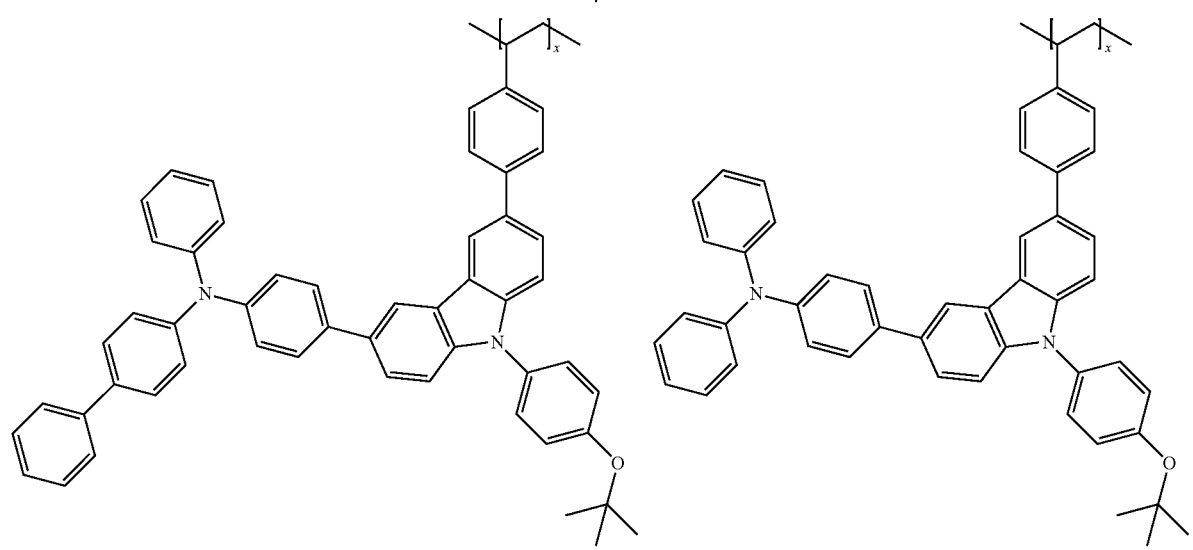

-continued
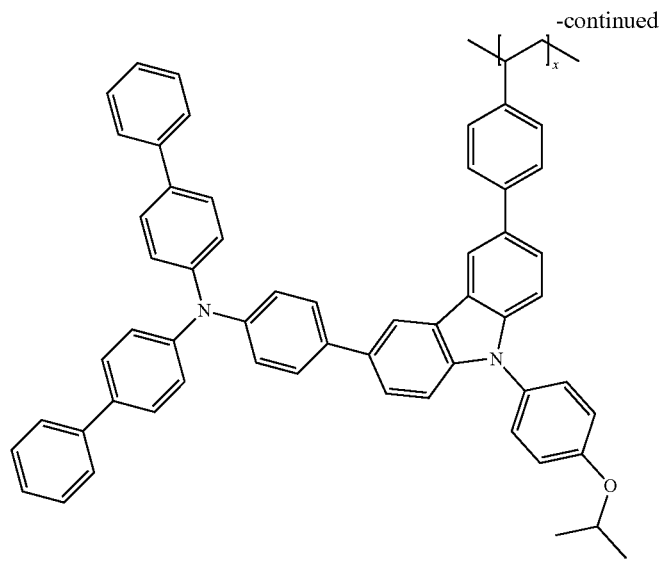
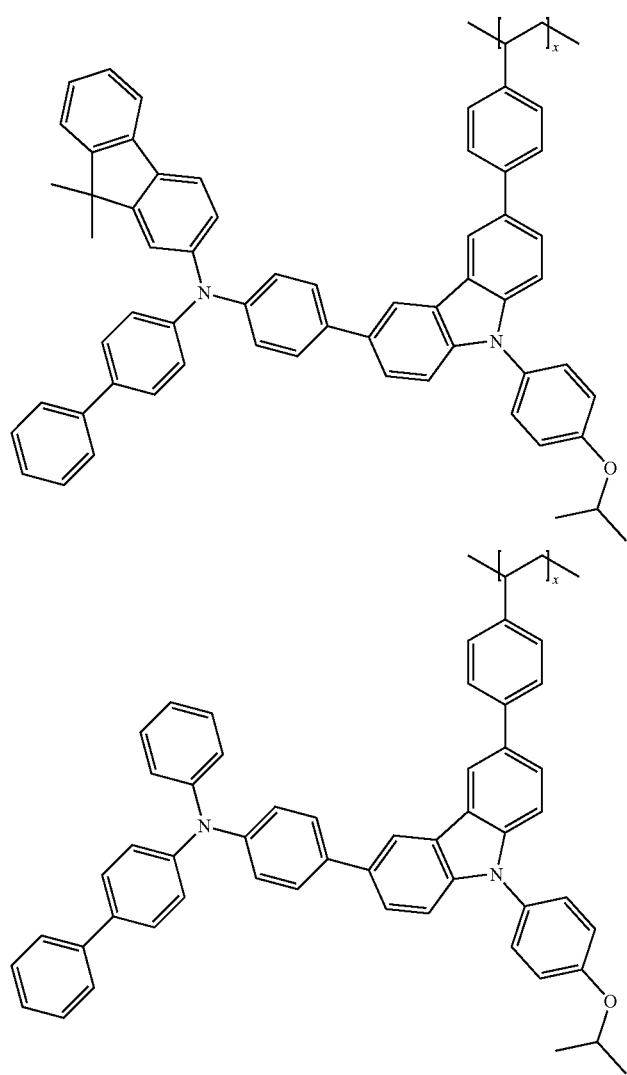

-continued
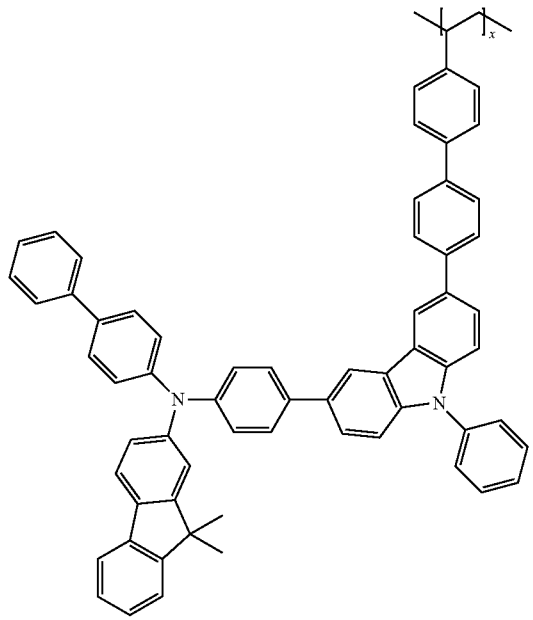
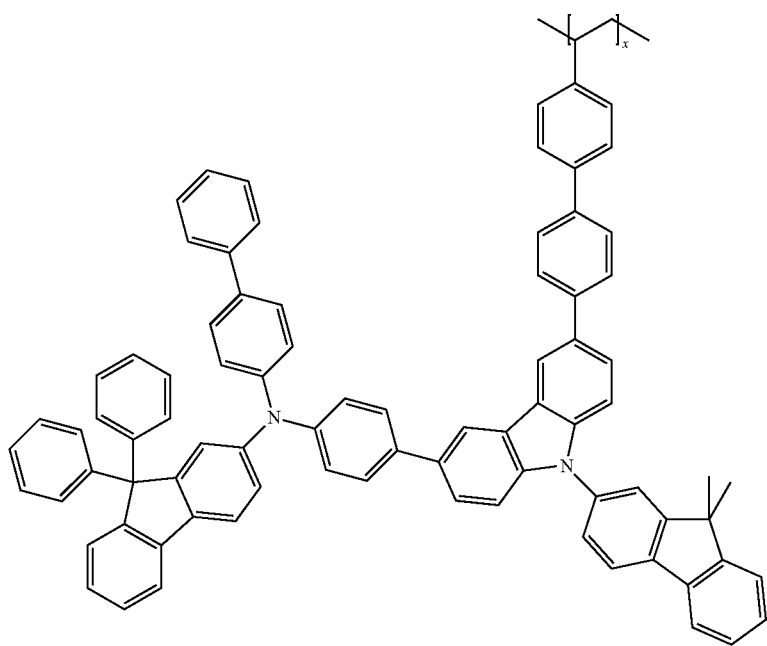

-continued
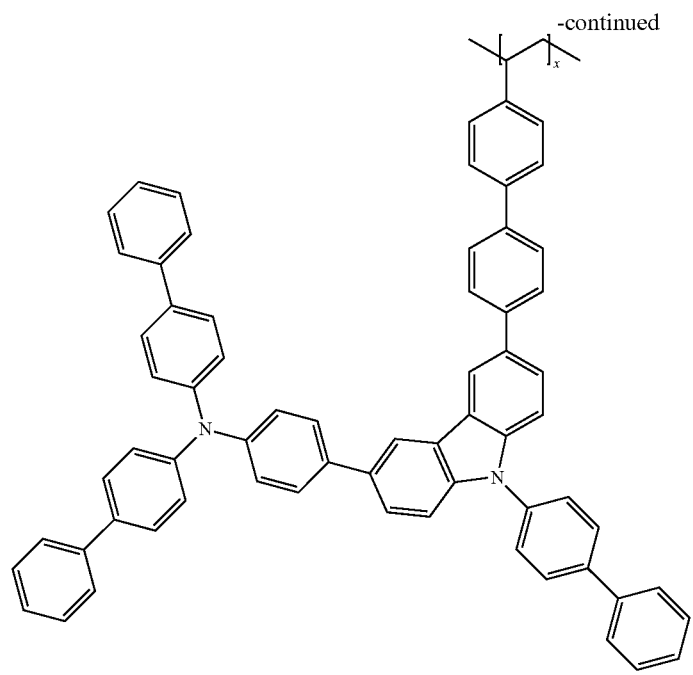
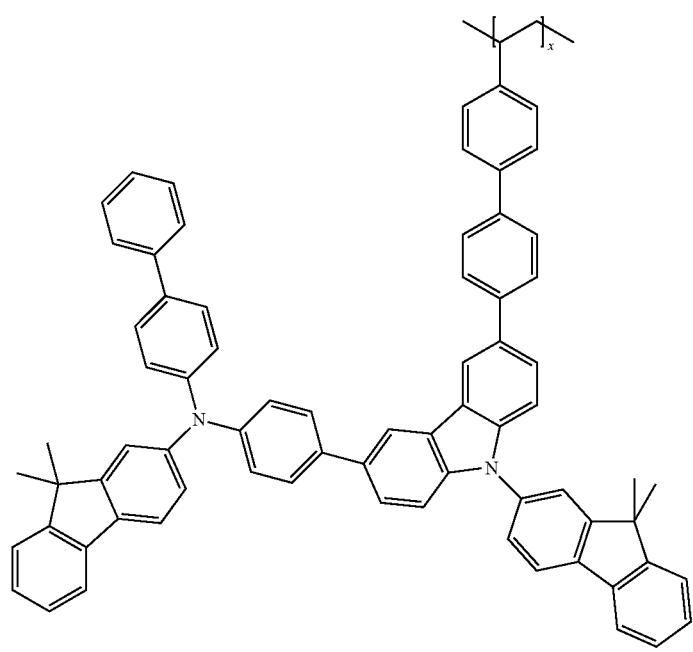

-continued
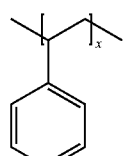
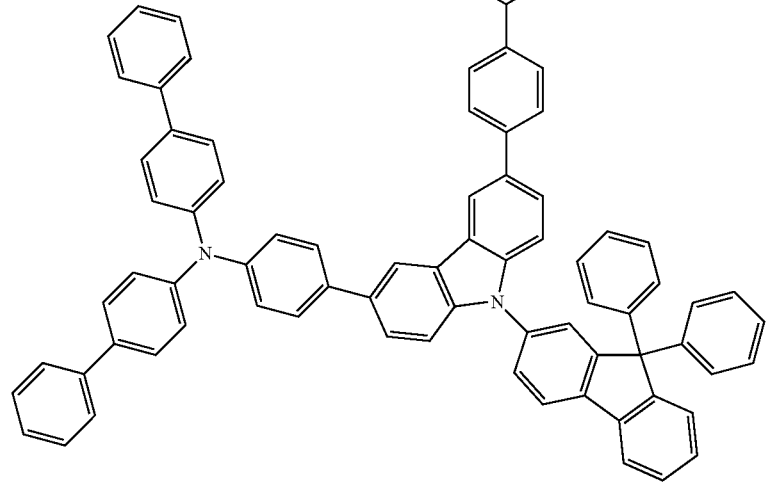
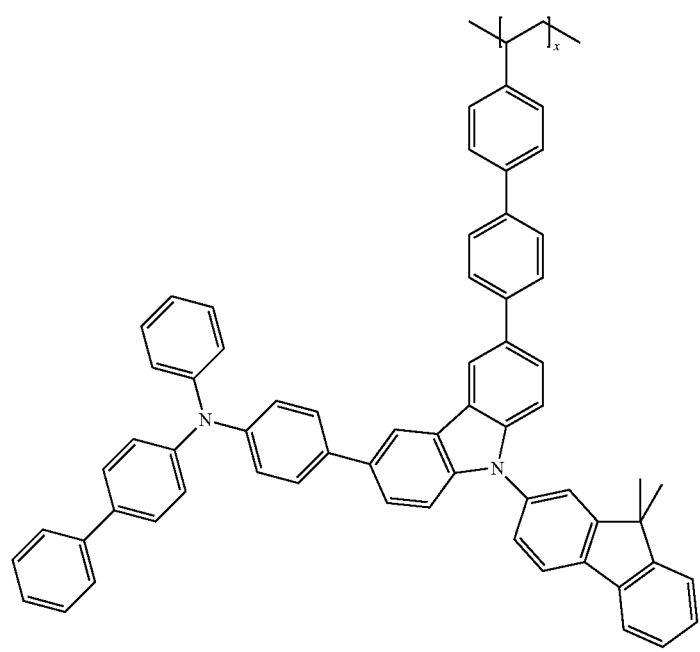

-continued
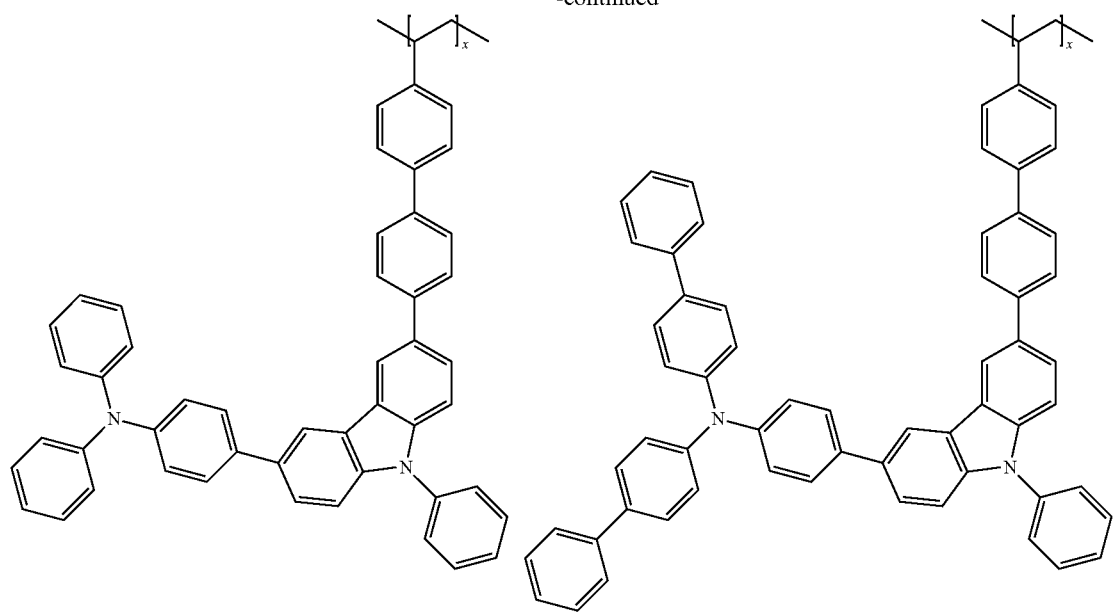
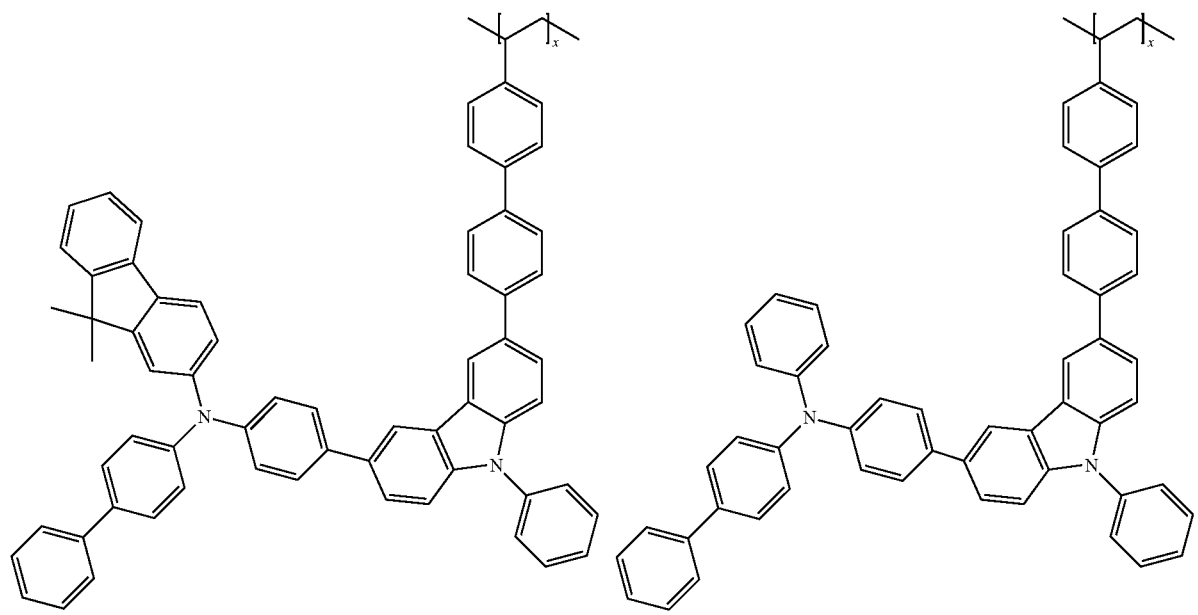

-continued
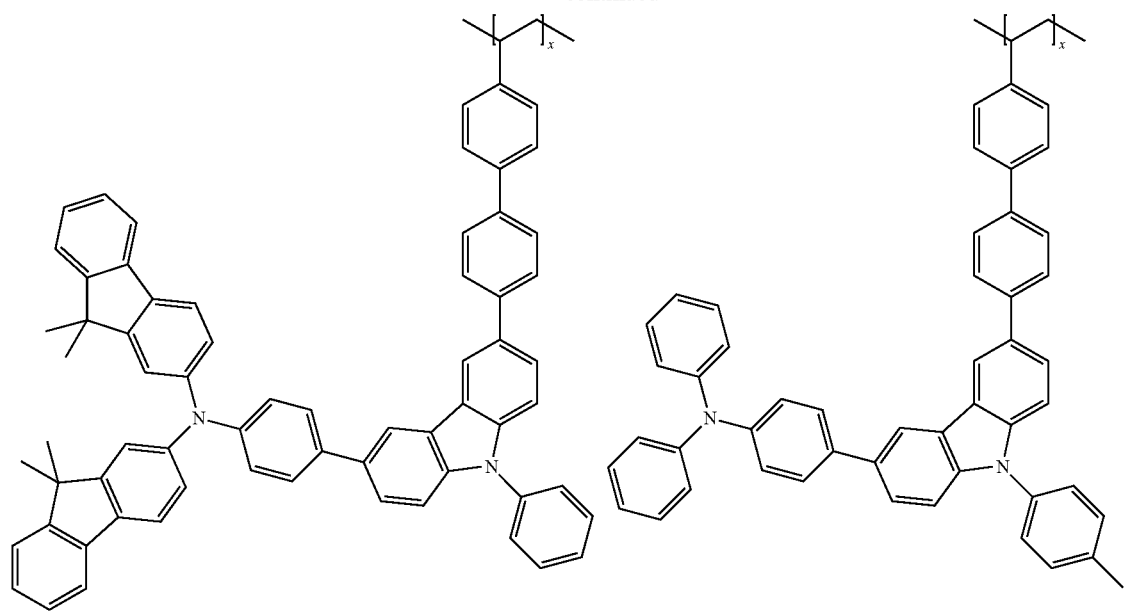
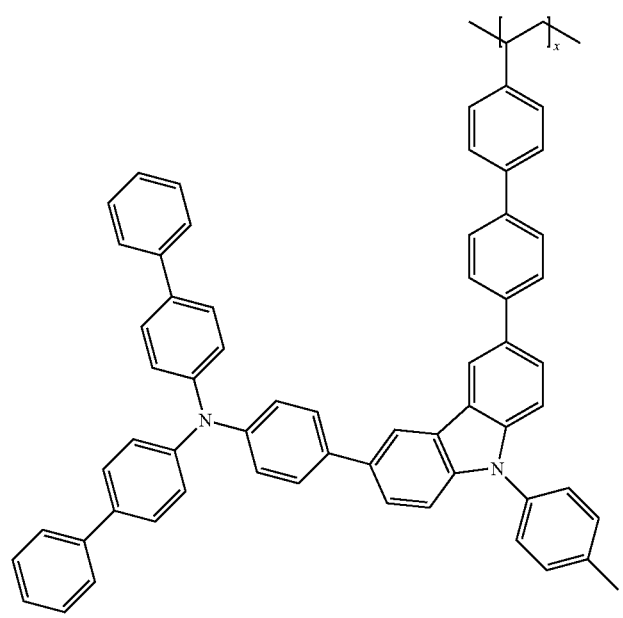

-continued
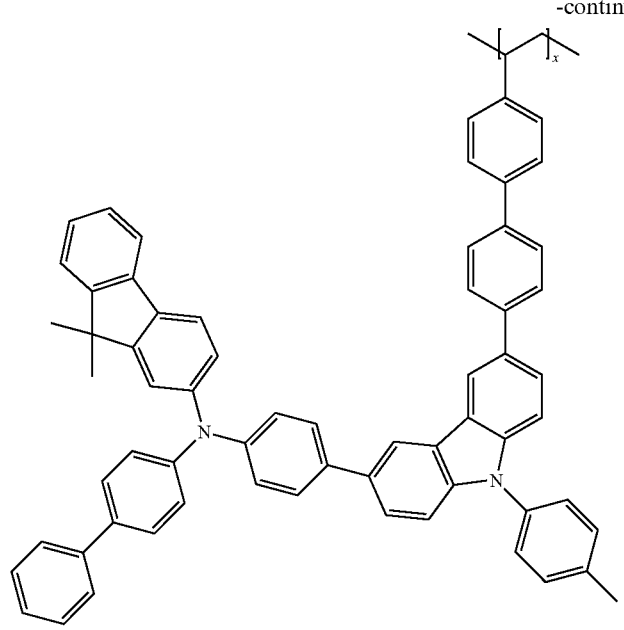
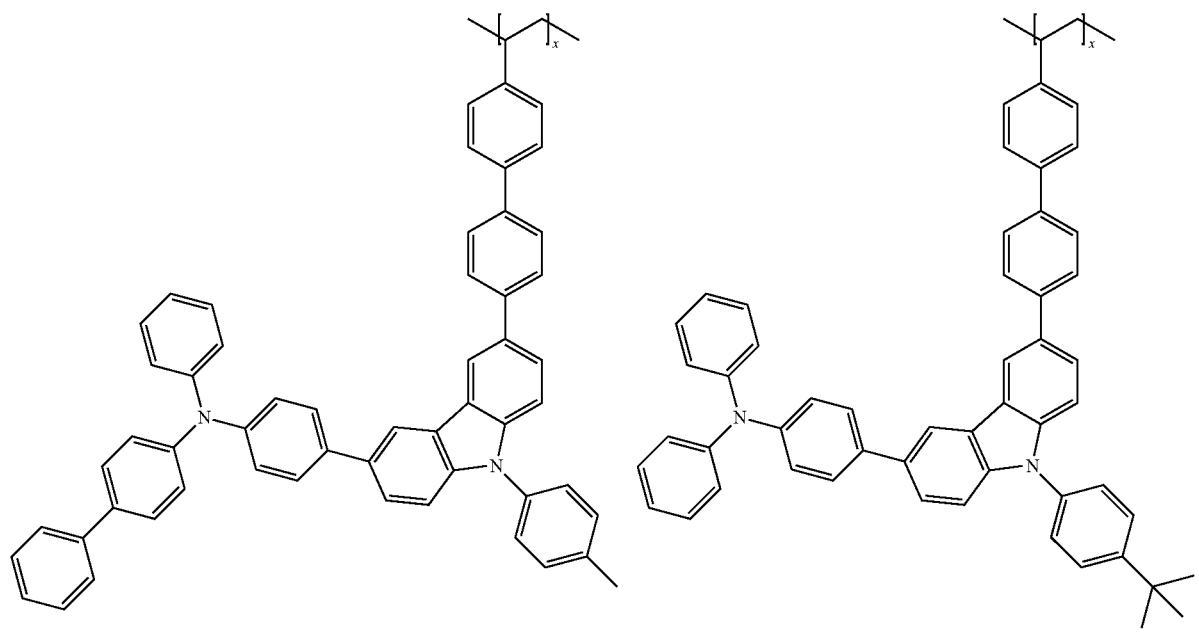

-continued
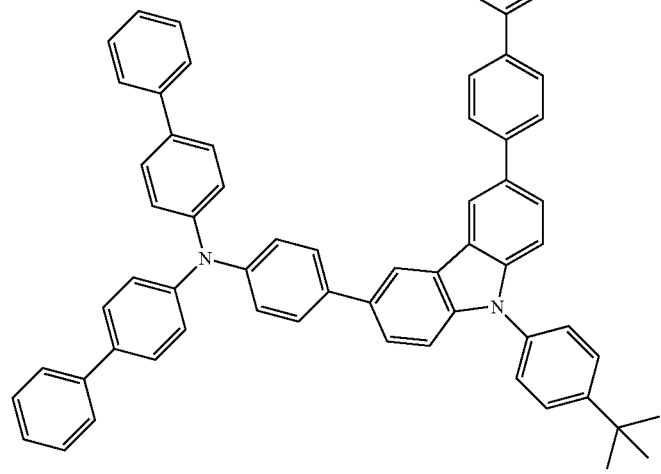
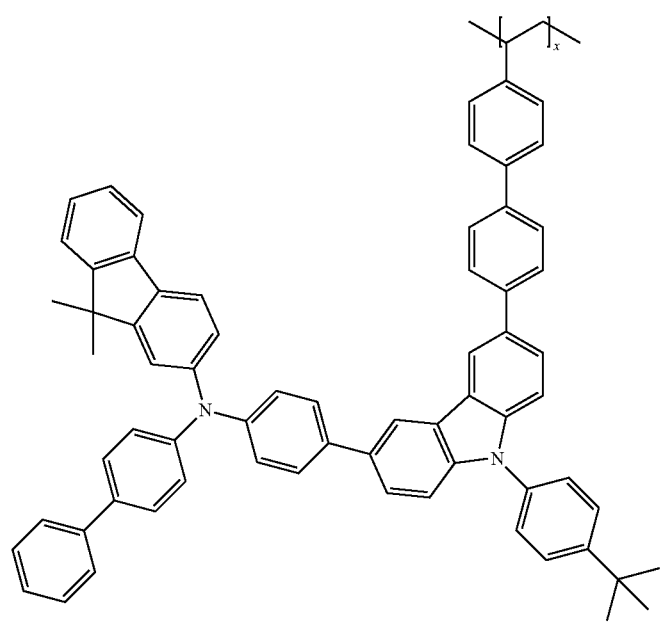

-continued
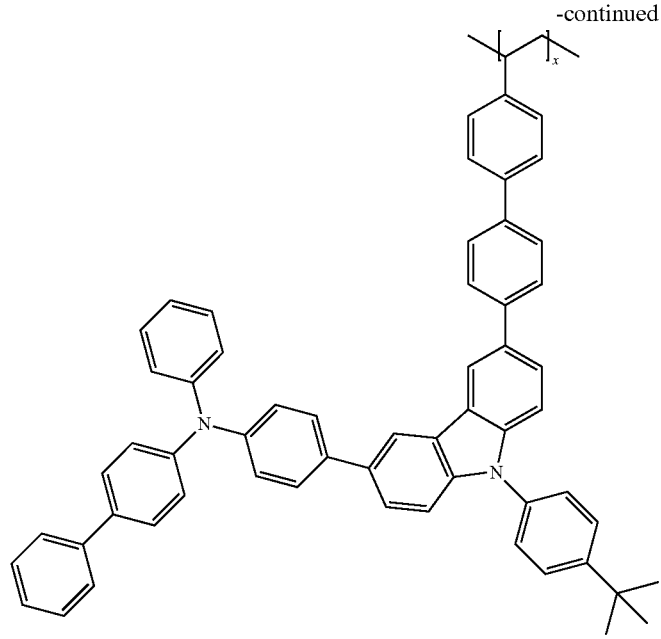
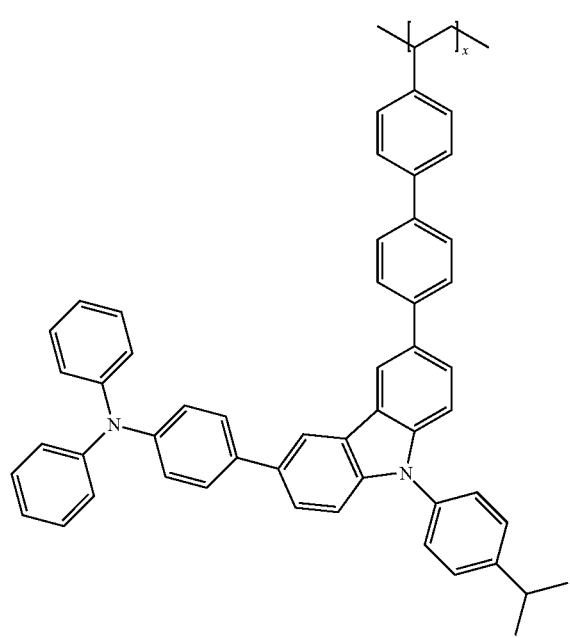

-continued
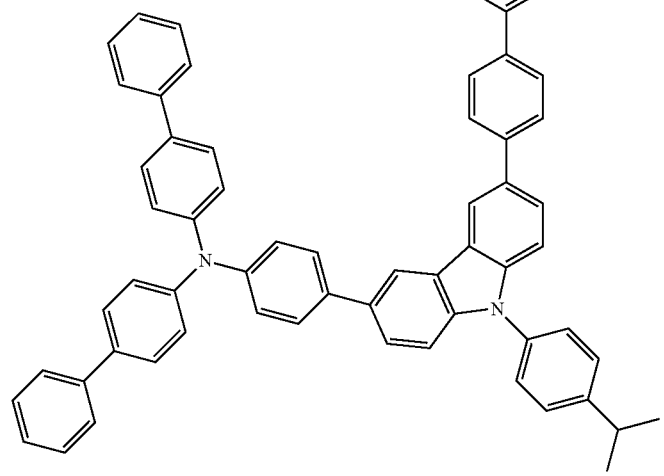
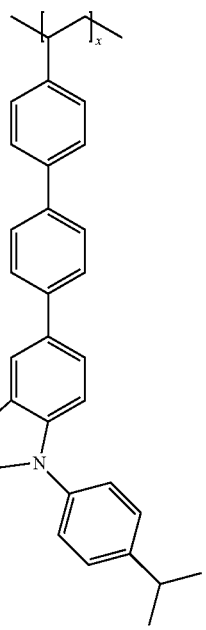

-continued
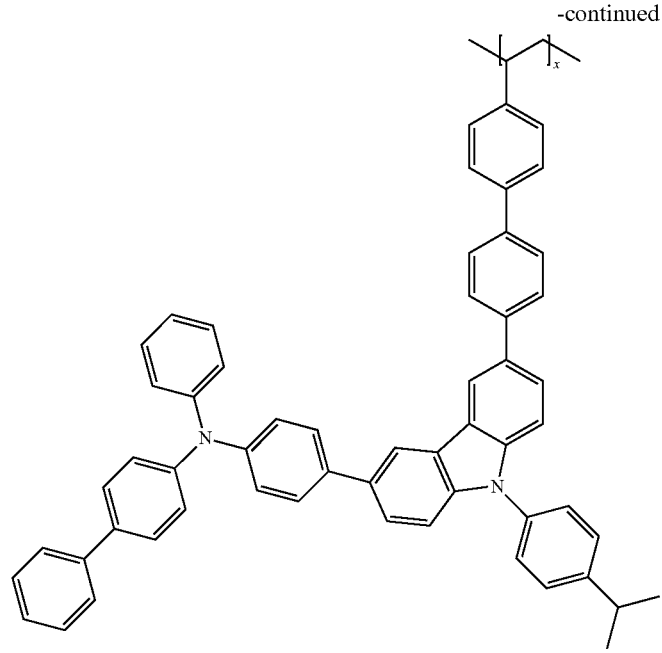
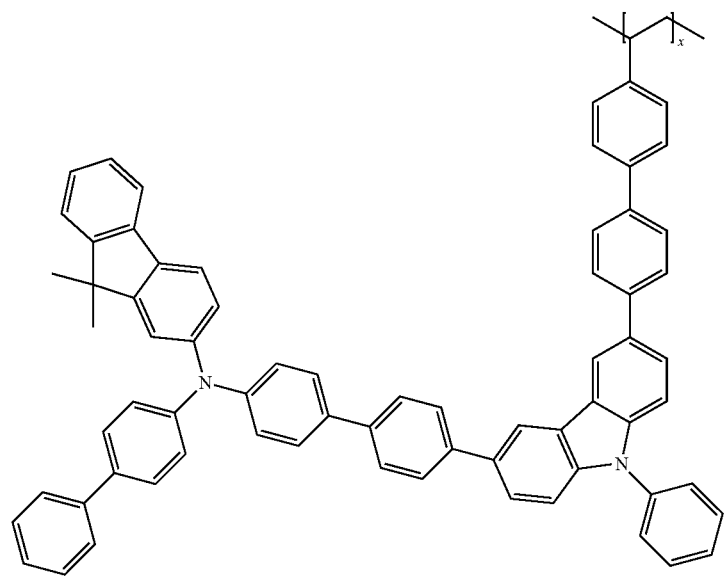

-continued
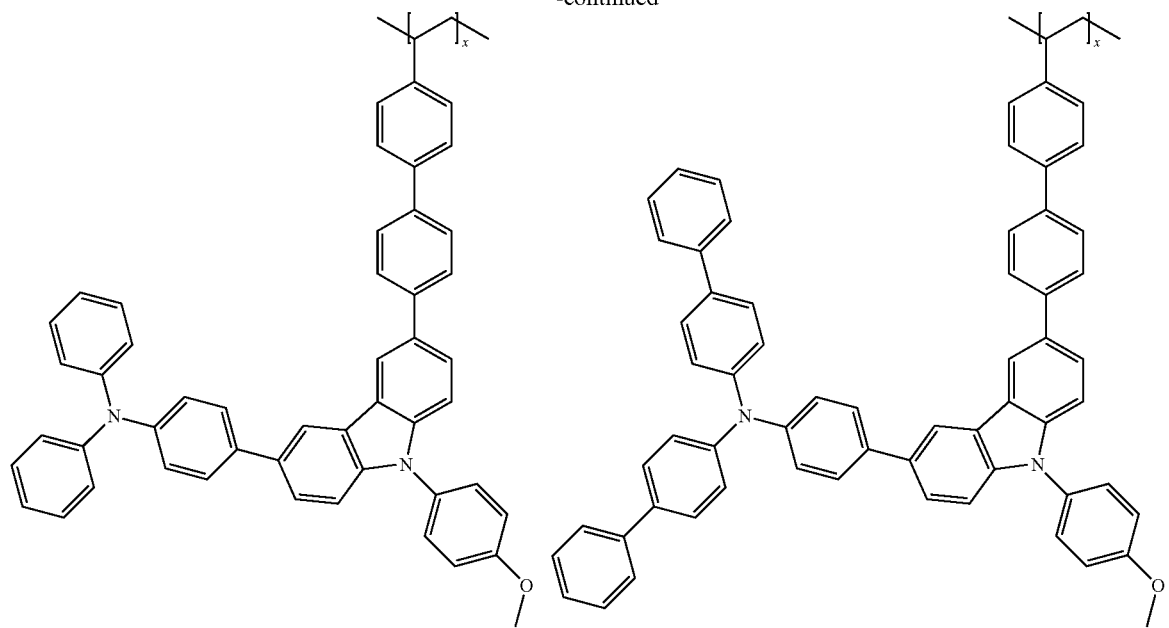
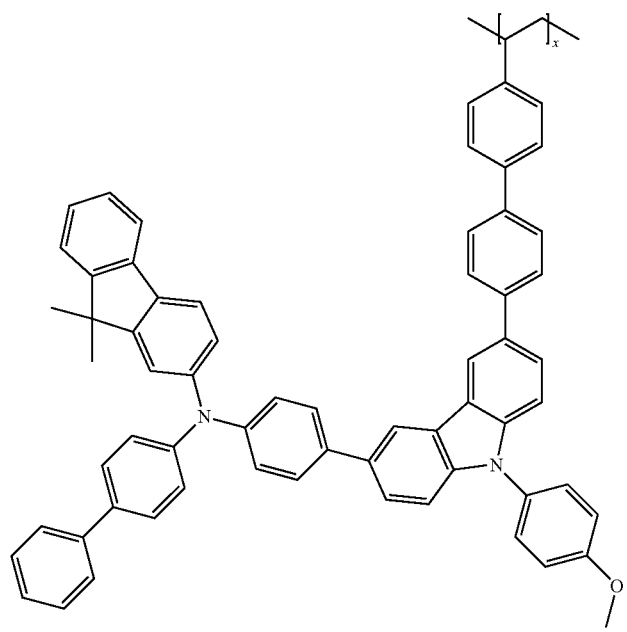

-continued
51
52
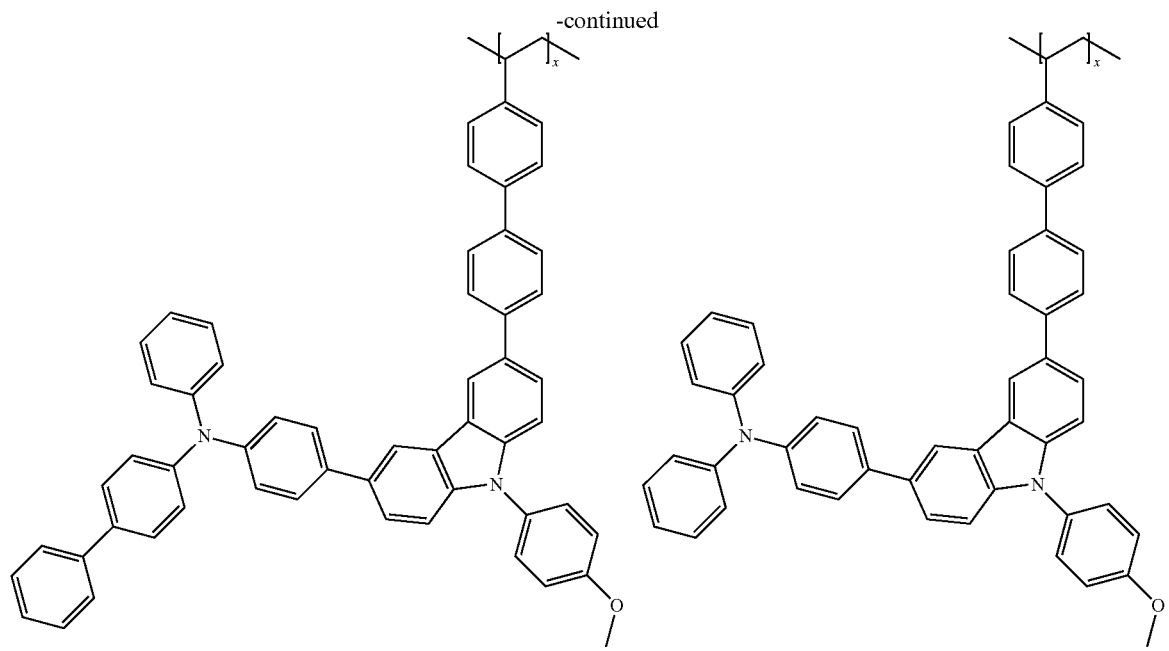
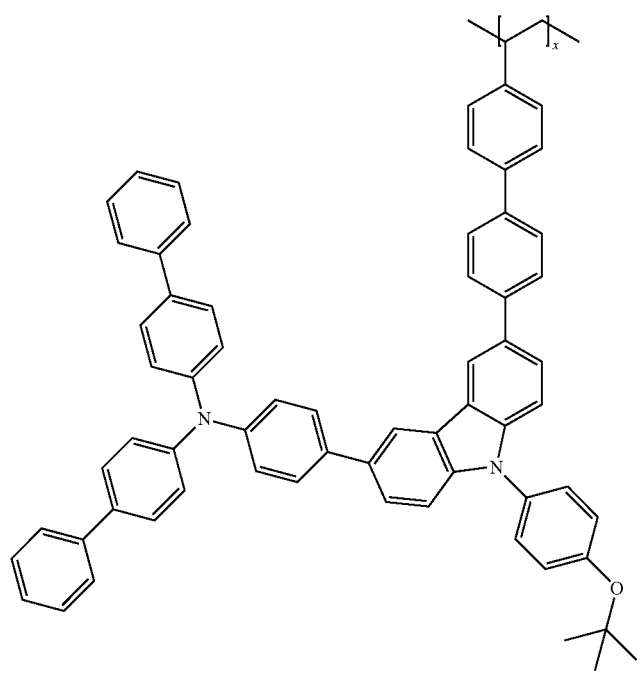

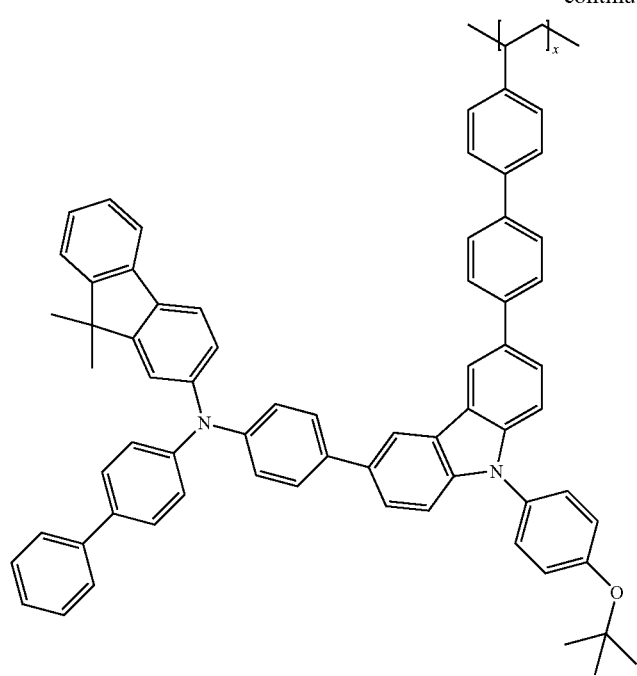
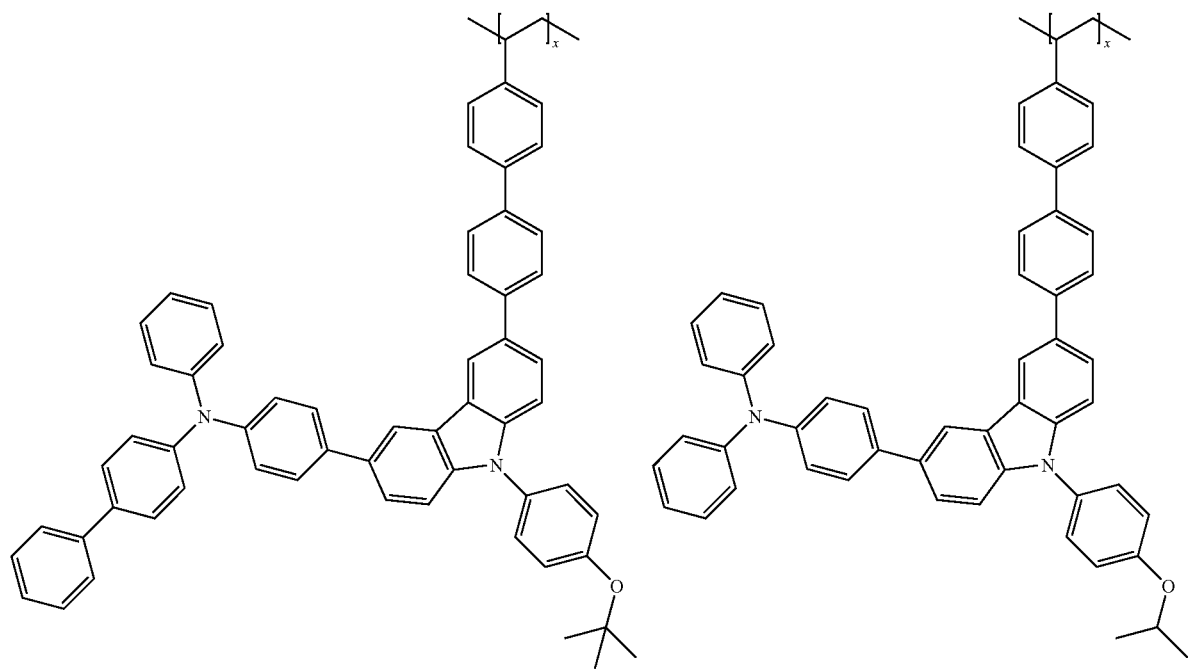

-continued
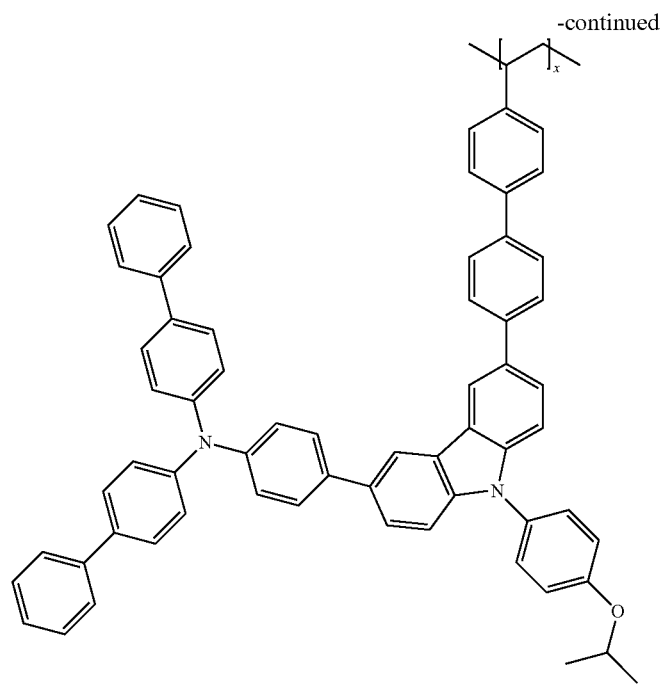
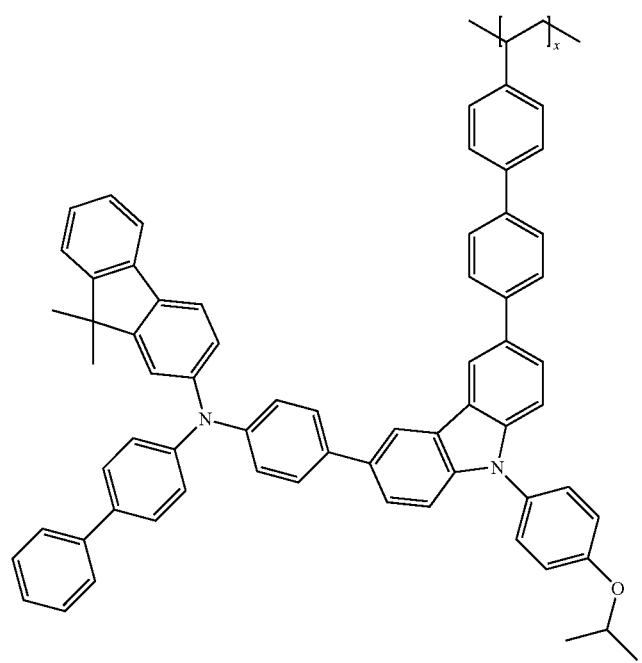

-continued
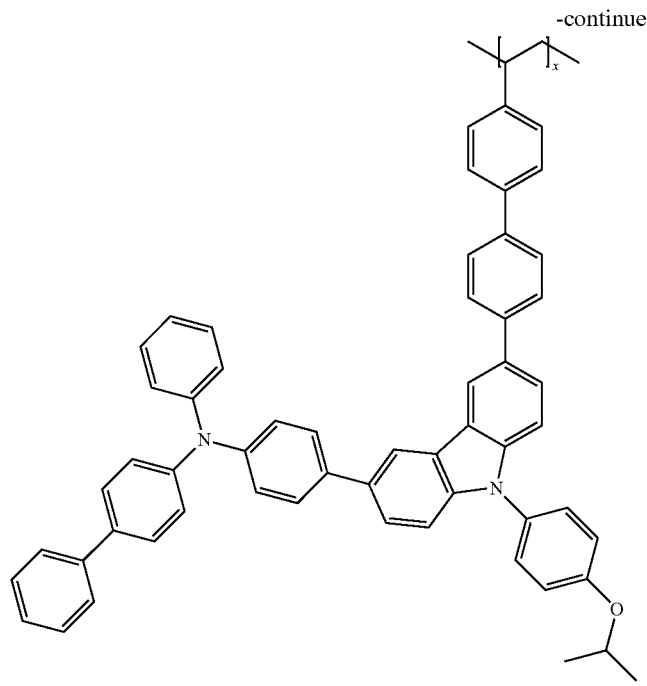
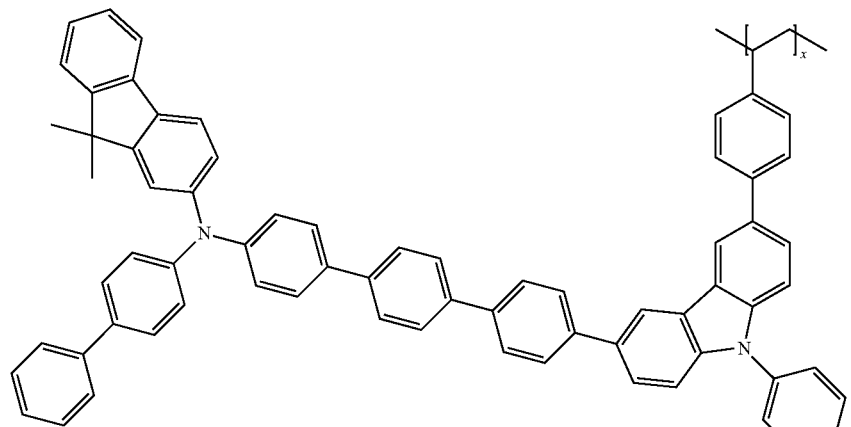
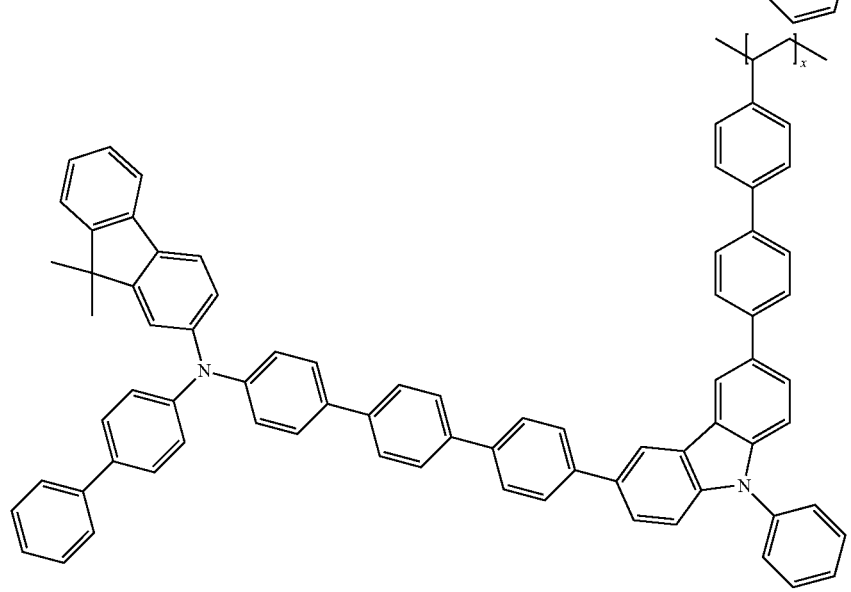

Meanwhile, the compound represented by Chemical Formula 1 is derived from a monomer represented by the following Chemical Formula 1-1:

[Chemical Formula 1-1]

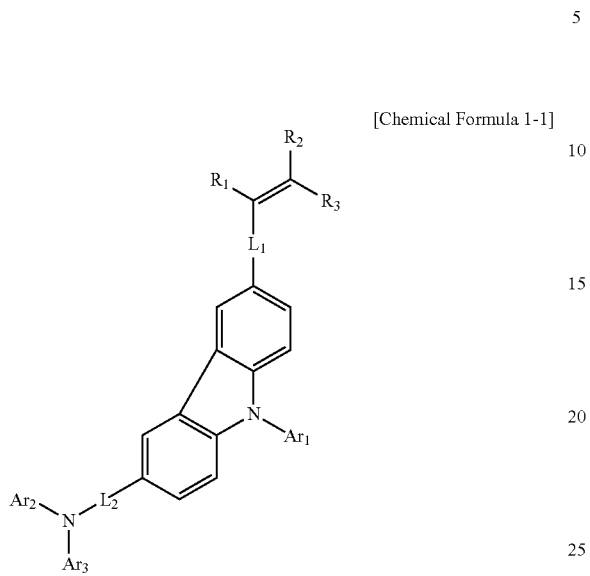

in Chemical Formula 1-1, $R_1$ to $R_3$, $L_1$, $L_2$ and $Ar_1$ to $Ar_3$ are the same as those defined in Chemical Formula 1.

The compound represented by Chemical Formula 1-1 may be prepared according to the preparation method as shown in the following Reaction Scheme 1.

[Reaction Scheme 1]

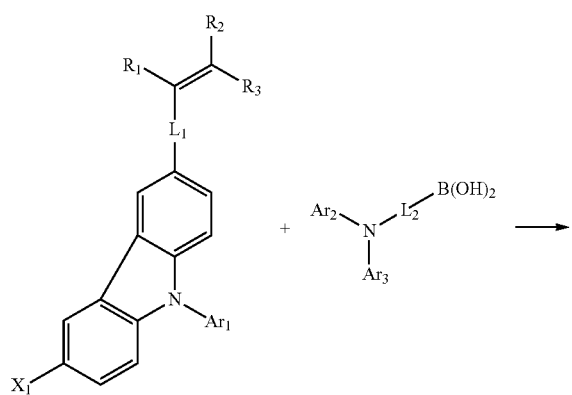

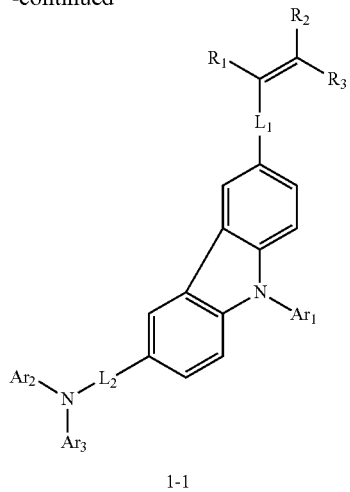

1-1

In Reaction Scheme 1, the remaining definitions excluding $X_1$ are as defined above, and $X_1$ is halogen, preferably bromo, or chloro. The Reaction Scheme 1 is an amine substitution reaction, which reaction is carried out in the presence of a palladium catalyst and a base to produce a compound represented by Chemical Formula 1-1. The above preparation method can be further specified in Preparation Examples described hereinafter.

(Second Repeating Unit)

As used herein, the term "second repeating unit" is a repeating unit represented by Chemical Formula 2 contained in the polymer according to the present invention, and includes benzocyclobutane which is a curable reactive group. After depositing the polymer according to the present invention, the deposited polymer is made to have solvent resistance through cycloaddition reaction of the benzocyclobutane and an alkene of the third repeating unit described hereinafter by a thermal process, and thus can be applied to an organic light emitting device by a solution process.

Preferably, the Chemical Formula 2 is represented by the following Chemical Formula 2'.

[Chemical Formula 2']

Preferably, $R_4$ to $R_6$ are each independently hydrogen or methyl, and more preferably all of them are hydrogen.

Preferably, $L_3$ is a single bond, a substituted or unsubstituted $C_{6-12}$ arylene, (substituted or unsubstituted $C_{6-12}$ arylene)—O—; (substituted or unsubstituted $C_{6-12}$ arylene)-O—(substituted or unsubstituted $C_{1-10}$ alkylene), more preferably a single bond, phenylene, -(phenylene)-O—, -(phenylene)-O—(butane-1,4-diyl), or biphenylylene, most preferably 1,4-phenylene, or 4,4'-biphenylylene.

Preferably, the Chemical Formula 2 is any one selected from the group consisting of repeating units represented by the following:

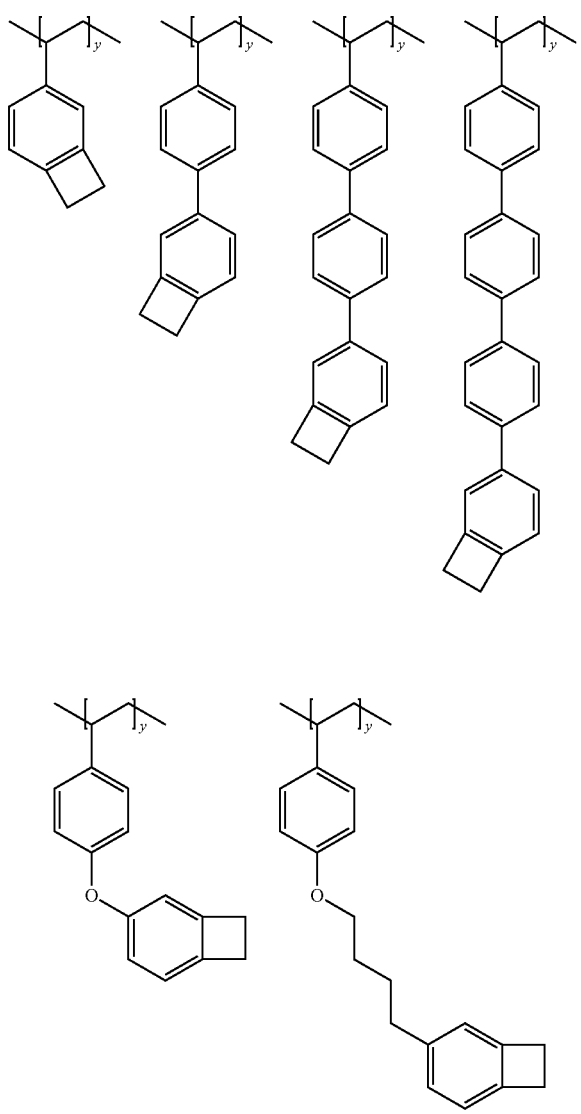

Meanwhile, the compound represented by Chemical Formula 2 is derived from a monomer represented by the following Chemical Formula 2-1:

[Chemical Formula 2-1]

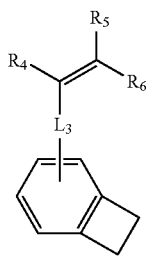

in Chemical Formula 2-1, $R_4$ to $R_6$, and $L_3$ are the same as those defined in Chemical Formula 2.

The compound represented by Chemical Formula 2-1 may be prepared according to the preparation method as shown in the following Reaction Scheme 2.

[Reaction Scheme 2]

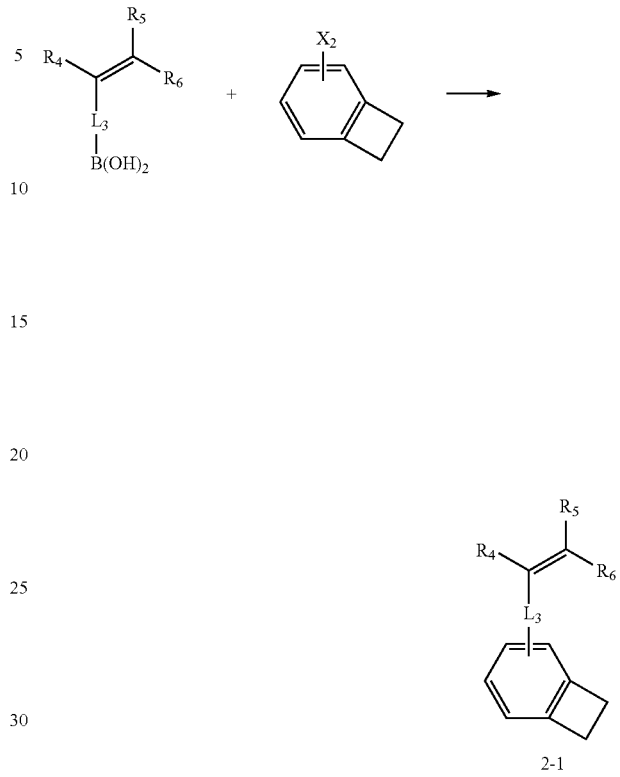

2-1

In Reaction Scheme 2, the remaining definitions excluding $X_2$ are as defined above, and $X_2$ is halogen, preferably bromo, or chloro. The Reaction Scheme 2 is a Suzuki coupling reaction, which reaction is carried out in the presence of a palladium catalyst and a base to produce a compound represented by Chemical Formula 2-1. The above preparation method can be further specified in Preparation Examples described hereinafter.

(Third Repeating Unit)

As used herein, the term "third repeating unit" is a repeating unit represented by Chemical Formula 3 contained in the polymer according to the present invention, and can improve the solubility of the polymer according to the present invention or lower the curing temperature due to the inclusion of a vinyl group.

Preferably, $R_7$ to $R_9$ are each independently hydrogen or methyl, and more preferably all of them are hydrogen.

Preferably, $L_4$ is a single bond, a substituted or unsubstituted $C_{6-12}$ arylene, more preferably a single bond, phenylene, or biphenylylene, most preferably a single bond, 1,4-phenylene, or 4,4'-biphenylylene.

Preferably, $Ar_4$ is a $C_{3-10}$ cycloalkyl, or a $C_{6-12}$ aryl, more preferably cyclopropyl, cyclobutyl, cyclopentyl, cyclohexyl, cycloheptyl, phenyl, phenyl substituted with one or two $C_{1-4}$ alkyl, or biphenylyl.

Preferably, $Ar_5$ is hydrogen, phenyl, biphenylyl, terphenylyl, or quarterphenylyl.

Preferably, the Chemical Formula 3 is any one selected from the group consisting of repeating units represented by the following:

-continued
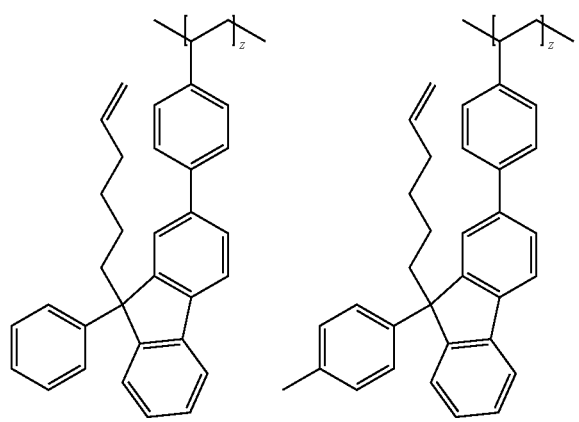
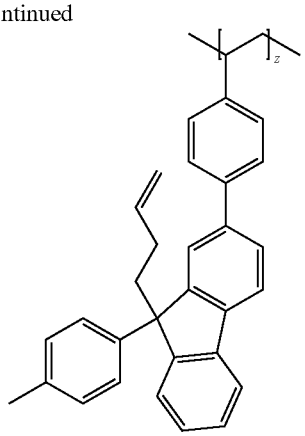
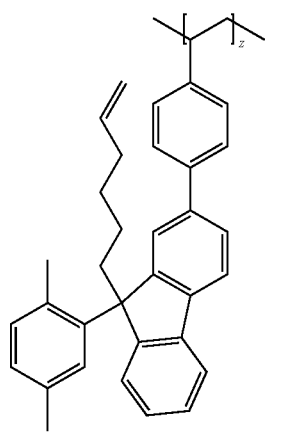
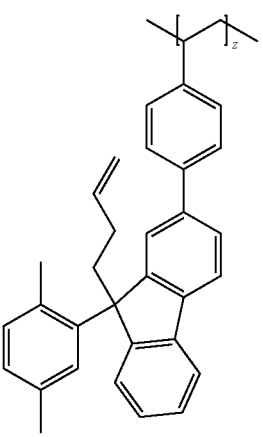
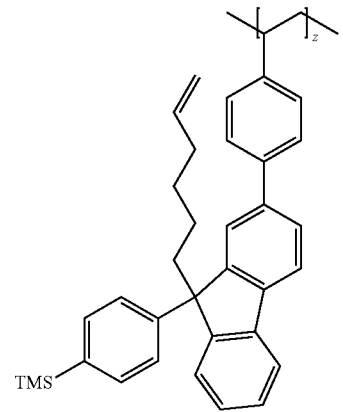
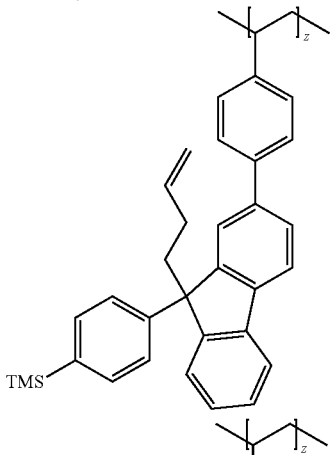
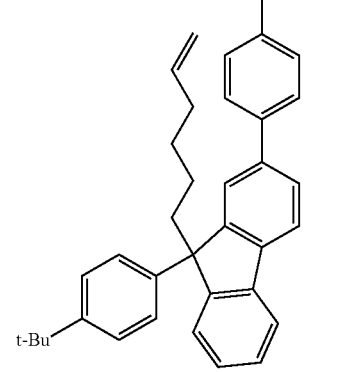
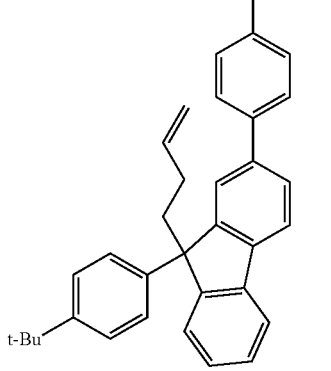

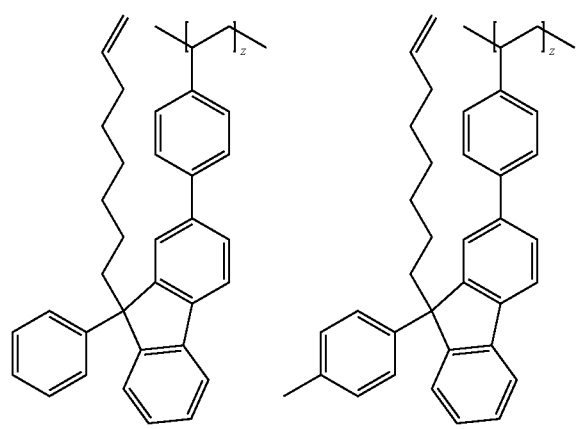
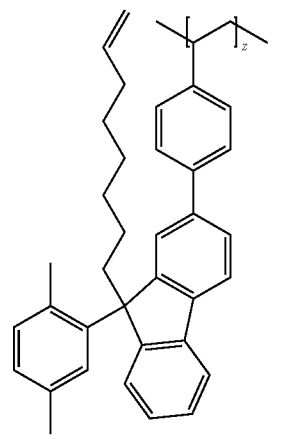
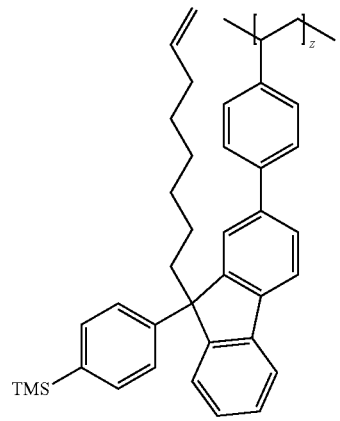
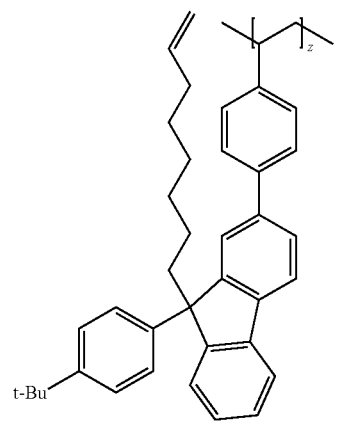
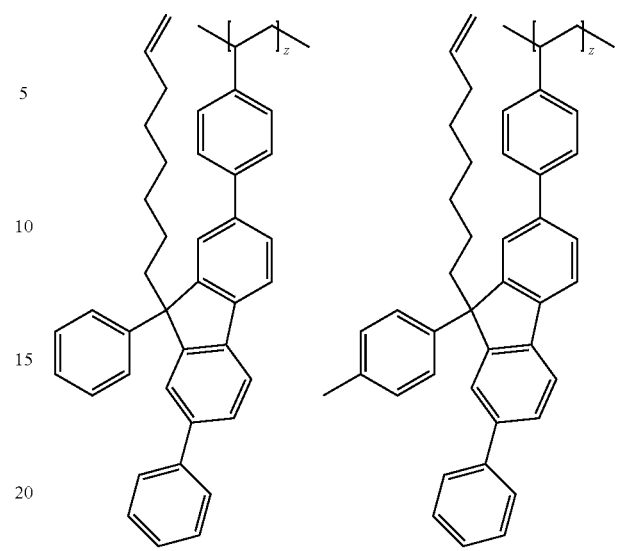
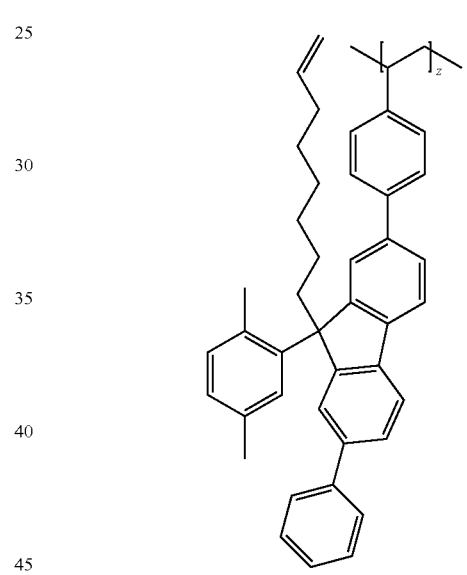
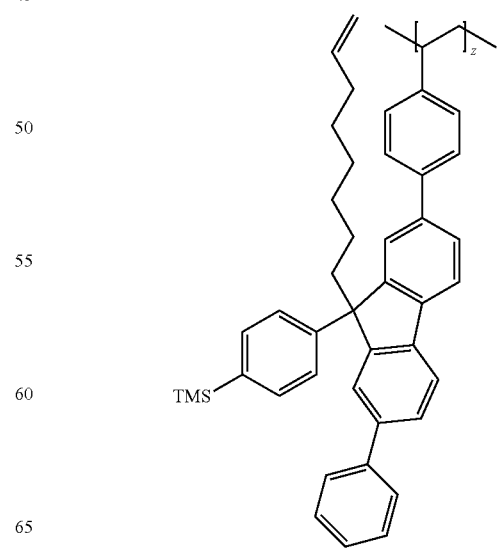

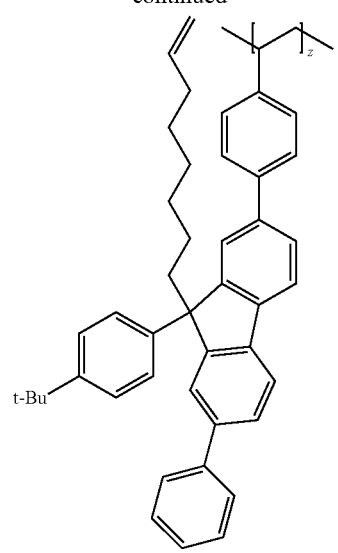
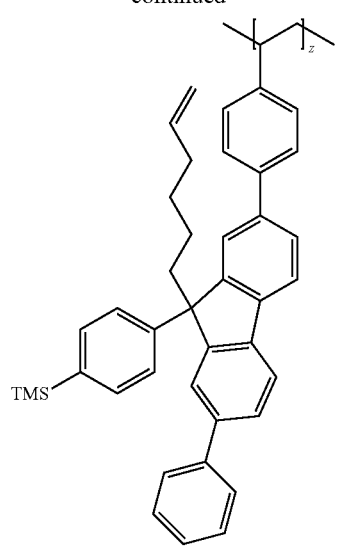
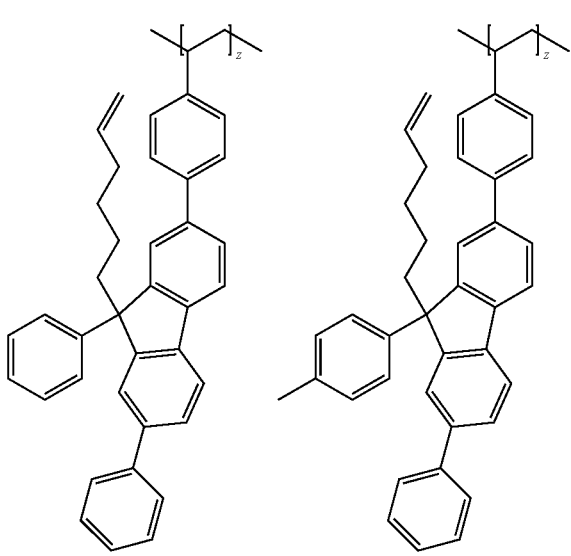
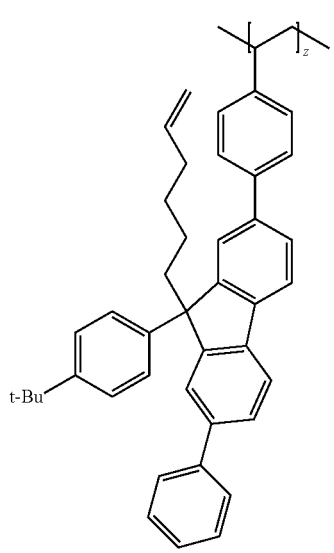
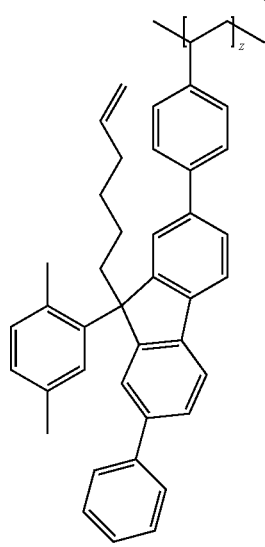
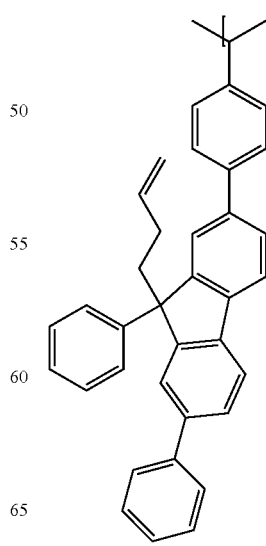
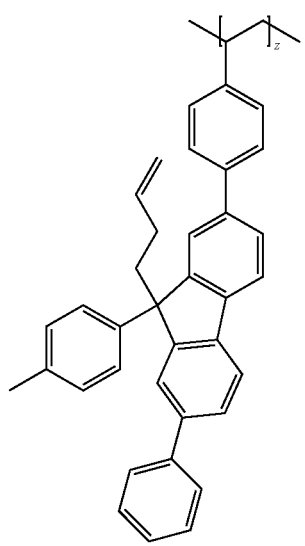

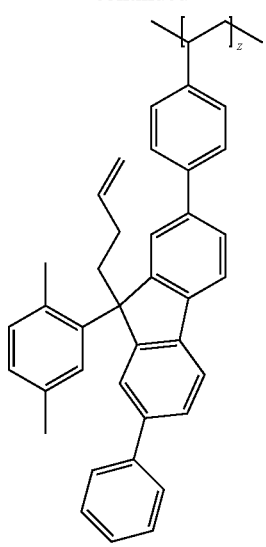

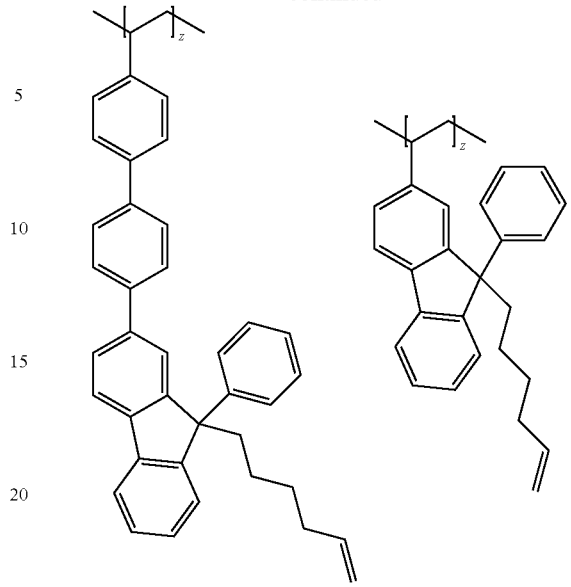

wherein, TMS means trimethylsilyl and t-Bu means tert-butyl.

Meanwhile, the compound represented by Chemical Formula 3 is derived from a monomer represented by the following Chemical Formula 3-1:

[Chemical Formula 3-1]

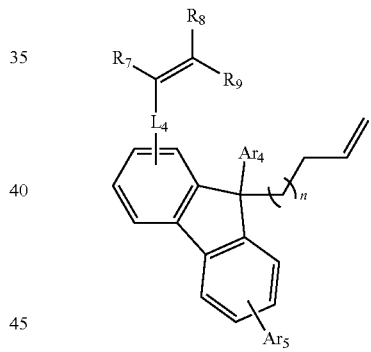

in Chemical Formula 3-1, $R_7$ to $R_9$, $L_4$, $Ar_4$, $Ar_5$, and n are the same as those defined in Chemical Formula 3.

The compound represented by Chemical Formula 3-1 may be prepared according to the preparation method as shown in the following Reaction Scheme 3.

[Reaction Scheme 3]

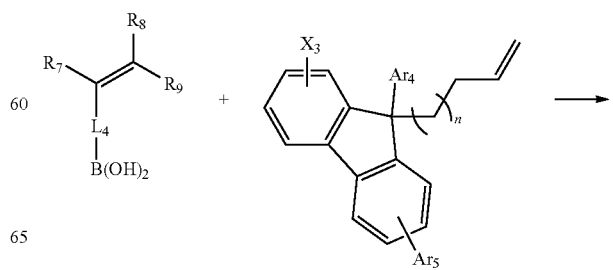

-continued

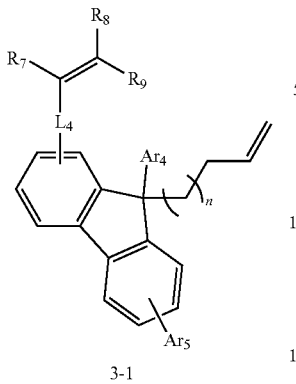

3-1

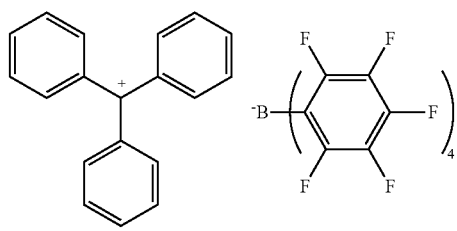

[Chemical Formula L]

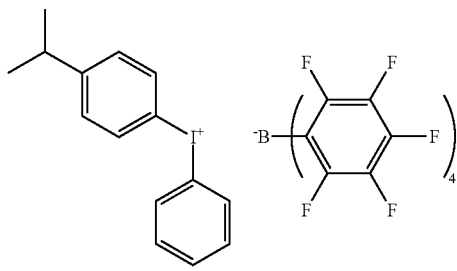

[Chemical Formula M]

In Reaction Scheme 3, the remaining definitions excluding $X_3$ are as defined above, and $X_3$ is halogen, preferably bromo, or chloro. The Reaction Scheme 3 is a Suzuki coupling reaction, which reaction is carried out in the presence of a palladium catalyst and a base to produce a compound represented by Chemical Formula 3-1. The above preparation method can be further specified in Preparation Examples described hereinafter.

(Polymer)

The polymer according to the present invention can be prepared by polymerizing the monomer represented by Chemical Formula 1-1, the monomer represented by Chemical Formula 2-1, and the monomer represented by Chemical Formula 3-1. Preferably, the polymer according to the present invention is a random copolymer containing the above-mentioned repeating units.

In the polymer according to the present invention, x, y and z are molar ratios of the repeating unit of Chemical Formula 1, the repeating unit of Chemical Formula 2 and the repeating unit of Chemical Formula 3 in the polymer. x:y:z is 0.5~0.9:0.05~0.45:0.05~ 0.45. The molar ratio of the polymer can be controlled by adjusting the reaction molar ratio of the repeating unit of Chemical Formula 1-1, the repeating unit of Chemical Formula 2-1 and the repeating unit of Chemical Formula 3-1.

Preferably, the weight average molecular weight of the polymer is 15,000 to 1,000,000, and more preferably 40,000 to 100,000.

Meanwhile, the polymer may be used together with a doping material. The doping material used herein may be a compound of the following Chemical Formula K, an ionic compound of the following Chemical Formula L or M, but is not limited thereto.

[Chemical Formula K]

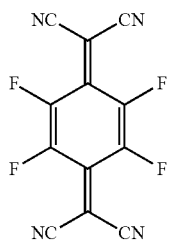

(Coating Composition)

The polymer according to the present invention can form an organic material layer, particularly a hole transport layer, of the organic light emitting device by a solution process. Thus, the present invention provides a coating composition including the above-mentioned polymer according to the present invention and a solvent.

The solvent is not particularly limited as long as it is a solvent capable of dissolving or dispersing the polymer according to the present invention. Examples of the solvent may include chlorine-based solvents such as chloroform, methylene chloride, 1,2-dichloroethane, 1,1,2-trichloroethane, chlorobenzene and o-dichlorobenzene; ether-based solvents such as tetrahydrofuran and dioxane; aromatic hydrocarbon-based solvents such as toluene, xylene, trimethylbenzene and mesitylene; aliphatic hydrocarbon-based solvents such as cyclohexane, methylcyclohexane, n-pentane, n-hexane, n-heptane, n-octane, n-nonane and n-decane; ketone-based solvents such as acetone, methyl ethyl ketone, and cyclohexanone; ester-based solvents such as ethyl acetate, butyl acetate and ethyl cellosolve acetate; polyalcohols such as ethylene glycol, ethylene glycol monobutyl ether, ethylene glycol monoethyl ether, ethylene glycol monomethyl ether, dimethoxyethane, propylene glycol, diethoxymethane, triethylene glycol monoethyl ether, glycerin and 1,2-hexanediol, and derivatives thereof; alcohol-based solvents such as methanol, ethanol, propanol, isopropanol and cyclohexanol; sulfoxide-based solvents such as dimethyl sulfoxide; amide-based solvents such as N-methyl-2-pyrrolidone and N,N-dimethylformamide; benzoate-based solvents such as butyl benzoate and methyl-2-methoxybenzoate; tetraline; 3-phenoxy-toluene, and the like. In addition, the above-mentioned solvents may be used singly or in combination of two or more solvents.

Further, the viscosity of the coating composition is preferably 1 cP to 10 cP, and coating is easy within the above range. Further, in the coating composition, the concentration of the polymer according to the present invention is preferably 0.1 wt/v % to 20 wt/v %.

In addition, the coating composition may further include one or more additives selected from the group consisting of a thermal polymerization initiator and a photopolymerization initiator.

Examples of the thermal polymerization initiator may include peroxides such as methyl ethyl ketone peroxide, methyl isobutyl ketone peroxide, acetyl acetone peroxide, methyl cyclohexanone peroxide, cyclohexanone peroxide, isobutyryl peroxide, 2,4-dichlorobenzoyl peroxide, bis-3,5, 5-trimethylhexanoyl peroxide, lauryl peroxide, benzoyl peroxide, or azo-based such as azobis isobutylnitrile, azobis dimethylvaleronitrile and azobis cyclohexylnitrile, but are not limited thereto.

Examples of the photopolymerization initiator may include acetophenone-based or ketal-based photopolymerization initiators such as diethoxyacetophenone, 2,2-dimethoxy-1,2-diphenylethan-1-one, 1-hydroxy-cyclohexyl-phenyl-ketone, 4-(2-hydroxyethoxy)phenyl-(2-hydroxy-2-propyl)ketone, 2-benzyl-2-dimethylamino-1-(4-morpholinophenyl)butanone-1,2-hydroxy-2-methyl-1-phenylpropan-1-one, 2-methyl-2-morpholino(4-methylthiophenyl)propan-1-one and 1-phenyl-1,2-propanedion-2-(o-ethoxycarbonyl)oxime; benzoin ether-based photopolymerization initiators such as benzoin, benzoin methyl ether and benzoin ethyl ether; benzophenone-based photopolymerization initiators such as benzophenone, 4-hydroxybenzophenone, 2-benzoyl naphthalene, 4-benzoylbiphenyl and 4-benzoylphenyl ether; thioxanthone-based photopolymerization initiators such as 2-isopropylthioxanthone, 2-chlorothioxanthone, 2,4-dimethylthioxanthone, 2,4-diethylthioxanthone and 2,4-dichlorothioxanthone; and other photopolymerization initiators such as ethyl anthraquinone, 2,4,6-trimethylbenzoyl diphenylphosphine oxide, 2,4,6-trimethylbenzoyl phenylethoxyphosphine oxide, bis(2,4,6-trimethylbenzoyl)phenylphosphine oxide, and bis(2,4-dimethoxy benzoyl)-2,4,4-trimethylpentylphosphine oxide, but are not limited thereto.

In addition, those having a photopolymerization accelerating effect may be used either alone or as a combination with the photopolymerization initiator. Examples thereof may include triethanolamine, methyldiethanolamine, ethyl 4-dimethylaminobenzoate, isoamyl 4-dimethylaminobenzoate, (2-dimethylamino)ethyl benzoate, 4,4'-dimethylaminobenzophenone and the like, but are not limited thereto.

In another embodiment of the invention, there is provided a method for forming a hole transport layer using the above-mentioned coating composition. Specifically, the method includes the steps of: coating a coating composition according to the present invention on the anode or on the hole injection layer formed on the anode by a solution process; and heat treating or light treating the coated coating composition.

The solution process uses the above-described coating composition according to the present invention, and refers to spin coating, dip coating, doctor blading, inkjet printing, screen printing, spray method, roll coating, and the like, but is not limited thereto.

The heat treatment temperature in the heat treatment is preferably from 150 to 230° C. In another embodiment, a heat treatment time may be from 1 minute to 3 hours, more preferably 10 minutes to 1 hour. In another embodiment, the heat treatment is preferably carried out in an inert gas atmosphere such as argon and nitrogen. Further, the method may further include a step of evaporating the solvent between the coating step and the heat treatment or light treatment step.

(Organic Light Emitting Device)

In another aspect of the invention, there is provided an organic light emitting device including the above-described polymer according to the present invention. Specifically, the present invention provides an organic light emitting device including an anode; a cathode provided opposite to the anode; a light emitting layer provided between the anode and the cathode; and a hole transport layer provided between the anode and the light emitting layer, wherein the hole transport layer includes the above-mentioned polymer according to the present invention.

The structure of an organic light emitting device according to an embodiment of the present invention is illustrated in FIGS. 1 and 2.

FIG. 1 shows an example of an organic light emitting device comprising a substrate 1, an anode 2, a hole transport layer 3, a light emitting layer 4, and a cathode 5. FIG. 2 shows an example of an organic light emitting device comprising a substrate 1, an anode 2, a hole injection layer 6, a hole transport layer 3, a light emitting layer 4, an electron transport layer 7, an electron injection layer 8 and a cathode 5.

The organic light emitting device according to the present invention may be manufactured by materials and methods known in the art, except that the hole transport layer includes the polymer according to the present invention and is manufactured according to the above-described method.

For example, the organic light emitting device according to the present invention can be manufactured by sequentially stacking an anode, an organic material layer and a cathode on a substrate. In this case, the organic light emitting device may be manufactured by depositing a metal, metal oxides having conductivity, or an alloy thereof on the substrate using a PVD (physical vapor deposition) method such as a sputtering method or an e-beam evaporation method to form an anode, forming organic material layers including the hole injection layer, the hole transport layer, the light emitting layer and the electron transport layer thereon, and then depositing a material that can be used as the cathode thereon.

In addition to such a method, the organic light emitting device may be manufactured by sequentially depositing a cathode material, an organic material layer and an anode material on a substrate (International Publication WO 2003/012890). However, the manufacturing method is not limited thereto.

As the anode material, generally, a material having a large work function is preferably used so that holes can be smoothly injected into the organic material layer. Specific examples of the anode material include metals such as vanadium, chrome, copper, zinc, and gold, or an alloy thereof; metal oxides such as zinc oxides, indium oxides, indium tin oxides (ITO), and indium zinc oxides (IZO); a combination of metals and oxides, such as ZnO:Al or SnO$_2$:Sb; conductive polymers such as poly(3-methylthiophene), poly[3,4-(ethylene-1,2-dioxy)thiophene](PEDOT), polypyrrole, and polyaniline, and the like, but are not limited thereto.

As the cathode material, generally, a material having a small work function is preferably used so that electrons can be easily injected into the organic material layer. Specific examples of the cathode material include metals such as magnesium, calcium, sodium, potassium, titanium, indium, yttrium, lithium, gadolinium, aluminum, silver, tin, and lead, or an alloy thereof; a multilayered structure material such as LiF/Al or LiO$_2$/Al, and the like, but are not limited thereto.

The hole injection layer is a layer for injecting holes from the electrode, and the hole injection material is preferably a compound which has a capability of transporting the holes, thus has a hole injecting effect in the anode and an excellent hole injecting effect to the light emitting layer or the light emitting material, prevents excitons produced in the light emitting layer from moving to a hole injection layer or the electron injection material, and further is excellent in the ability to form a thin film. It is preferable that a HOMO (highest occupied molecular orbital) of the hole injection material is between the work function of the anode material and a HOMO of a peripheral organic material layer. Specific examples of the hole injection material include metal porphyrine, oligothiophene, an arylamine-based organic material, a hexanitrilehexaazatriphenylene-based organic material, a quinacridone-based organic material, a perylene-based organic material, anthraquinone, polyaniline and polythiophene-based conductive polymer, and the like, but are not limited thereto.

The light emitting material is preferably a material which may receive holes and electrons transported from a hole transport layer and an electron transport layer, respectively, and combine the holes and the electrons to emit light in a visible ray region, and has good quantum efficiency to fluorescence or phosphorescence. Specific examples of the light emitting material include an 8-hydroxy-quinoline aluminum complex ($Alq_3$); a carbazole-based compound; a dimerized styryl compound; BAlq; a 10-hydroxybenzoquinoline-metal compound; a benzoxazole, benzthiazole and benzimidazole-based compound; a poly(p-phenylenevinylene)(PPV)-based polymer; a spiro compound; polyfluorene, rubrene, and the like, but are not limited thereto.

The light emitting layer may include a host material and a dopant material. The host material may be a fused aromatic ring derivative, a heterocycle-containing compound or the like. Specific examples of the fused aromatic ring derivatives include anthracene derivatives, pyrene derivatives, naphthalene derivatives, pentacene derivatives, phenanthrene compounds, fluoranthene compounds, and the like. Examples of the heterocyclic-containing compounds include carbazole derivatives, dibenzofuran derivatives, ladder-type furan compounds, pyrimidine derivatives, and the like, but are not limited thereto.

Examples of the dopant material include an aromatic amine derivative, a styrylamine compound, a boron complex, a fluoranthene compound, a metal complex, and the like. Specifically, the aromatic amine derivative is a substituted or unsubstituted fused aromatic ring derivative having an arylamino group, and examples thereof include pyrene, anthracene, chrysene, periflanthene and the like, which have an arylamino group. The styrylamine compound is a compound where at least one arylvinyl group is substituted in substituted or unsubstituted arylamine, in which one or two or more substituent groups selected from the group consisting of an aryl group, a silyl group, an alkyl group, a cycloalkyl group, and an arylamino group are substituted or unsubstituted. Specific examples thereof include styrylamine, styryldiamine, styryltriamine, styryltetramine, and the like, but are not limited thereto. Further, the metal complex includes an iridium complex, a platinum complex, and the like, but is not limited thereto.

The electron transport layer is a layer which receives electrons from an electron injection layer and transports the electrons to a light emitting layer, and an electron transport material is suitably a material which may receive electrons well from a cathode and transfer the electrons to a light emitting layer, and has a large mobility for electrons. Specific examples of the electron transport material include: an Al complex of 8-hydroxyquinoline; a complex including $Alq_3$; an organic radical compound; a hydroxyflavone-metal complex, and the like, but are not limited thereto. The electron transport layer may be used with any desired cathode material, as used according to the related art. In particular, appropriate examples of the cathode material are a typical material which has a low work function, followed by an aluminum layer or a silver layer. Specific examples thereof include cesium, barium, calcium, ytterbium, and samarium, in each case followed by an aluminum layer or a silver layer.

The electron injection layer is a layer which injects electrons from an electrode, and is preferably a compound which has a capability of transporting electrons, has an effect of injecting electrons from a cathode and an excellent effect of injecting electrons into a light emitting layer or a light emitting material, prevents excitons produced from the light emitting layer from moving to a hole injection layer, and is also excellent in the ability to form a thin film. Specific examples of the electron injection layer include fluorenone, anthraquinodimethane, diphenoquinone, thiopyran dioxide, oxazole, oxadiazole, triazole, imidazole, perylenetetracarboxylic acid, fluorenylidene methane, anthrone, and the like, and derivatives thereof, a metal complex compound, a nitrogen-containing 5-membered ring derivative, and the like, but are not limited thereto.

Examples of the metal complex compound include 8-lithium, hydroxyquinolinato bis(8-hydroxyquinolinato) zinc, bis(8-hydroxyquinolinato)copper, bis(8-hydroxyquinolinato)manganese, tris(8-tris(2-methyl-8-hydroxyquinolinato)aluminum, hydroxyquinolinato)aluminum, tris(8-hydroxyquinolinato)gallium, bis(10-hydroxybenzo[h]quinolinato)beryllium, bis(10-hydroxybenzo[h]quinolinato) zinc, bis(2-methyl-8-quinolinato)chlorogallium, bis(2-methyl-8-quinolinato)(o-cresolato)gallium, bis(2-methyl-8-quinolinato)(1-naphtholato)aluminum, bis(2-methyl-8-quinolinato)(2-naphtholato)gallium, and the like, but are not limited thereto.

The organic light emitting device according to the present invention may be a front side emission type, a back side emission type, or a double side emission type according to the used material.

In addition, the polymer according to the present invention may be included in an organic solar cell or an organic transistor in addition to an organic light emitting device.

The preparation of the polymer according to the present invention and the organic light emitting device containing the same will be described in detail in the following examples. However, these examples are presented for illustrative purposes only, and are not intended to limit the scope of the present invention.

[Preparation of Intermediate]

Preparation of Intermediates 5 and 6

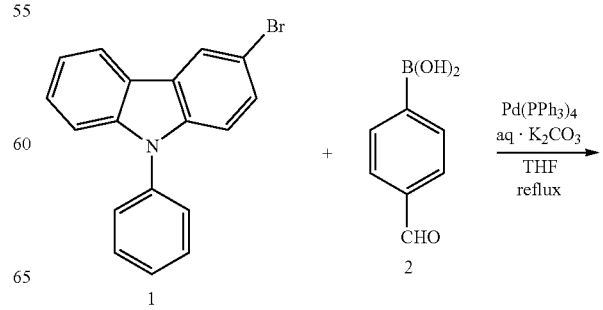

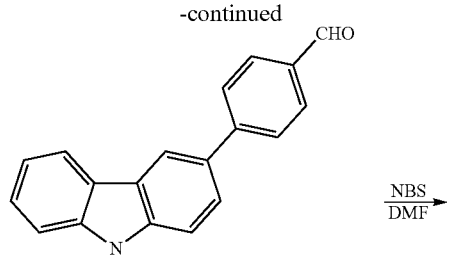

carbonate (K₂CO₃/H₂O) aqueous solution (70 mL) were added thereto, and the mixture was refluxed for 6 hours. The reaction solution was cooled to room temperature, and then the organic layer was extracted. The reaction solution was concentrated and recrystallized with ethanol to obtain Compound 3 (8.9 g, yield: 92%).

MS: [M+H]⁺=348

Compound 3 (8.2 g, 23.6 mmol) was dissolved in DMF (200 mL), N-bromosuccinimide (4.15 g, 23.6 mmol) was added thereto and then stirred at room temperature for 5 hours. Distilled water was added to the reaction solution to complete the reaction, and the organic layer was extracted. The reaction solution was concentrated and recrystallized with ethanol to obtain Compound 4 (8.25 g, yield: 82%).

MS: [M+H]⁺=427

Methyltriphenyl phosphonium bromide (13.41 g, 37.532 mmol) and potassium t-butoxide (4.21 g, 37.532 mmol) were added to anhydrous THF (300 mL) and stirred beforehand. Then, Compound 4 (8 g, 18.766 mmol) dissolved in anhydrous THF (60 mL) was slowly added dropwise and allowed to react for 5 hours. After the reaction was completed with aqueous sodium carbonate solution, the organic layer was extracted using methylene chloride and water, and the residual water was removed using MgSO₄. The reaction solution was concentrated and then subjected to column chromatography using methylene chloride and hexane to obtain Compound 5 (7.8 g, 98%).

MS: [M+H]⁺=425

After Compound 5 (2 g, 4.713 mmol) and (4-chlorophenyl)boronic acid (1.1 g, 7.069 mmol) were dissolved in anhydrous THF (20 mL), Pd(PPh₃)₄ (0.32 g, 0.28 mmol) and 2M potassium carbonate (K₂CO₃/H₂O) aqueous solution (15 mL) were added thereto, and the mixture was refluxed for 6 hours. The reaction solution was cooled to room temperature, and then the organic layer was extracted. The reaction solution was concentrated and recrystallized with ethanol to obtain Compound 6 (2 g, yield: 93%).

MS: [M+H]⁺=457

Preparation Example 1

Preparation Example 1-1: Preparation of Compound A1

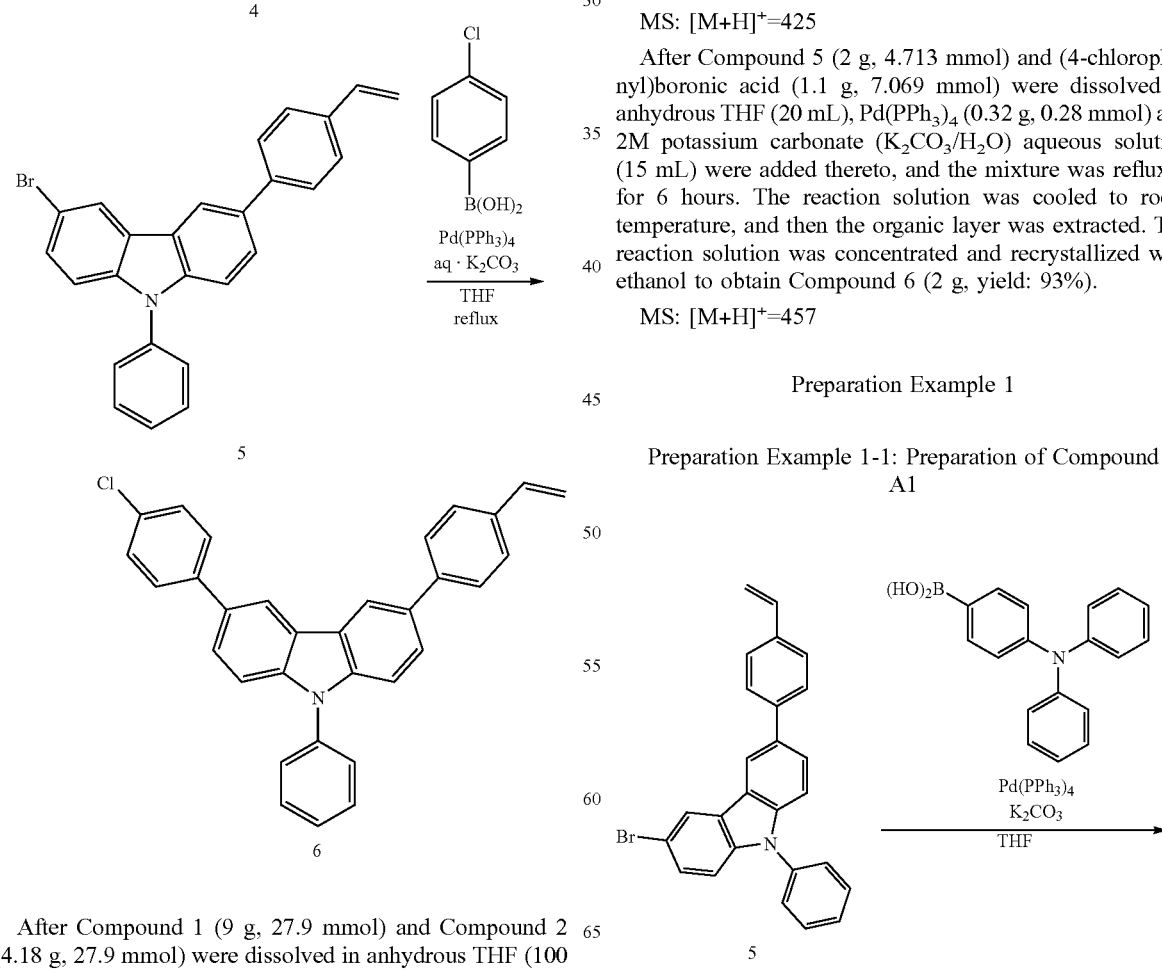

After Compound 1 (9 g, 27.9 mmol) and Compound 2 (4.18 g, 27.9 mmol) were dissolved in anhydrous THF (100 mL), Pd(PPh₃)₄ (0.32 g, 0.28 mmol) and 2M potassium

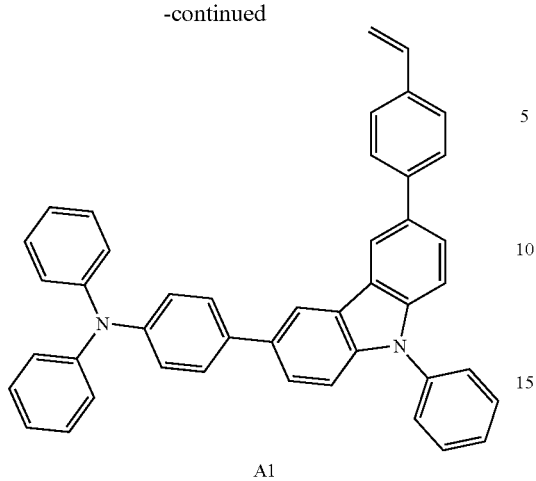

A1

Compound 5 (3.65 g, 8.615 mmol), (4-(diphenylamino) phenyl)boronic acid (2.99 g, 10.338 mmol), Pd(PPh$_3$)$_4$ (498 mg, 0.431 mmol), and K$_2$CO$_3$ (3.57 g, 25.845 mmol) were dissolved in THF (43 mL) and distilled water (15 mL), and then stirred at 70° ° C. for 15 hours. The organic layer was extracted with ethyl acetate and water. After performing dehydration using MgSO$_4$, the solvent was removed under reduced pressure. The resulting material was subjected to column chromatography using ethyl acetate and hexane to prepare Compound A1.

MS: [M+H]$^+$=589

Preparation Example 1-2: Preparation of Compound A2

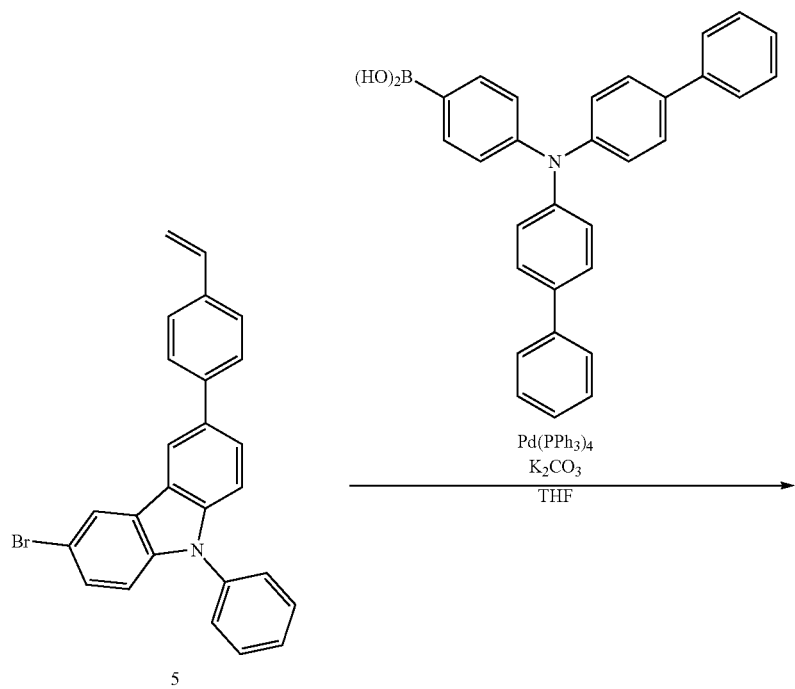

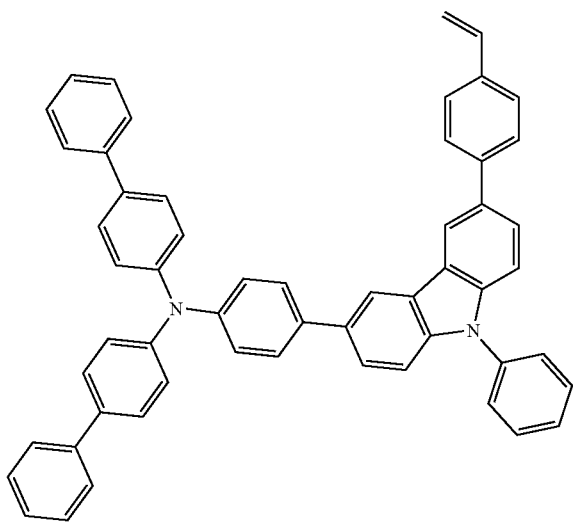

A2

Compound A2 was prepared in the same manner as in the preparation of Compound A1, except that (4-(biphenyl-4-ylamino)phenyl)boronic acid was used instead of (4-(diphenylamino)phenyl)boronic acid.

MS: [M+H]$^+$=741

Preparation Example 1-3: Preparation of Compound A3

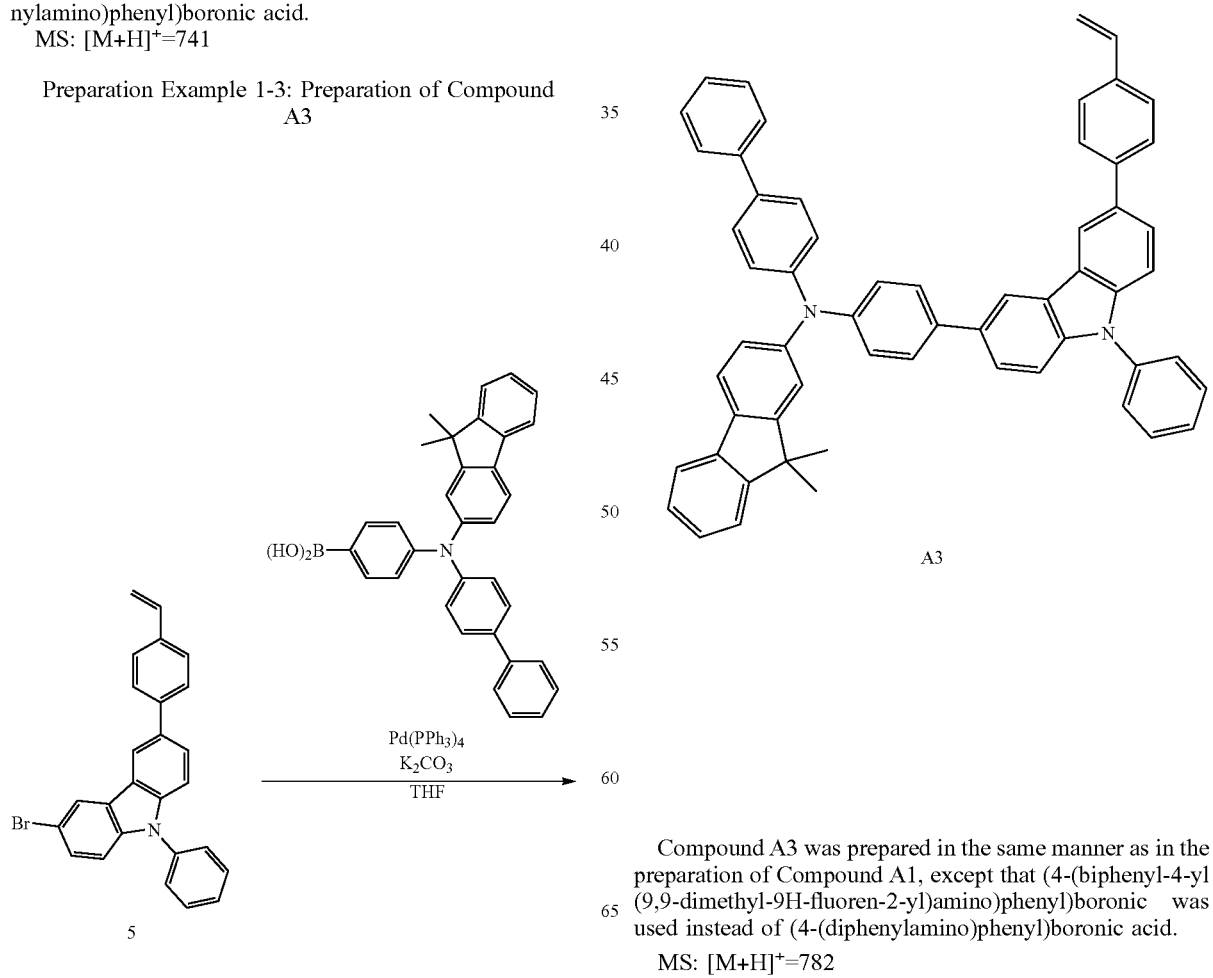

A3

Compound A3 was prepared in the same manner as in the preparation of Compound A1, except that (4-(biphenyl-4-yl (9,9-dimethyl-9H-fluoren-2-yl)amino)phenyl)boronic was used instead of (4-(diphenylamino)phenyl)boronic acid.

MS: [M+H]$^+$=782

Preparation Example 1-4: Preparation of Compound A4

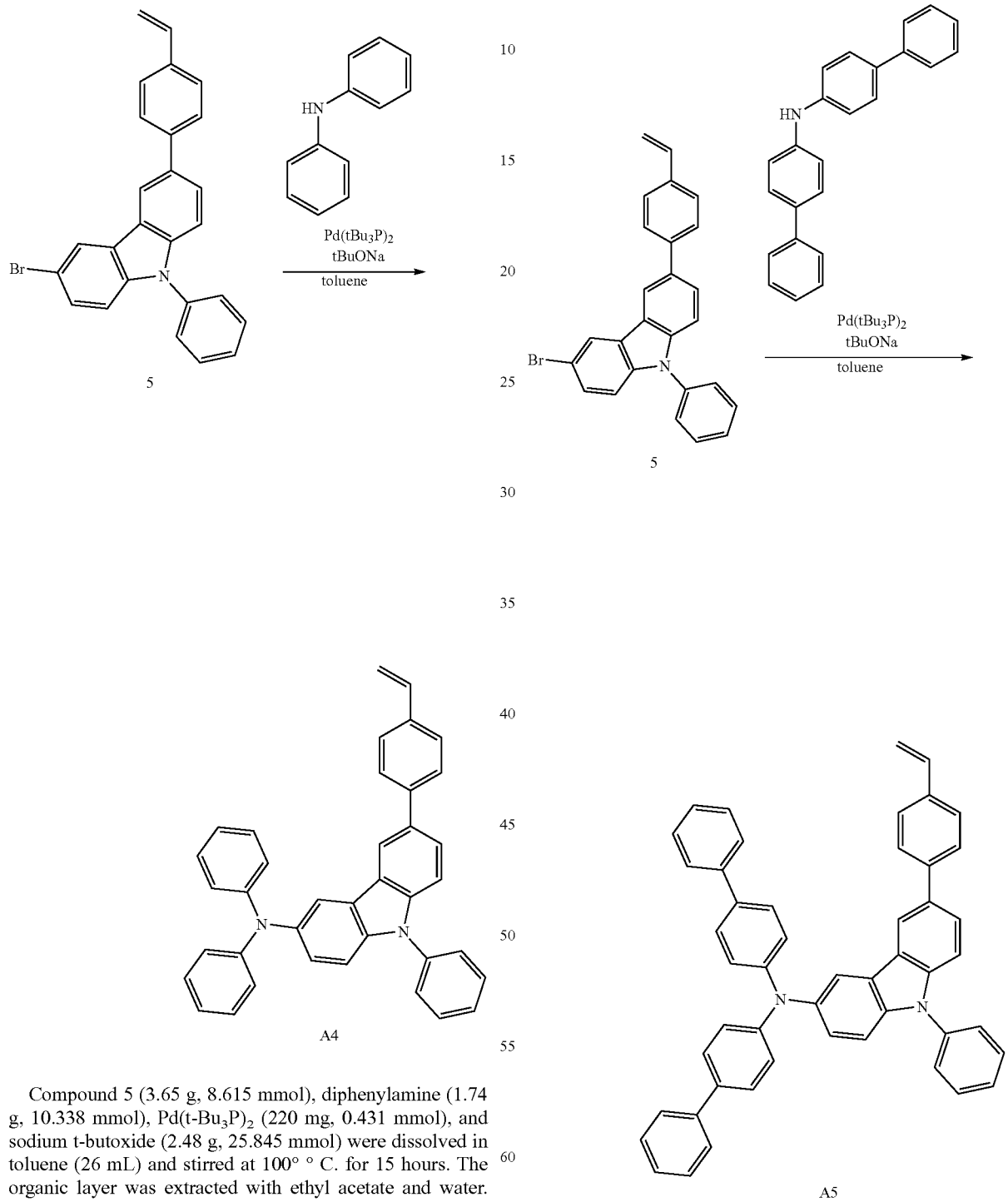

Compound 5 (3.65 g, 8.615 mmol), diphenylamine (1.74 g, 10.338 mmol), Pd(t-Bu$_3$P)$_2$ (220 mg, 0.431 mmol), and sodium t-butoxide (2.48 g, 25.845 mmol) were dissolved in toluene (26 mL) and stirred at 100° ° C. for 15 hours. The organic layer was extracted with ethyl acetate and water. After performing dehydration using MgSO$_4$, the solvent was removed under reduced pressure. The resulting material was subjected to column chromatography using ethyl acetate and hexane to prepare Compound A4.

MS: [M+H]$^+$=513

Preparation Example 1-5: Preparation of Compound A5

Compound A5 was prepared in the same manner as in the preparation of Compound A4, except that dibiphenyl-4-ylamine was used instead of diphenylamine.

MS: [M+H]$^+$=665

Preparation Example 1-6: Preparation of Compound A6

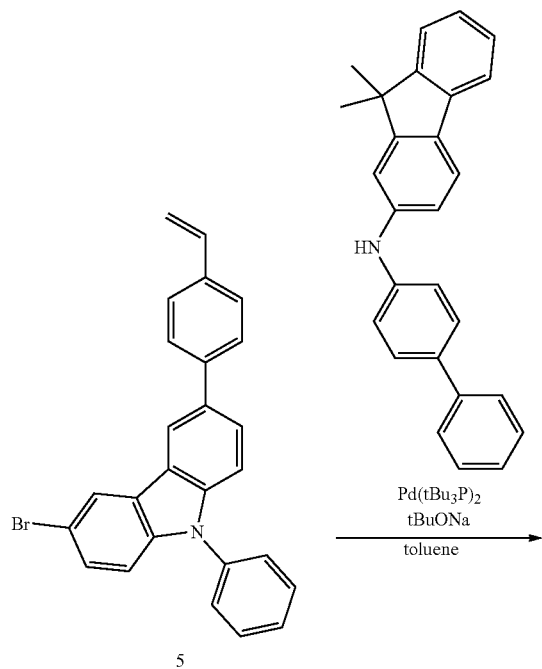

Compound A6 was prepared in the same manner as in the preparation of Compound A4, except that N-(biphenyl-4-yl)-9,9-dimethyl-9H-fluorene-2-amine was used instead of diphenylamine.

MS: [M+H]$^+$=665

Preparation Example 1-7: Preparation of Compound A7

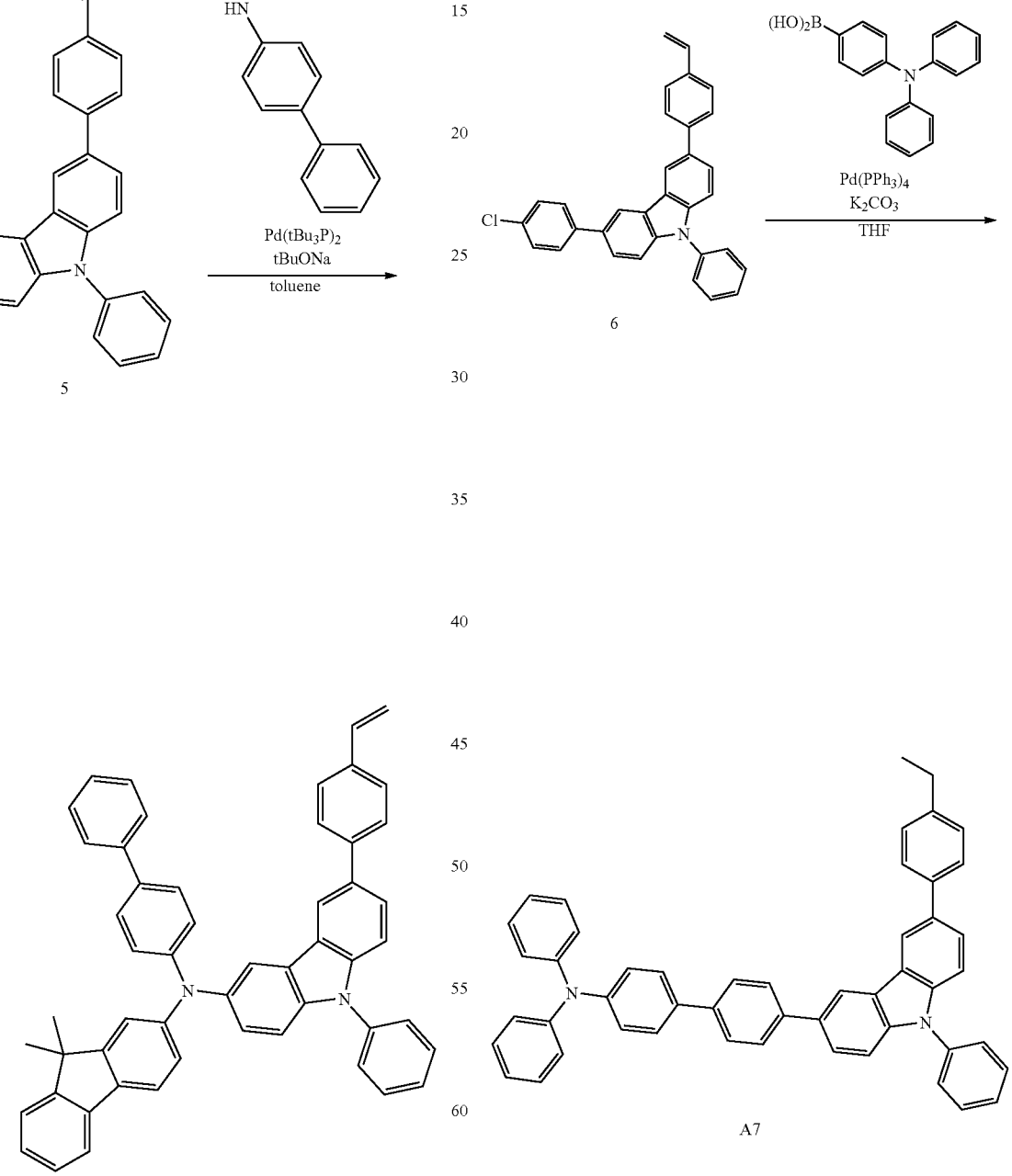

Compound A7 was prepared in the same manner as in the preparation of Compound A1, except that Compound 6 was used instead of Compound 5.

MS: [M+H]$^+$=665

Preparation Example 1-8: Preparation of Compound A8
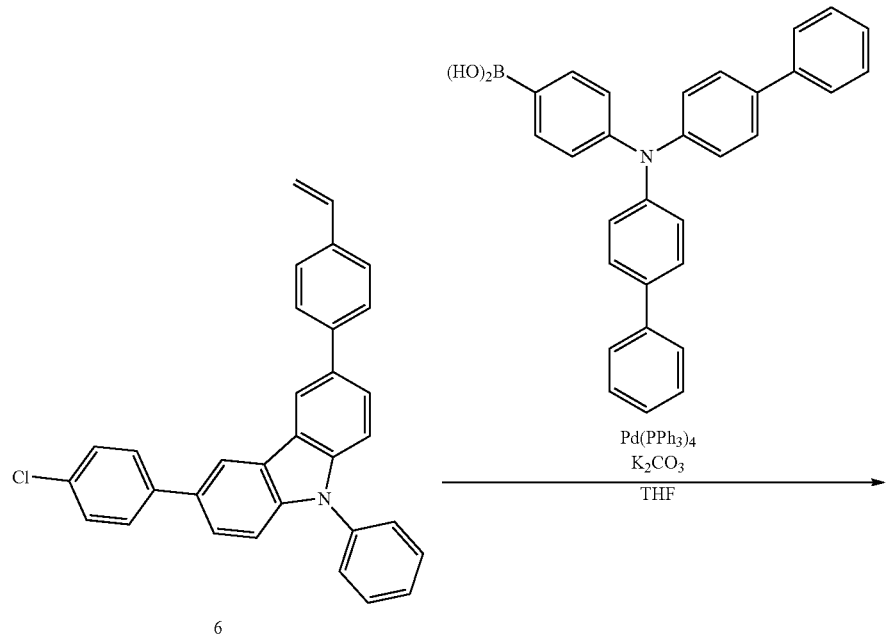
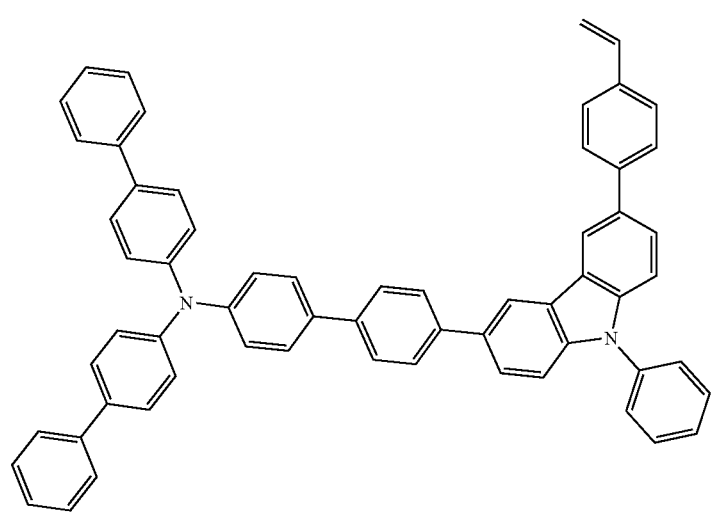
A8

Compound A8 was prepared in the same manner as in the preparation of Compound A1, except that Compound 6 was used instead of Compound 5, and (4-(dibiphenyl-4-ylamino)phenyl)boronic acid was used instead of (4-(diphenylamino)phenyl)boronic acid.
MS: $[M+H]^+=818$
Preparation Example 1-9: Preparation of Compound A9
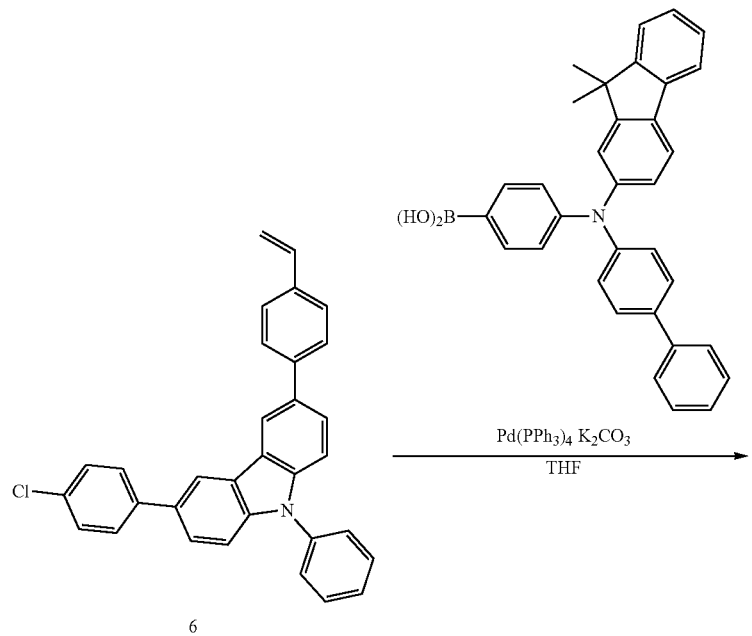
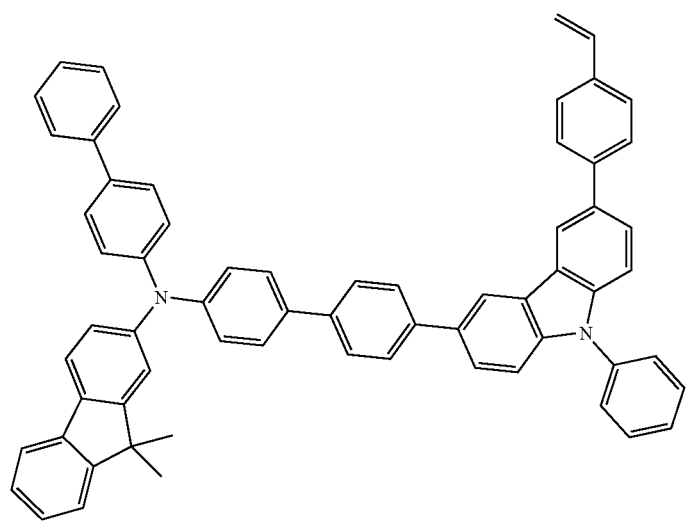

Compound A9 was prepared in the same manner as in the preparation of Compound A1, except that Compound 6 was used instead of Compound 5, and 4-(biphenyl-4-yl(9,9-dimethyl-9H-fluoren-2-yl)amino)phenylboronic acid was used instead of (4-(diphenylamino)phenyl)boronic acid.

MS: MS: [M+H]⁺=858

Preparation Example 2

Preparation Example 2-1: Preparation of Compound B2

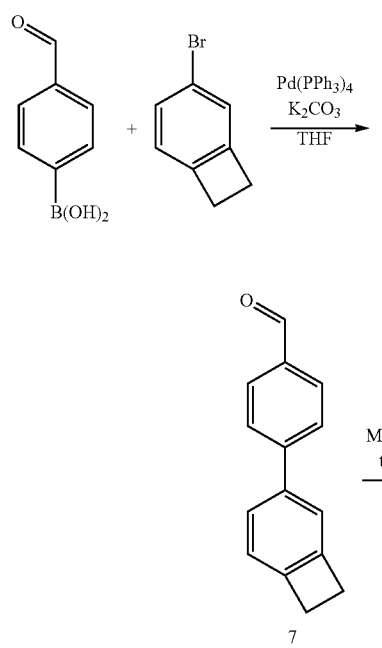

(4-Formylphenyl)boronic acid (4.91 g, 32.778 mmol), 3-bromobicyclo[4.2.0]octa-1(6),2,4-triene (5 g, 27.315 mmol), Pd (PPh₃)₄ (1.58 g, 1.366 mmol), and K₂CO₃ (11.32 g, 81.945 mmol) were dissolved in THF (200 mL) and distilled water (100 mL), and then stirred at 70° ° C. for 15 hours. The organic layer was extracted with ethyl acetate and water. After performing dehydration using MgSO₄, the solvent was removed under reduced pressure. The resulting material was subjected to column chromatography using ethyl acetate and hexane to produce Compound 7.

MS: MS: [M+H]⁺=209

Methyltriphenylphosphonium bromide (13.41 g, 37.532 mmol) and potassium t-butoxide (4.21 g, 37.532 mmol) were added to anhydrous THF (30 mL) and stirred. Then, Compound 7 (3.90 g, 18.766 mmol) dissolved in anhydrous THF (10 mL) was slowly added dropwise thereto and then allowed to react for 4 hours. After the reaction was completed with aqueous sodium carbonate solution, the organic layer was extracted with methylene chloride and water, and the residual water was removed using MgSO₄. The reaction solution was concentrated and then subjected to column chromatography using methylene chloride and hexane to obtain Compound B2 (3.2 g, yield: 84%).

MS: MS: [M+H]⁺=207

Preparation Example 3

Preparation Example 3-1: Preparation of Compound D1

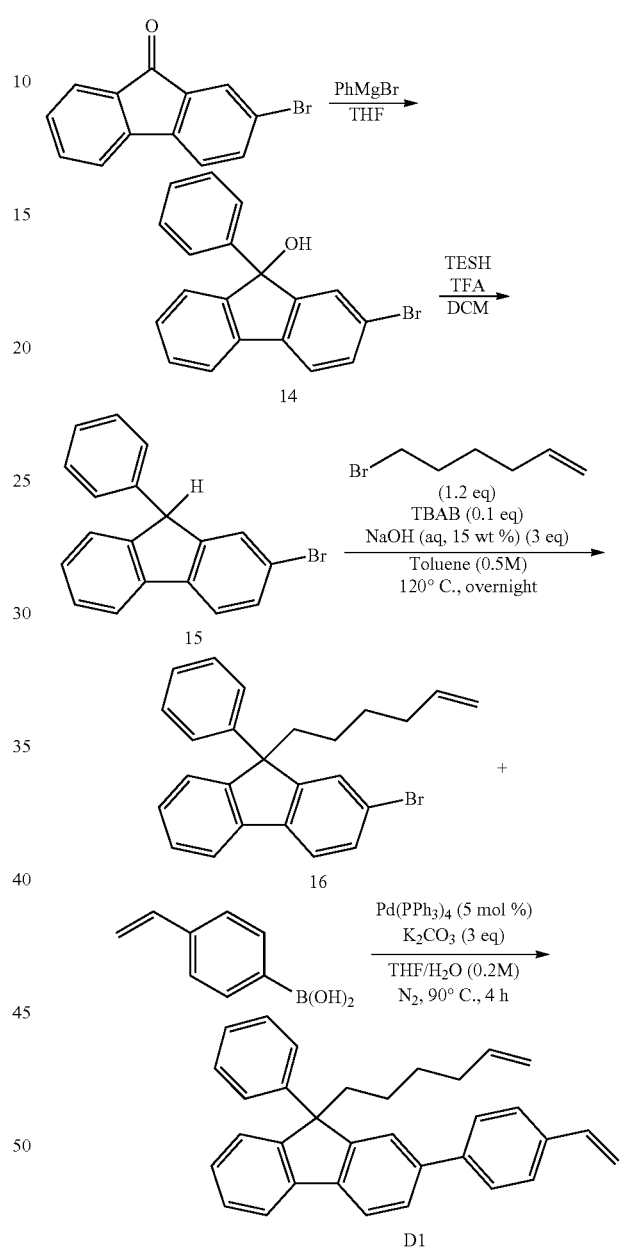

After 2-bromo-9H-fluorene-9-one (5 g) was dissolved in THF (50 mL), phenylmagnesium bromide (11 mL, 3 M solution in ether) was added thereto at 0° C., and stirred for 30 minutes. After the reaction was completed with an aqueous ammonium chloride solution, the organic layer was extracted with ethyl acetate and water. The organic layer residue was removed with MgSO₄, filtered. The filtrate was concentrated through a vacuum concentrator to remove the solvent, which was then purified by MPLC to obtain Compound 14 (5.4 g).

After Compound 14 (5.4 g) was dissolved in methylene chloride (40 mL), TESH (3.84 mL) and TFA (1.9 mL) were slowly added dropwise thereto, and then stirred at room temperature for 16 hours. The organic layer was extracted with methylene chloride and water, the residual water was removed with MgSO$_4$, and the solvent was removed through a vacuum concentrator. The obtained solid was purified by MPLC to obtain Compound 15 (4.8 g).

After Compound 15 (1 g) was dissolved in toluene (10 mL), TBAB (0.1 g), NaOH (0.4 g), and water (2 mL) were added thereto and stirred beforehand. 6-Bromohexene (0.6 mL) was added and reacted at 120° C. overnight. Then, an organic layer was extracted with ethyl acetate and water. After water remaining in the organic layer was removed with MgSO$_4$, the solvent was removed through a vacuum concentrator, and the result was purified by MPLC to obtain Compound 16 (0.7 g).

Compound 16 (1.7 g, 4.22 mmol), 4-vinylbenzeneboronic acid (750 mg, 5.06 mmol), Pd(PPh$_3$)$_4$ (243 mg, 0.21 mmol), and K$_2$CO$_3$ (1.75 g, 12.65 mmol) were placed in a round bottom flask which was purged with nitrogen. THF (17 mL) and H$_2$O (4.2 mL) were added, followed by stirring at 90° C. for 4 hours. The organic layer was extracted with ethyl acetate and water. Water remaining in the organic layer was removed with MgSO$_4$ and then filtered. The filtrate was dried in vacuo and then purified by MPLC to give Compound D1 (950 mg).

MS: MS: [M+H]$^+$=427

Preparation Example 3-2: Preparation of Compound D2

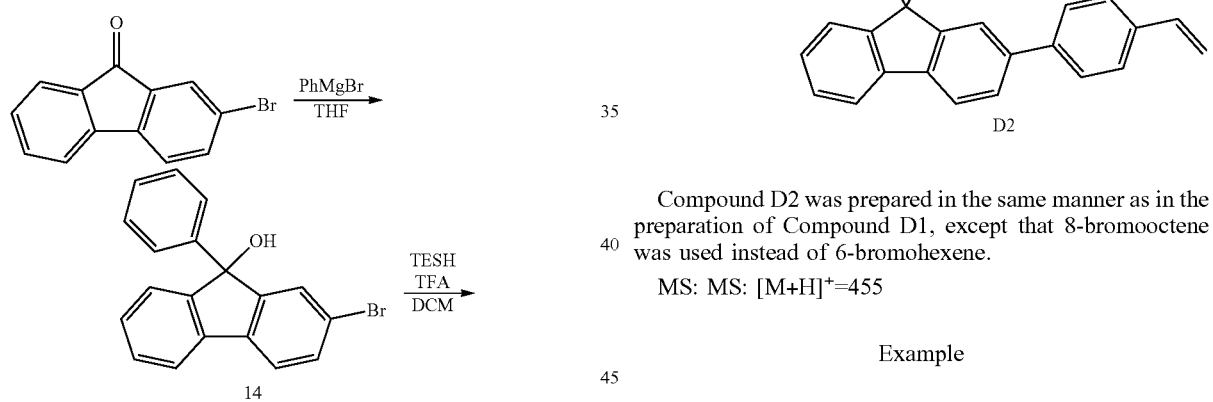

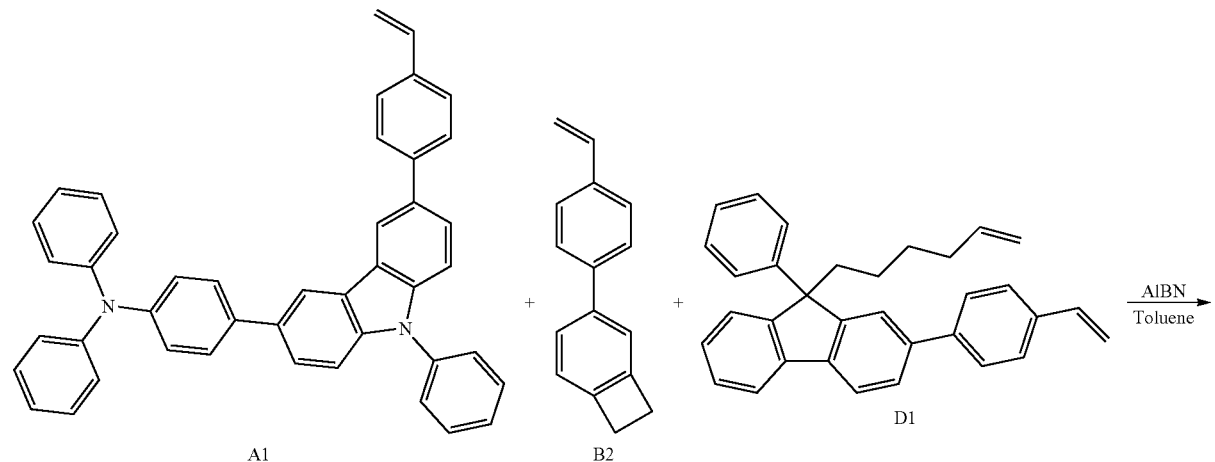

Compound D2 was prepared in the same manner as in the preparation of Compound D1, except that 8-bromooctene was used instead of 6-bromohexene.

MS: MS: [M+H]$^+$=455

Example

Example 1: Preparation of Copolymer C1

-continued

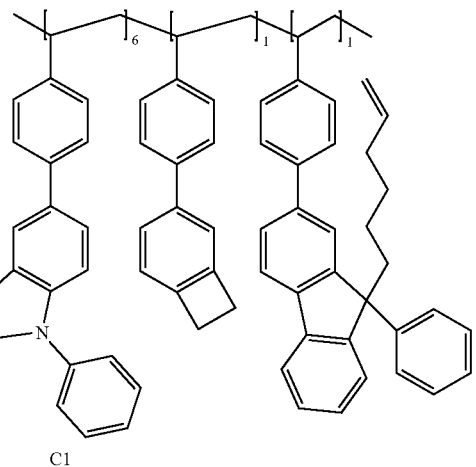

C1

Compound A1 (500 mg) previously prepared, Compound B2 (22 mg), Compound D1 (45 mg), and AIBN (1.2 mg) were placed in toluene and allowed to react at 100° ° C. for 14 hours under a nitrogen purge. Polymer C1 synthesized by precipitation from ethyl acetate was prepared. The number average molecular weight and weight average molecular weight of the prepared polymer were measured by GPC using PC Standard with Agilent 1200 series.

Mn: 37100, Mw: 78600

Example 2: Preparation of Copolymer C2

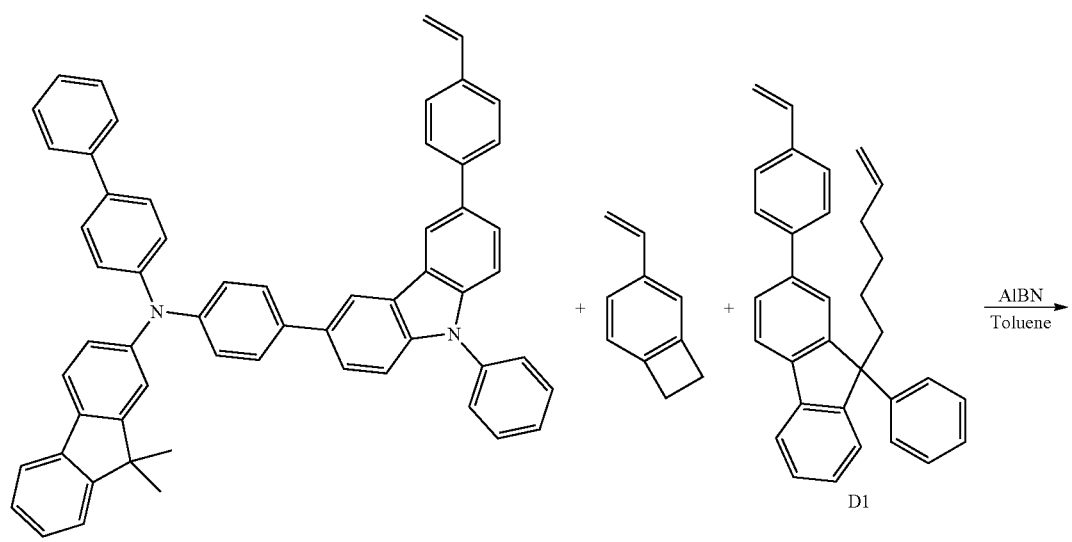

A3        D1

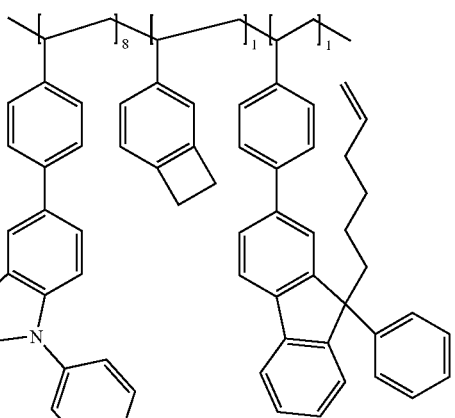

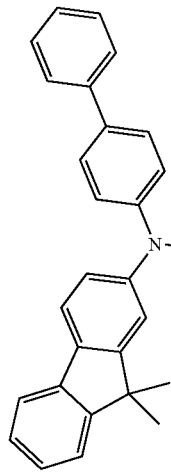

Copolymer C2 was prepared in the same manner as in the preparation of Copolymer C1, except that Compound A3 was used instead of Compound A1, and 3-vinyl-bicyclo[4.2.0]octa-1(6),2,4-triene was used instead of Compound B2. The number average molecular weight and weight average molecular weight of the prepared polymer were measured by GPC using PC Standard with Agilent 1200 series.

Mn: 45700, Mw: 97400

Example 3: Preparation of Copolymer C3

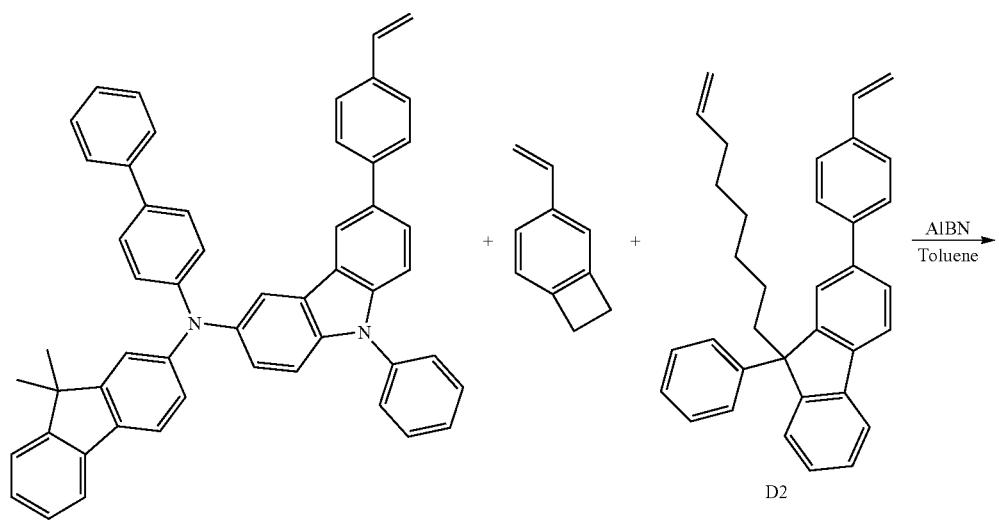

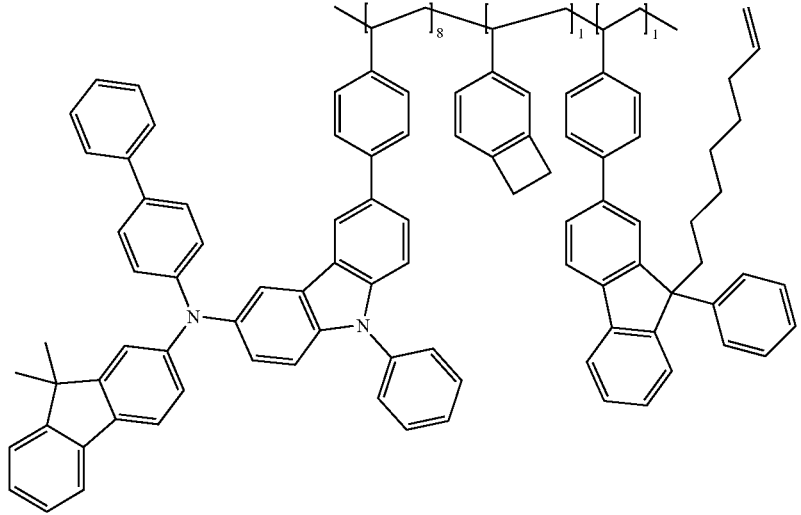

C3

Copolymer C3 was prepared in the same manner as in the preparation of Copolymer C1, except that Compound A6 was used instead of Compound A1, 3-vinyl-bicyclo[4.2.0]octa-1(6),2,4-triene was used instead of Compound B2, and Compound D2 was used instead of Compound D1. The number average molecular weight and weight average molecular weight of the prepared polymer were measured by GPC using PC Standard with Agilent 1200 series.

Mn: 39200, Mw: 62400

Example 4: Preparation of Copolymer C4

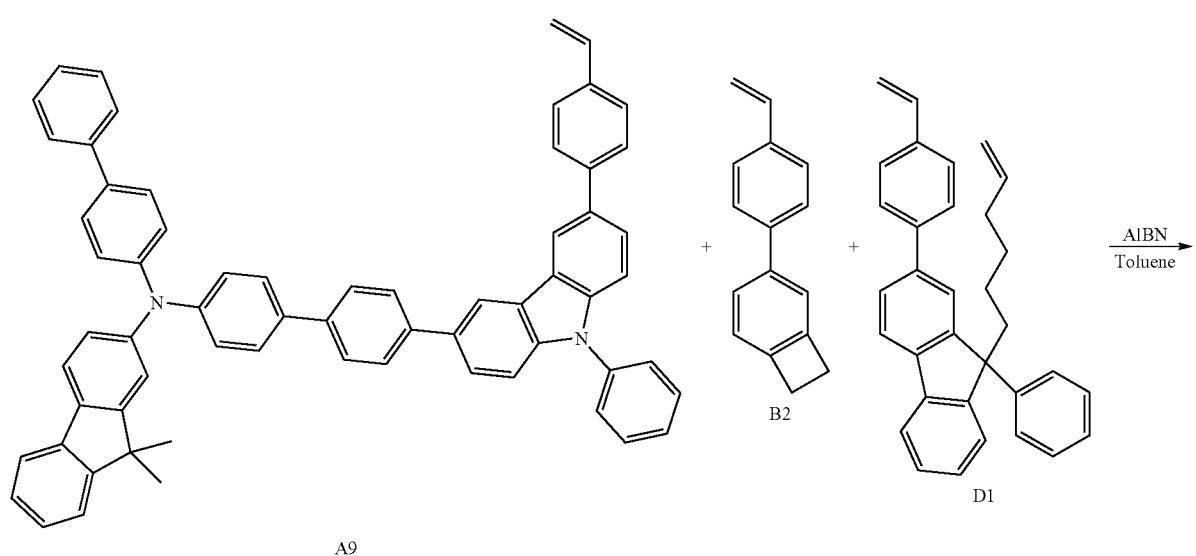

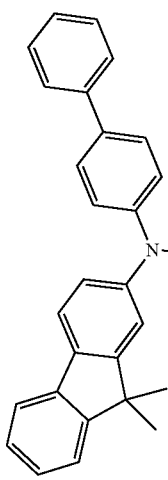
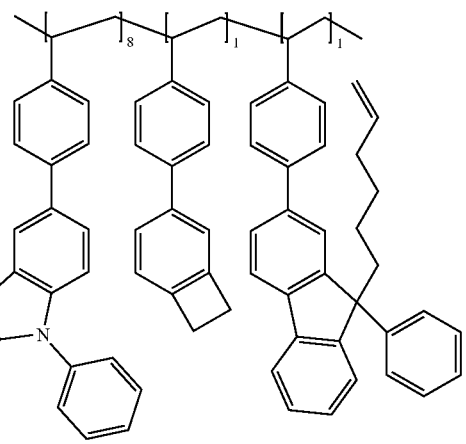
C4
Copolymer C4 was prepared in the same manner as in the preparation of Copolymer C1, except that Compound A9 was used instead of Compound A1. The number average molecular weight and weight average molecular weight of the prepared polymer were measured by GPC using PC Standard with Agilent 1200 series.
Mn: 35900, Mw: 73100
Example 5: Preparation of Copolymer C5
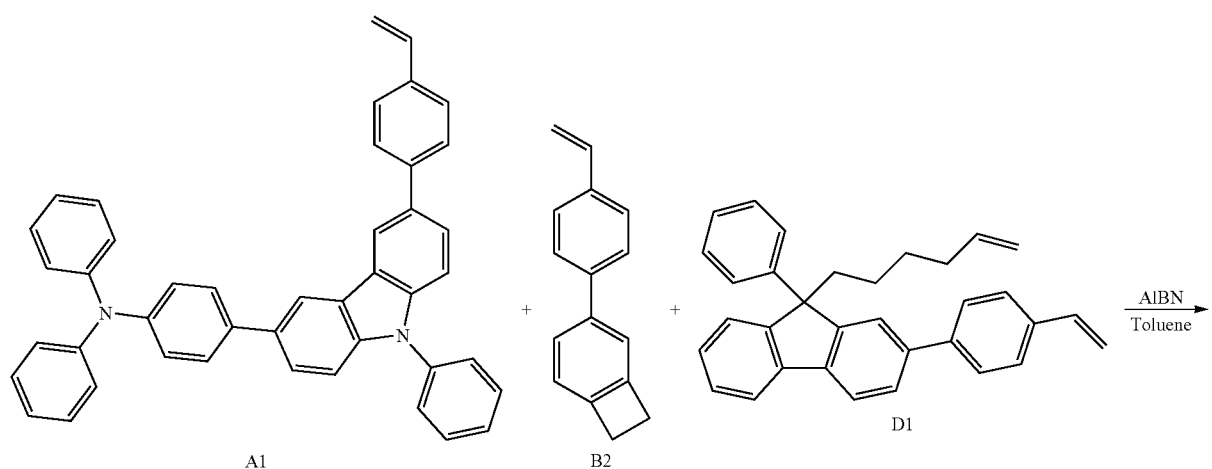

-continued

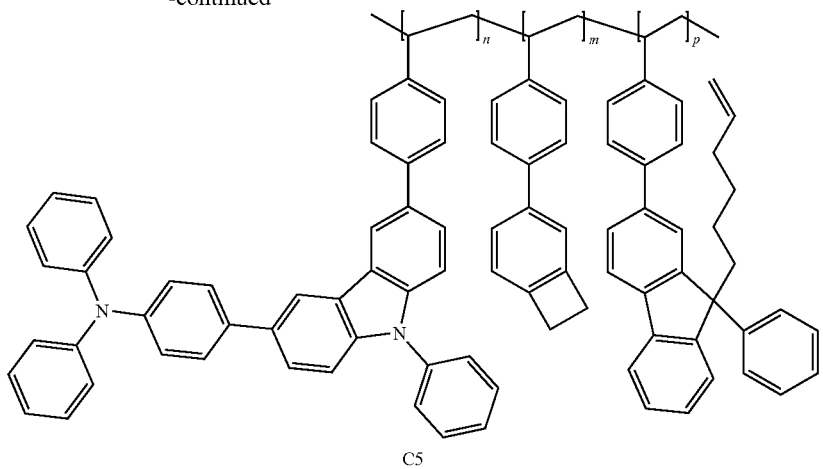

C5

Compound A1 (500 mg) previously prepared, Compound B2 (44 mg), Compound D1 (90 mg), and AIBN (1.2 mg) were placed in toluene and reacted at 100° C. for 14 hours under a nitrogen purge. Polymer C5 synthesized by precipitation from ethyl acetate was prepared. The number average molecular weight and weight average molecular weight of the prepared polymer were measured by GPC using PC Standard with Agilent 1200 series.

Mn: 45030, Mw: 92770

Example 6: Preparation of Copolymer C6

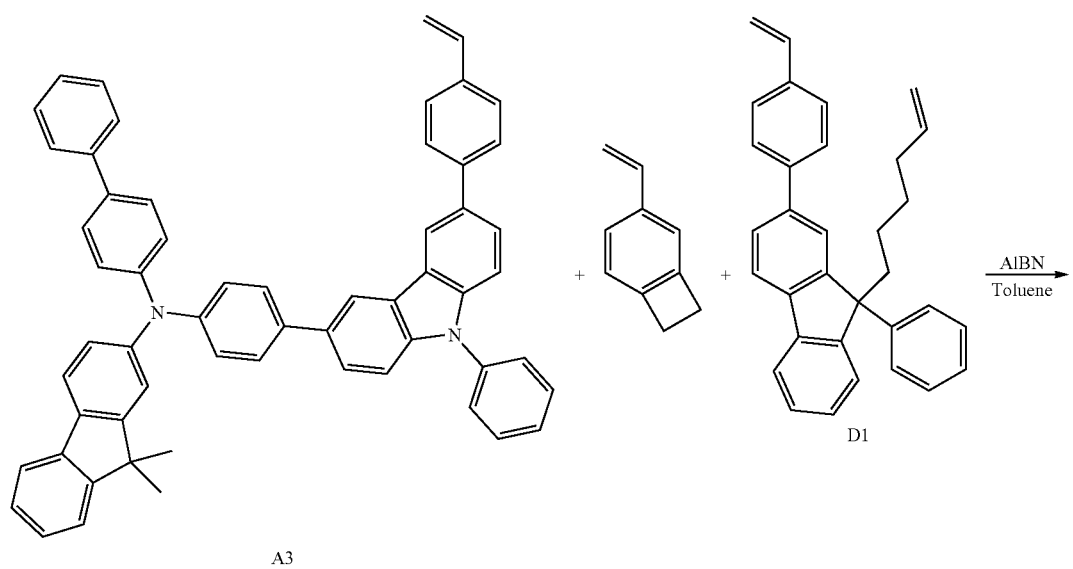

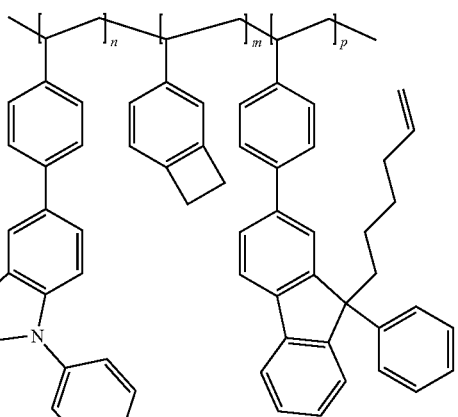

C6

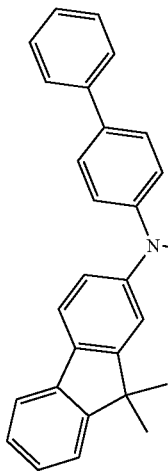

Copolymer C6 was prepared in the same manner as in the preparation of Copolymer C1, except that Compound A3 was used instead of Compound A1, and 3-vinyl-bicyclo[4.2.0]octa-1(6),2,4-triene was used instead of Compound B2. The number average molecular weight and weight average molecular weight of the prepared polymer were measured by GPC using PC Standard with Agilent 1200 series.

Mn: 32560, Mw: 74470

Comparative Example: Preparation of Copolymer F (1) Preparation of Compound 11

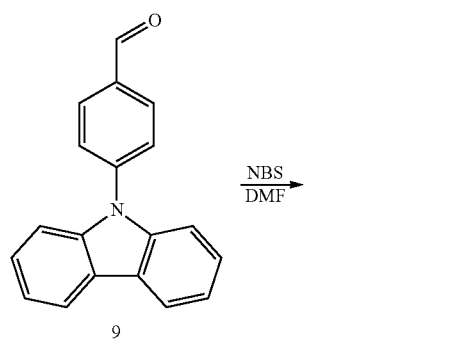

NBS / DMF

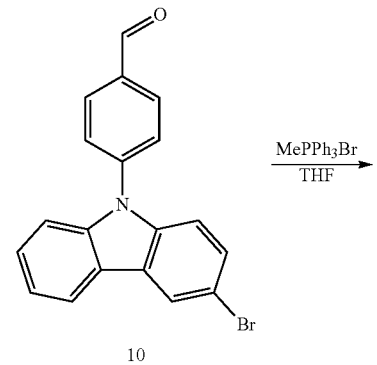

MePPh₃Br / THF

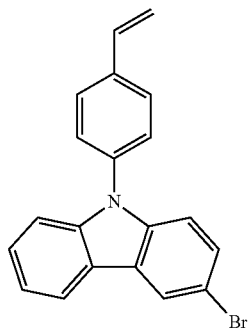

11

Compound 9 (4-(9H-carbazol-9-yl)benzaldehyde, 10 g, 26.856 mmol), and NBS (N-bromosuccinimide, 6.62 g, 37.225 mmol) were added to DMF (184 mL) and stirred for 4 hours. The organic layer was extracted with ethyl acetate and water. After performing dehydration using $MgSO_4$, the solvent was removed under reduced pressure. The resulting material was subjected to column chromatography using ethyl acetate and hexane to obtain Compound 10 (12.5 g, yield: 97%).

MS: MS: $[M+H]^+$=351

Methyltriphenylphosphonium bromide (15.3 g, 42.830 mmol) and potassium t-butoxide (6.4 g, 57.106 mmol) were added to THF (70 mL) and stirred. Then, Compound 10 (10 g, 28.553 mmol) previously prepared was further added, and stirred for 4 hours. The residual base was removed using a saturated aqueous sodium bicarbonate solution, and then the organic layer was extracted with ethyl acetate and water. After performing dehydration using $MgSO_4$, the solvent was removed under reduced pressure. The resulting material was subjected to column chromatography using ethyl acetate and hexane to obtain Compound 11 (9.5 g, yield: 96%).

MS: MS: $[M+H]^+$=349

(2) Preparation of Compound 12

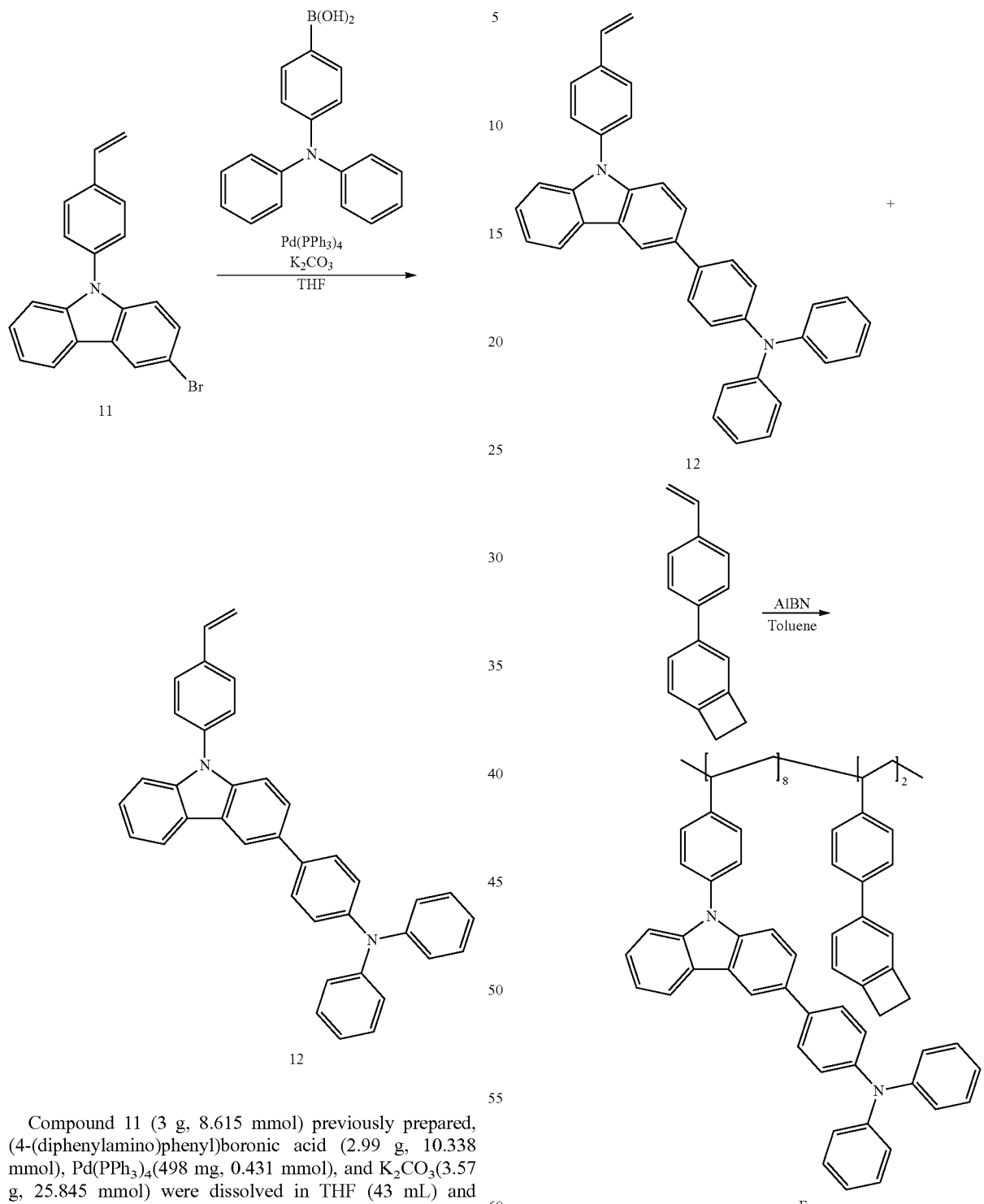

Compound 11 (3 g, 8.615 mmol) previously prepared, (4-(diphenylamino)phenyl)boronic acid (2.99 g, 10.338 mmol), Pd(PPh$_3$)$_4$ (498 mg, 0.431 mmol), and K$_2$CO$_3$ (3.57 g, 25.845 mmol) were dissolved in THF (43 mL) and distilled water (15 mL) and stirred at 70° ° C. for 15 hours. The organic layer was extracted with ethyl acetate and water. After performing dehydration using MgSO$_4$, the solvent was removed under reduced pressure. The resulting material was subjected to column chromatography using ethyl acetate and hexane to obtain Compound 12.

MS: MS: [M+H]$^+$=513

(3) Preparation of Copolymer F

Copolymer F was prepared in the same manner as in the preparation of Copolymer C1, except that Compound 12 and Compound B2 were used as starting materials and the equivalent weight was adjusted. The number average molecular weight and weight average molecular weight of the prepared polymer were measured by GPC using PC Standard with Agilent 1200 series.

Mn: 37800, Mw: 77900

Experimental Example

Experimental Example 1-1

A glass substrate on which ITO (indium tin oxide) was coated as a thin film to a thickness of 1,500 Å was put into distilled water in which a detergent was dissolved, and ultrasonically cleaned. In this case, a product manufactured by Fischer Co. was used as the detergent, and as the distilled water, distilled water filtered twice using a filter manufactured by Millipore Co. was used. After the ITO was cleaned for 30 minutes, ultrasonic cleaning was repeated twice using distilled water for 10 minutes. After the cleaning with distilled water was completed, the substrate was ultrasonically cleaned with solvents of isopropyl alcohol and acetone, dried, and then the substrate was cleaned for 5 minutes, and then transferred to a glove box.

2 wt % toluene ink of the copolymer C1 previously prepared and the following compound M (weight ratio of 8:2) was spin-coated (4000 rpm) on the ITO transparent electrode and heat-treated (cured) at 200° ° C. for 30 minutes to form a hole injection layer with a thickness of 40 nm. After being transferred to a vacuum depositor, the following compound G was vacuum-deposited on the hole injection layer to form a hole transport layer with a thickness of 20 nm. The following compound H and the following compound I were vacuum deposited at a weight ratio of 92:8 on the hole transport layer to a thickness of 20 nm to form a light emitting layer. The following compound J was vacuum deposited on the light emitting layer to a thickness of 35 nm to form an electron injection and transport layer. LiF (1 nm) and aluminum (100 nm) were sequentially deposited on the electron injection and transport layer to form a cathode.

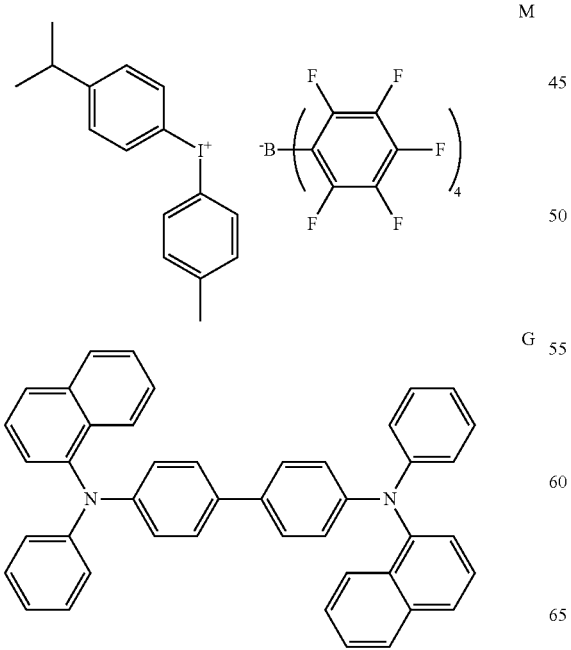

M

G

H

I

J

In the above-mentioned process, the vapor deposition rate of the organic material was maintained at 0.4 to 0.7 Å/sec, the deposition rate of LiF was maintained at 0.3 Å/sec, the deposition rate of aluminum was maintained at 2 Å/sec, and the degree of vacuum during the deposition was maintained at $2\times10^{-7}$ to $5\times10^{-8}$ torr.

Experimental Examples 1-2 to 1-4

The organic light emitting device was manufactured in the same manner as in Experimental Example 1-1, except that the copolymers shown in Table 1 below were used instead of Copolymer C1.

Comparative Experimental Example 1

The organic light emitting device was manufactured in the same manner as in Experimental Example 1-1, except that Copolymer F was used instead of Copolymer C1.

The driving voltage, external quantum efficiency (EQE), luminance and lifetime were measured at a current density of 10 mA/cm² for the organic light emitting devices manufactured in Experimental Examples and Comparative Experimental Example above, and the results are shown in Table 1 below. The external quantum efficiency was calculated by (number of emitted photons)/(number of injected charge carriers). T80 means the time required for the luminance to be reduced to 80% of the initial luminance (500 nit).

TABLE 1

| | Hole injection layer | Driving voltage (V) | J (mA/cm²) | EQE (%) | Lifetime (hr) (T80 @ 500 nit) |
|---|---|---|---|---|---|
| Experimental Example 1-1 | Copolymer C1 | 4.38 | 10 | 5.8 | 140 |
| Experimental Example 1-2 | Copolymer C2 | 4.24 | 10 | 6.1 | 159 |
| Experimental Example 1-3 | Copolymer C3 | 4.31 | 10 | 6.8 | 154 |
| Experimental Example 1-4 | Copolymer C4 | 4.83 | 10 | 5.3 | 172 |
| Comparative Experimental Example 1 | Copolymer F | 6.13 | 10 | 4.4 | 105 |

As shown in Table 1, it was confirmed that the copolymer according to the present invention contains the Chemical Formula 1 and the Chemical Formula 3 and thereby exhibits improved efficiency and lifetime compared with the copolymer not containing these formulas. In addition, the copolymer according to the present invention is excellent in solubility in an organic solvent and is easy to prepare a coating composition. From the result of Table 1 above, it was confirmed that a uniform coating layer can be formed using the coating composition, and the stability of the film is also excellent, and the organic light emitting device exhibits more excellent performance.

Experimental Example 2-1

A glass substrate on which ITO (indium tin oxide) was deposited as a thin film to a thickness of 1,500 Å was put into distilled water in which a detergent was dissolved, and ultrasonically cleaned. After the ITO was cleaned for 30 minutes, ultrasonic cleaning was repeated twice using distilled water for 10 minutes. After the cleaning with distilled water was completed, the substrate was ultrasonically cleaned with solvents of isopropyl alcohol and acetone for 30 minutes, respectively, dried, and then the substrate was transferred to a glove box.

On the ITO transparent electrode thus prepared, a solution in which the following compound A' and the following compound M were mixed at a weight ratio of 8:2 and dissolved in cyclohexanone was spin-coated to form a film with a thickness of 400 Å. This was heated at 220° C. for 30 minutes in a nitrogen atmosphere to form a hole injection layer. The copolymer C1 previously prepared was dissolved in toluene and spin-coated on the hole injection layer to form a film with a thickness of 200 Å, which was heated at 190° C. for 1 hour in a nitrogen atmosphere to form a hole transport layer. A solution in which the following compound H and the following compound I were dissolved in cyclohexanone at a weight ratio of 92:8 was spin-coated on the hole transport layer to form a film with a thickness of 200 Å, which was heated at 120° C. for 1 hour in a nitrogen atmosphere to form a light emitting layer. The following compound J was vacuum deposited on the light emitting layer to a thickness of 35 nm to form an electron injection and transport layer. LiF (1 nm) and aluminum (100 nm) were sequentially deposited on the electron injection and transport layer to form a cathode.

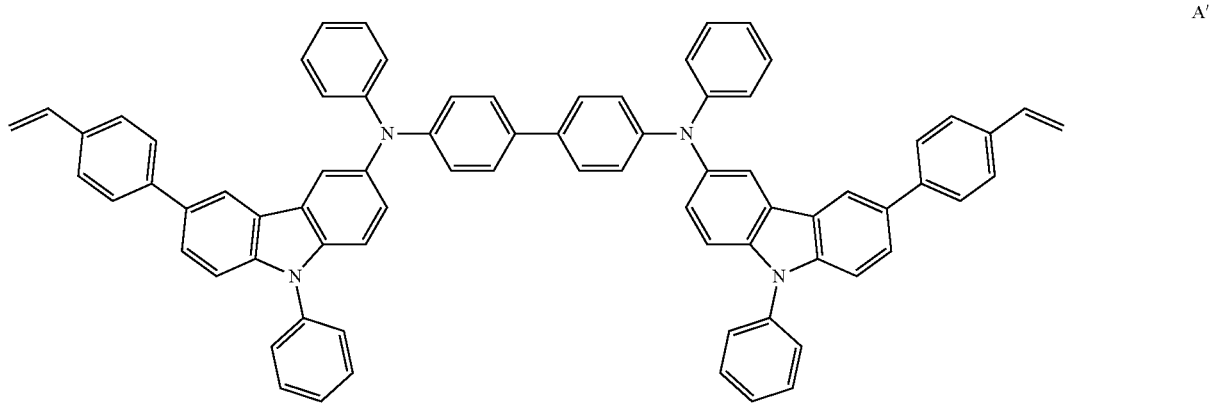

A'

-continued

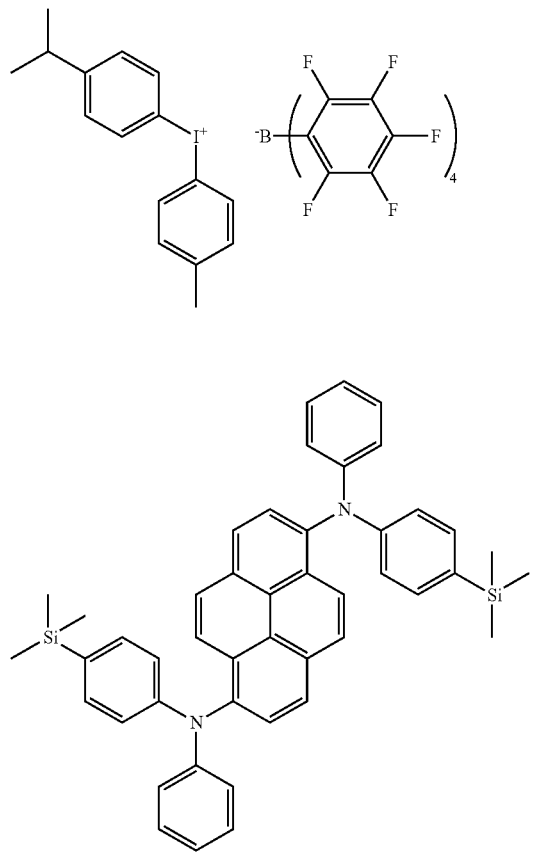

M

I

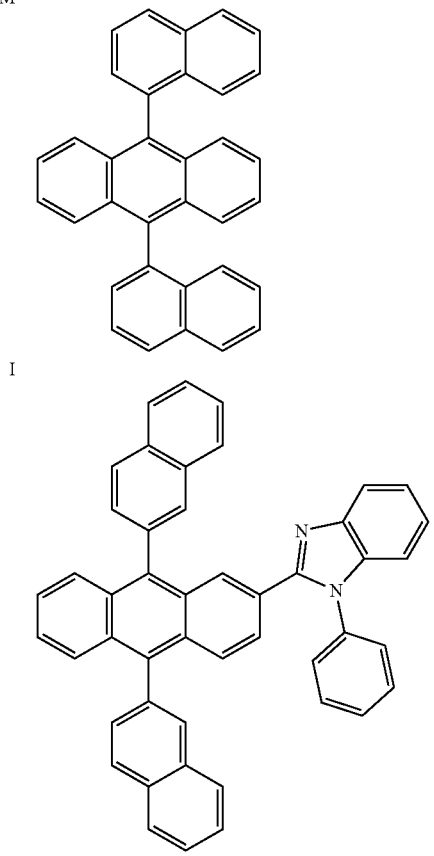

H

J

In the above-mentioned process, the vapor deposition rate of the organic material was maintained at 0.4 to 0.7 Å/sec, the deposition rate of LiF was maintained at 0.3 Å/sec, the deposition rate of aluminum was maintained at 2 Å/sec, and the degree of vacuum during the deposition was maintained at $2 \times 10^{-7}$ to $5 \times 10^{-8}$ torr.

Experimental Examples 2-2 to 2-6

The organic light emitting device was manufactured in the same manner as in Experimental Example 2-1, except that the copolymers shown in Table 2 below were used instead of Copolymer C1.

Comparative Experimental Example 2

The organic light emitting device was manufactured in the same manner as in Experimental Example 2-1, except that Copolymer F was used instead of Copolymer C1.

The driving voltage, external quantum efficiency (EQE), luminance and lifetime were measured at a current density of 10 mA/cm² for the organic light emitting devices manufactured in Experimental Examples and Comparative Experimental Example above, and the results are shown in Table 2 below. The external quantum efficiency was calculated by (number of emitted photons)/(number of injected charge carriers). T80 means the time required for the luminance to be reduced to 80% of the initial luminance (500 nit).

TABLE 2

| | Hole transport layer | Driving voltage (V) | J (mA/cm²) | EQE (%) | Lifetime (hr) (T80 @ 500 nit) |
|---|---|---|---|---|---|
| Experimental Example 2-1 | Copolymer C1 | 4.45 | 10 | 5.7 | 135 |
| Experimental Example 2-2 | Copolymer C2 | 4.33 | 10 | 5.9 | 99 |
| Experimental Example 2-3 | Copolymer C3 | 4.51 | 10 | 6.4 | 105 |
| Experimental Example 2-4 | Copolymer C4 | 4.31 | 10 | 5.3 | 115 |
| Experimental Example 2-5 | Copolymer C5 | 4.49 | 10 | 5.6 | 87 |
| Experimental Example 2-6 | Copolymer C6 | 4.95 | 10 | 5.3 | 91 |
| Comparative Experimental Example 2 | Copolymer F | 6.13 | 10 | 3.9 | 52 |

As shown in Table 2, it was confirmed that the copolymer according to the present invention contains the Chemical Formula 1 and the Chemical Formula 3 and thereby exhibits improved efficiency and lifetime compared with the copolymer not containing these formulas. In addition, the copolymer according to the present invention is excellent in solubility in an organic solvent and is easy to prepare a coating composition. From the result of Table 2 above, it was confirmed that a uniform coating layer can be formed using the coating composition, and the stability of the film is also excellent, and the organic light emitting device exhibits more excellent performance.

The invention claimed is:

1. A polymer including a repeating unit represented by the following Chemical Formula 1, a repeating unit represented by the following Chemical Formula 2, and a repeating unit represented by the following Chemical Formula 3:

[Chemical Formula 1]

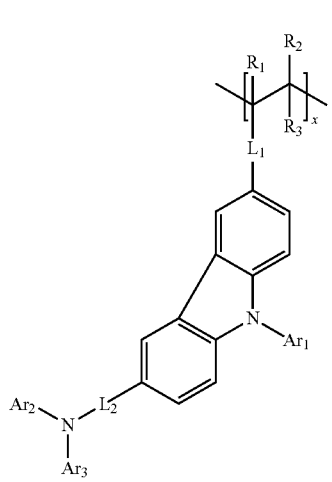

in Chemical Formula 1, $R_1$ to $R_3$ are each independently hydrogen, or a $C_{1-10}$ alkyl, $L_1$ is a substituted or unsubstituted $C_{6-60}$ arylene; or a substituted or unsubstituted $C_{2-60}$ heteroarylene containing one or more selected from the group consisting of N, O and S, $L_2$ is a single bond; a substituted or unsubstituted $C_{6-60}$ arylene; or a substituted or unsubstituted $C_{2-60}$ heteroarylene containing one or more selected from the group consisting of N, O and S, $Ar_1$ is a substituted or unsubstituted $C_{6-60}$ aryl, or a substituted or unsubstituted $C_{2-60}$ heteroaryl containing one or more selected from the group consisting of N, O and S, $Ar_2$ and $Ar_3$ are each independently a substituted or unsubstituted $C_{1-60}$ alkoxy, a substituted or unsubstituted $C_{6-60}$ aryl, or a substituted or unsubstituted $C_{2-60}$ heteroaryl containing one or more selected from the group consisting of N, O and S, and x is a molar ratio of the repeating unit of Chemical Formula 1,

[Chemical Formula 2]

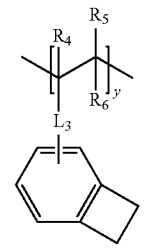

in Chemical Formula 2, $R_4$ to $R_6$ are each independently hydrogen, or a $C_{1-10}$ alkyl, $L_3$ is a single bond; a substituted or unsubstituted $C_{6-60}$ arylene; (substituted or unsubstituted $C_{6-60}$ arylene)—O—; (substituted or unsubstituted $C_{6-60}$ arylene)-O—(substituted or unsubstituted $C_{1-60}$ alkylene); or a substituted or unsubstituted $C_{2-60}$ heteroarylene containing one or more selected from the group consisting of N, O and S, and y is a molar ratio of the repeating unit of Chemical Formula 2,

[Chemical Formula 3]

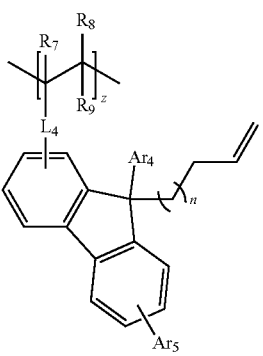

in Chemical Formula 3, $R_7$ to $R_9$ are each independently hydrogen, or a $C_{1-10}$ alkyl, $L_4$ is a single bond; a substituted or unsubstituted $C_{6-60}$ arylene; or a substituted or unsubstituted $C_{2-60}$ heteroarylene containing one or more selected from the group consisting of N, O and S, $Ar_4$ is a substituted or unsubstituted $C_{3-60}$ cycloalkyl, a substituted or unsubstituted $C_{6-60}$ aryl, or a substituted or unsubstituted $C_{2-60}$ heteroaryl containing one or more selected from the group consisting of N, O and S, $Ar_5$ is hydrogen, or a substituted or unsubstituted $C_{6-60}$ aryl, and z is a molar ratio of the repeating unit of Chemical Formula 3, n is an integer of 0 to 5.

2. The polymer according to claim 1, wherein x:y:z is 0.5~0.9:0.05~0.45:0.05~0.45.

3. The polymer according to claim 1, wherein $L_1$ is phenylene, or biphenylylene.

4. The polymer according to claim 1, wherein $L_2$ is a single bond, phenylene, biphenylylene, or terphenylylene.

5. The polymer according to claim 1, wherein
Ar$_1$ is phenyl, biphenylyl, dimethylfluorenyl, or diphenylfluorenyl, unsubstituted or substituted with methyl, ethyl, propyl, isopropyl, butyl, isobutyl, tertbutyl, methoxy, ethoxy, propoxy, butoxy, isobutoxy, or neobutoxy.

6. The polymer according to claim 1, wherein
Ar$_2$ and Ar$_3$ are each independently phenyl, biphenylyl, dimethylfluorenyl, or diphenylfluorenyl.

7. The polymer according to claim 1, wherein
the Chemical Formula 1 is selected from the group consisting of repeating units represented by the following:

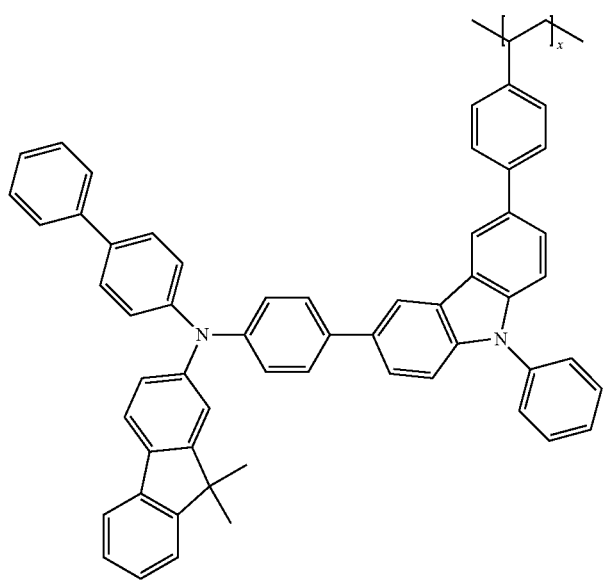

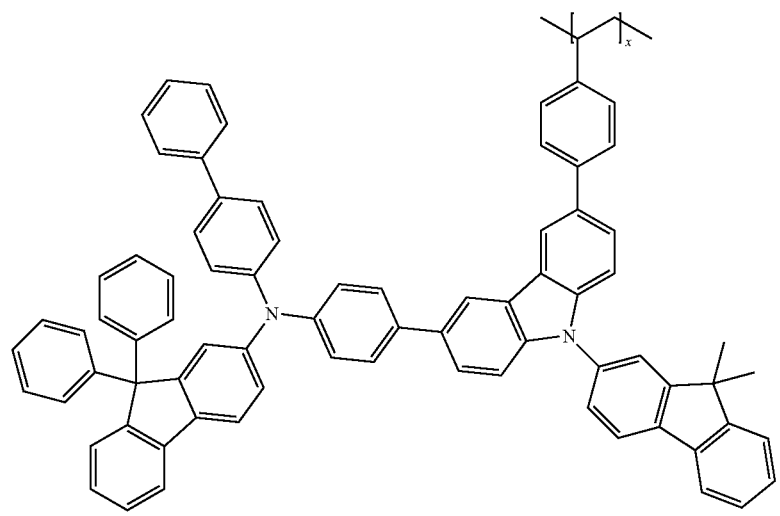

-continued
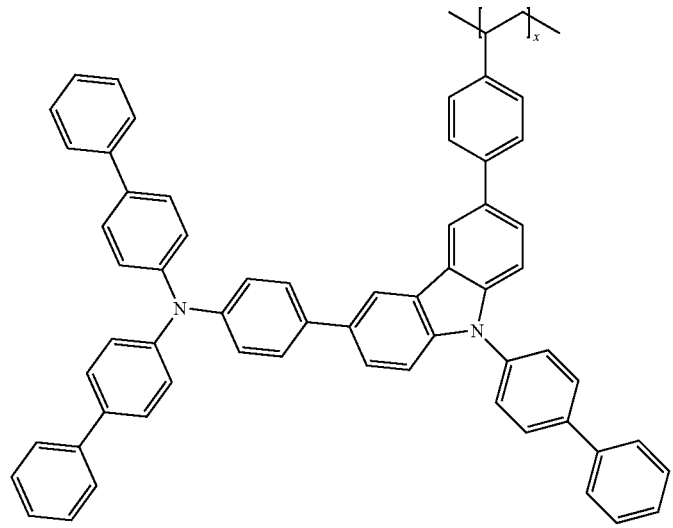
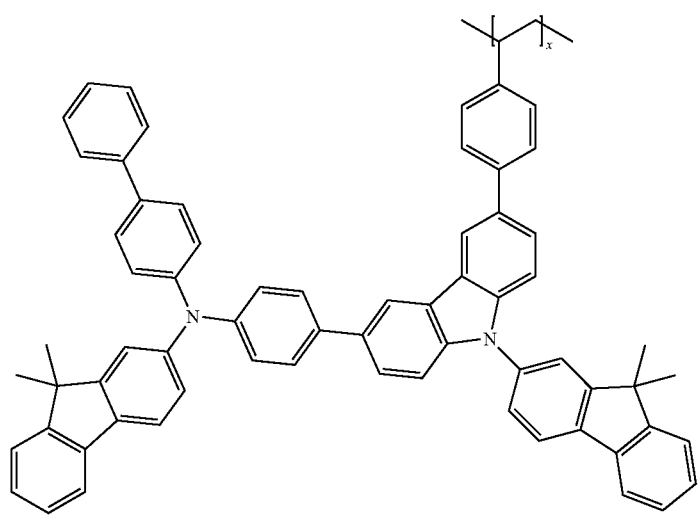
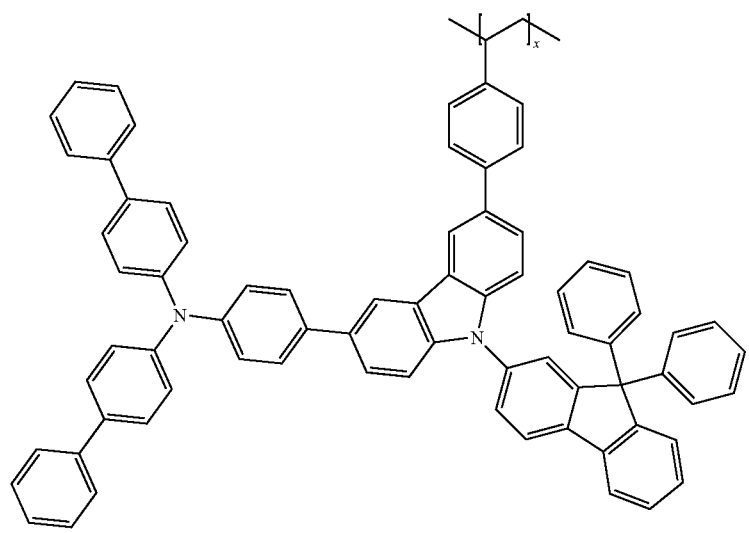

-continued
121
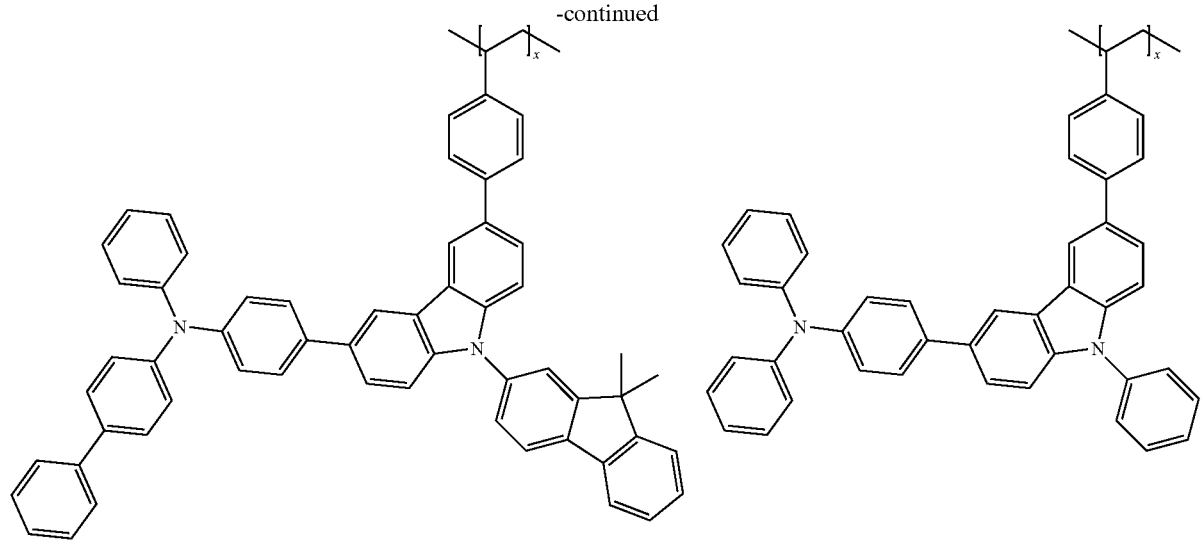
122
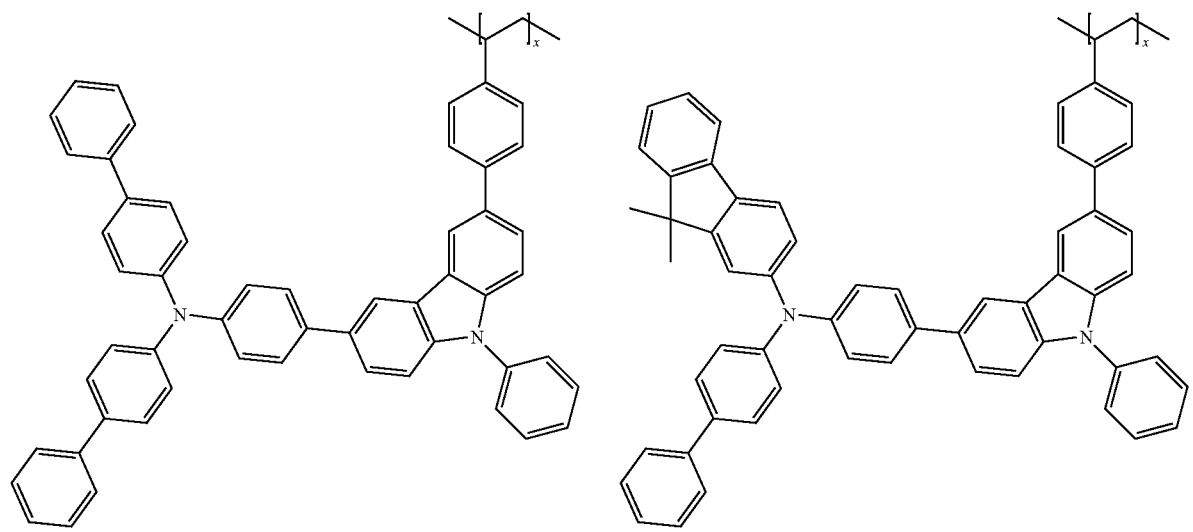
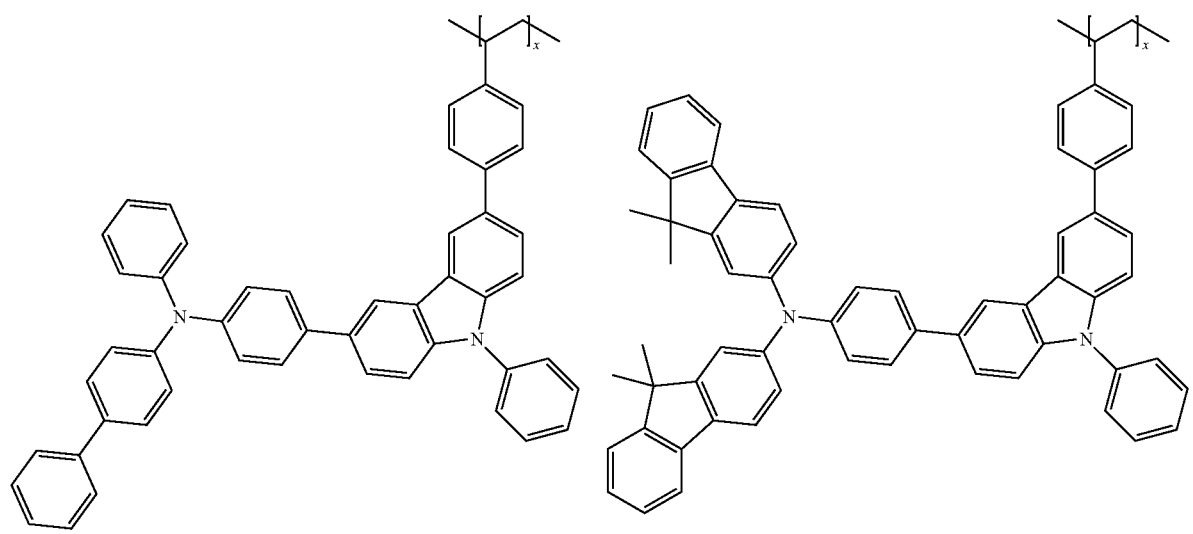

-continued
123
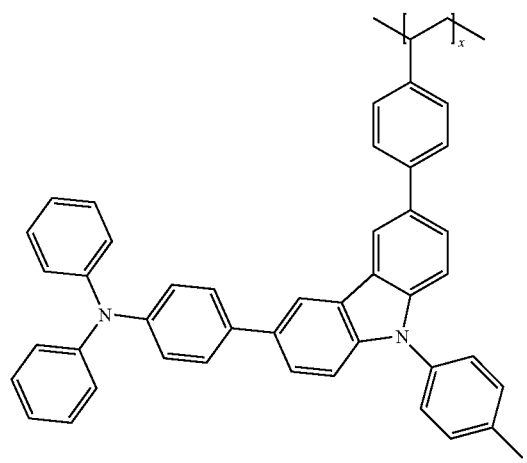
124
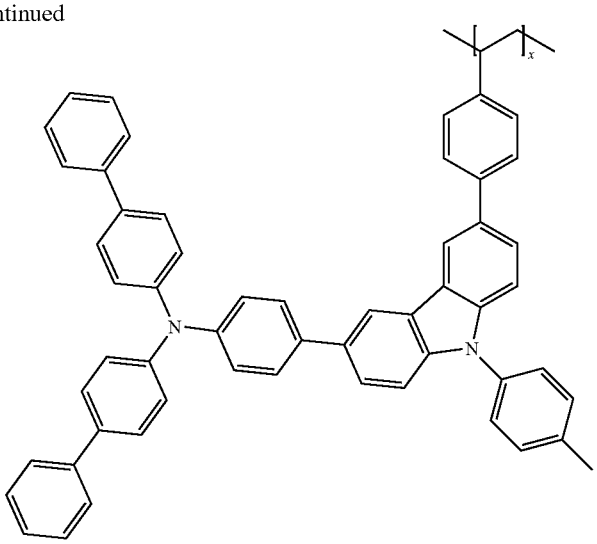
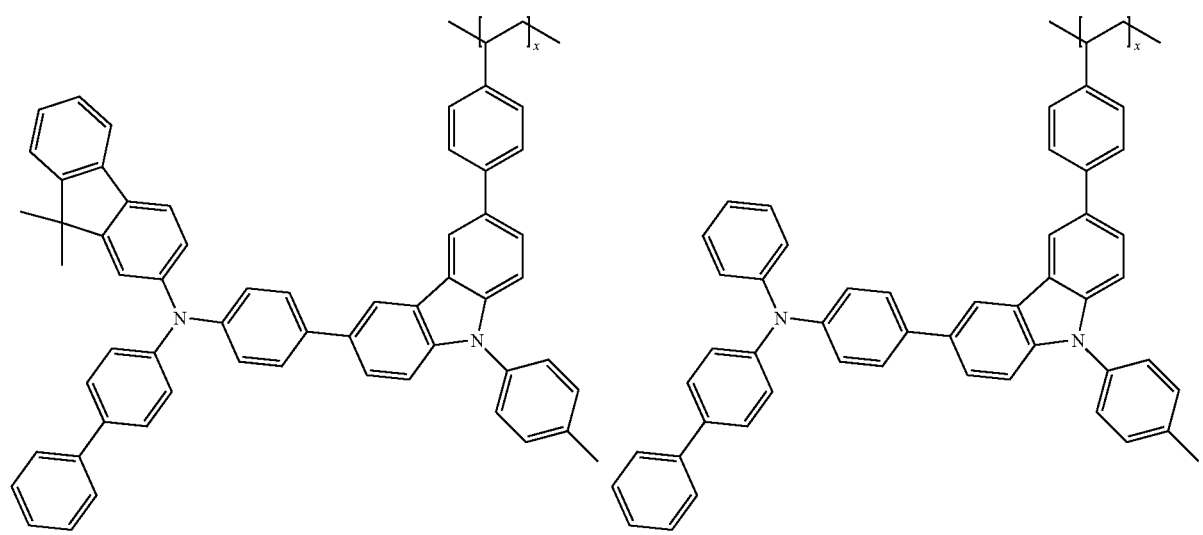
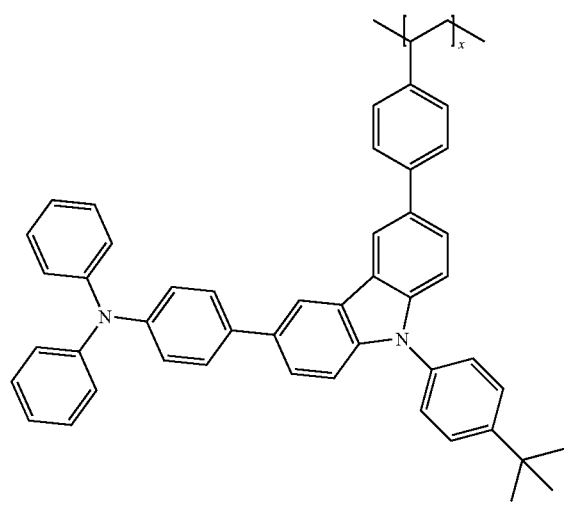

-continued
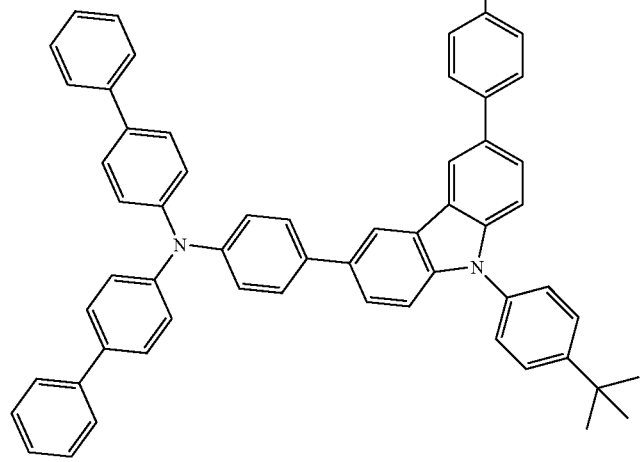
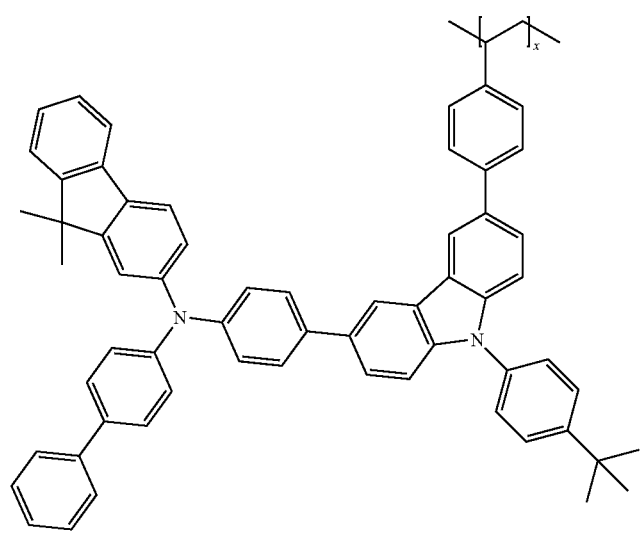
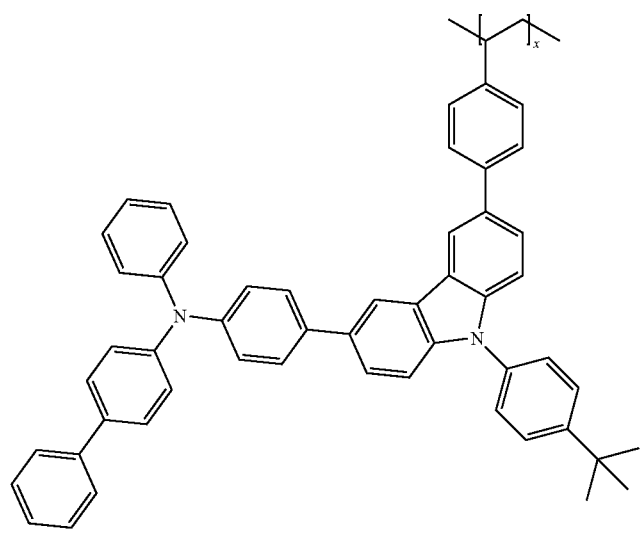

-continued
127
128
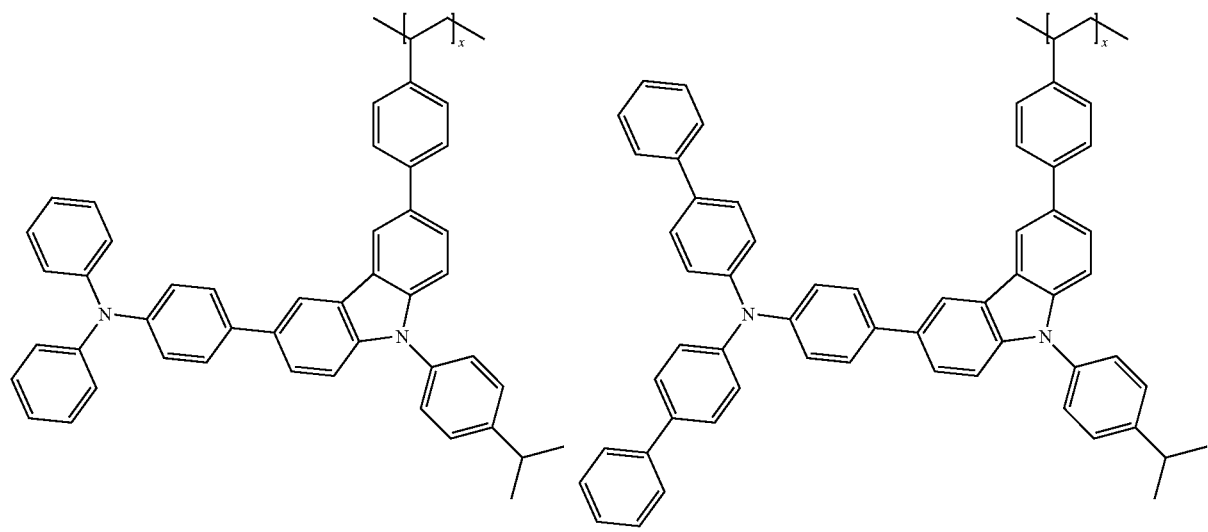
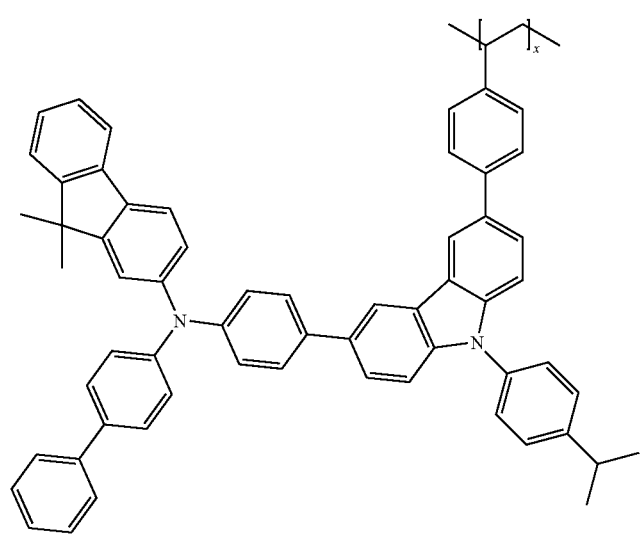
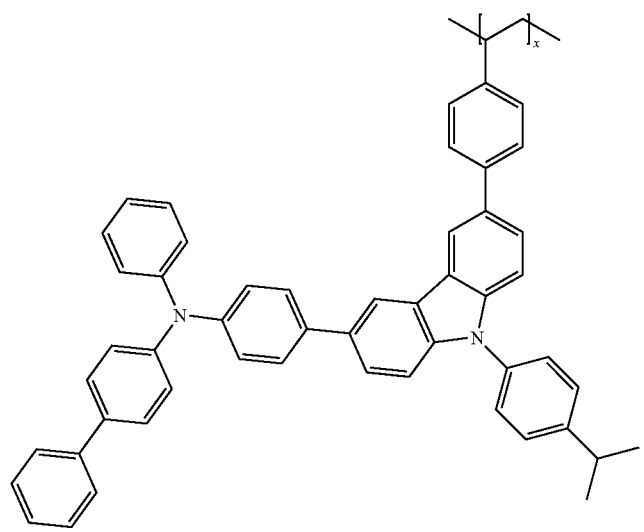

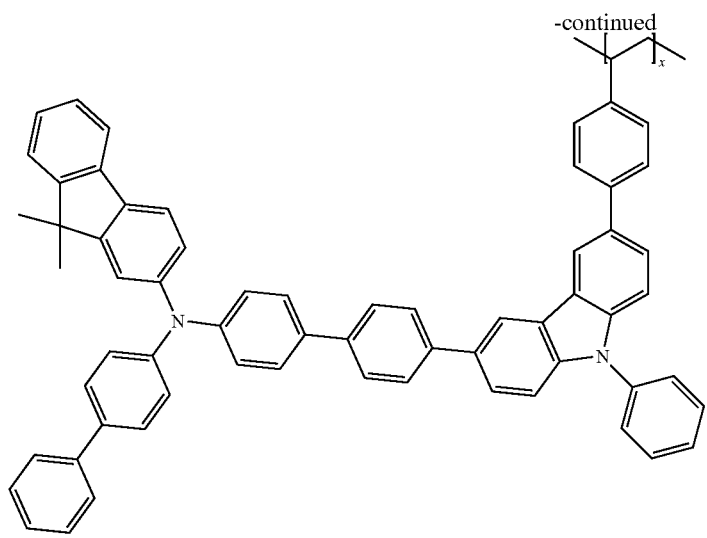
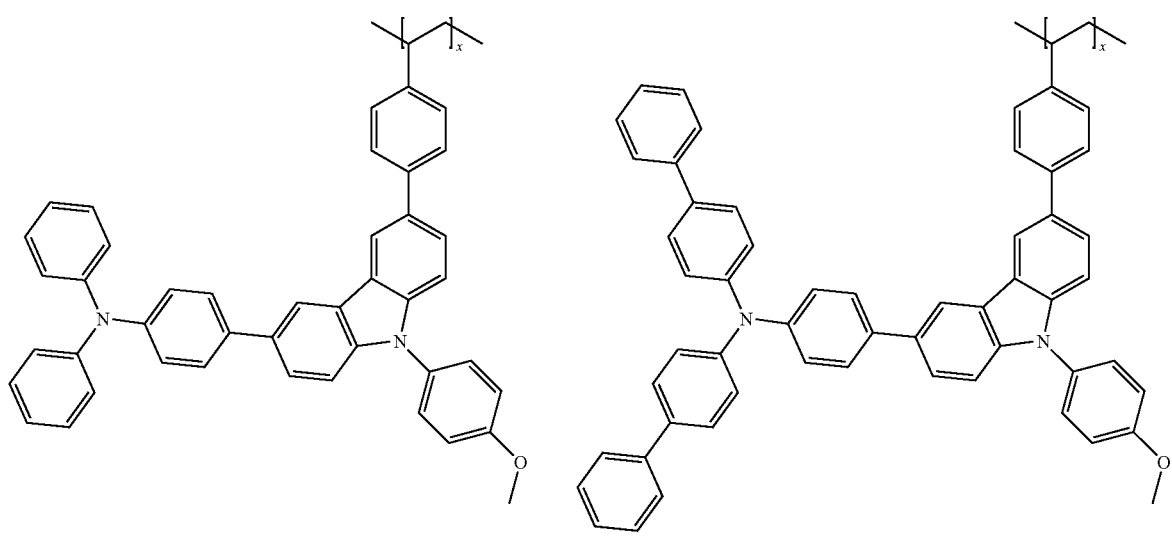
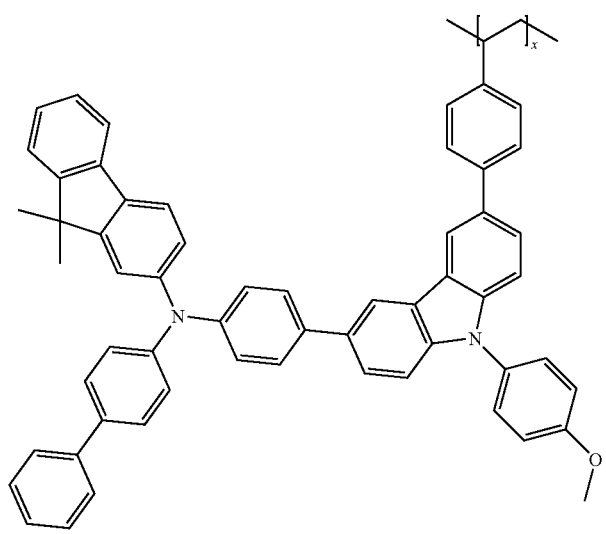

-continued
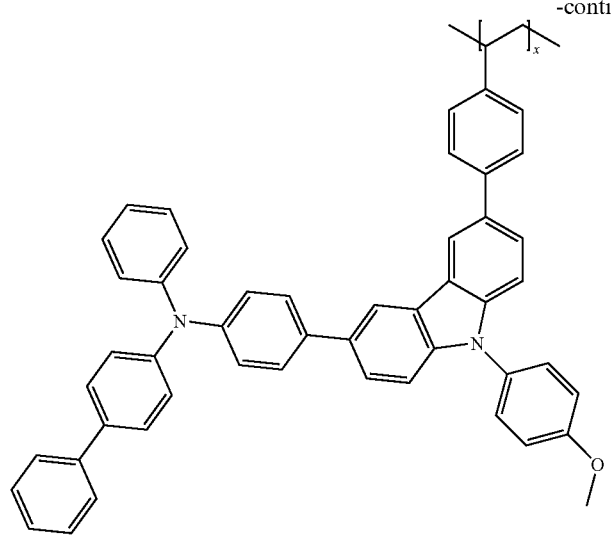
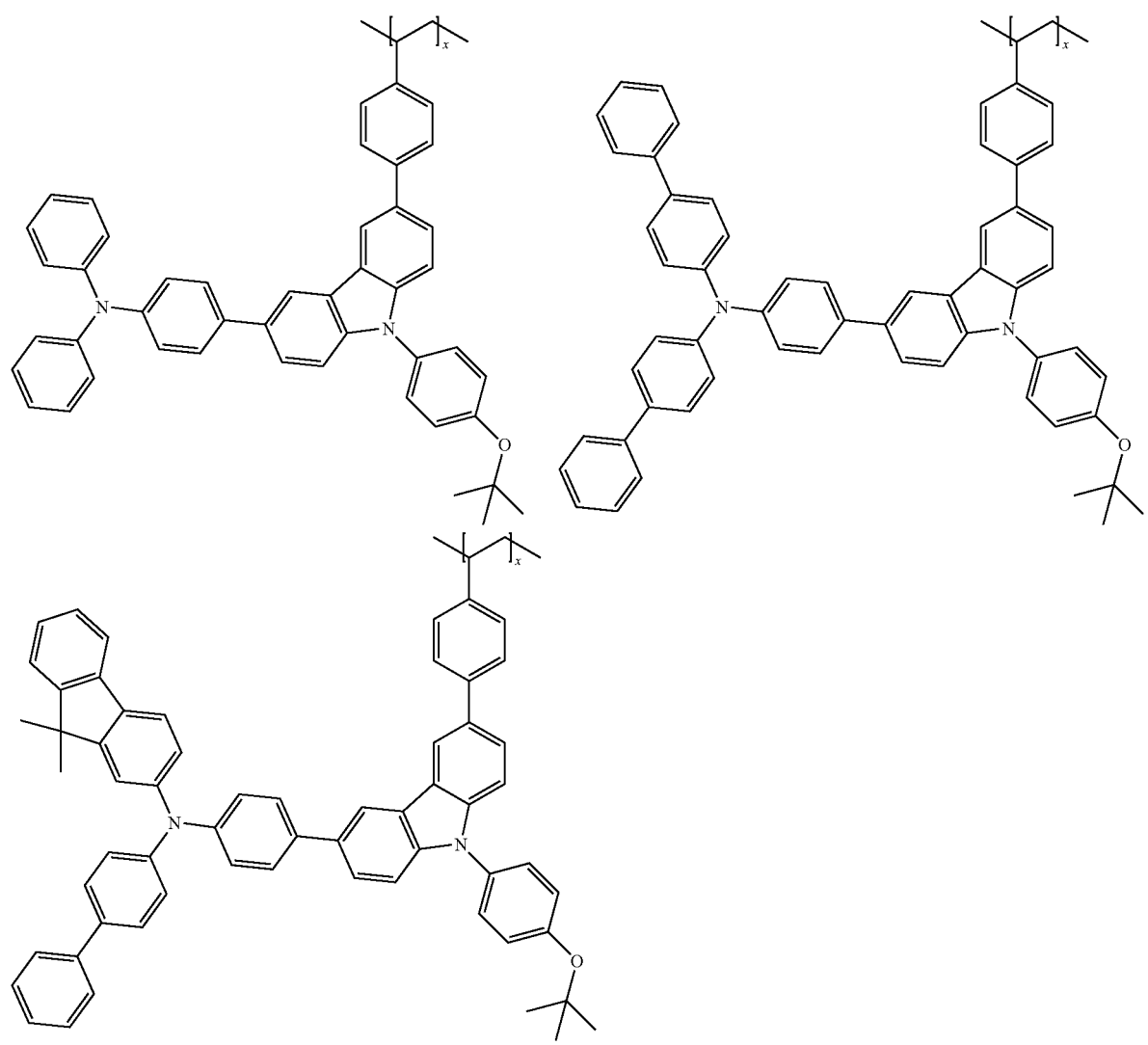

133
134
-continued
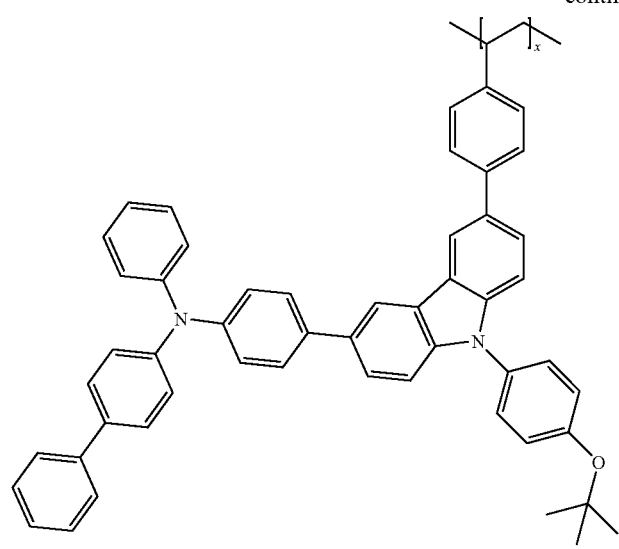
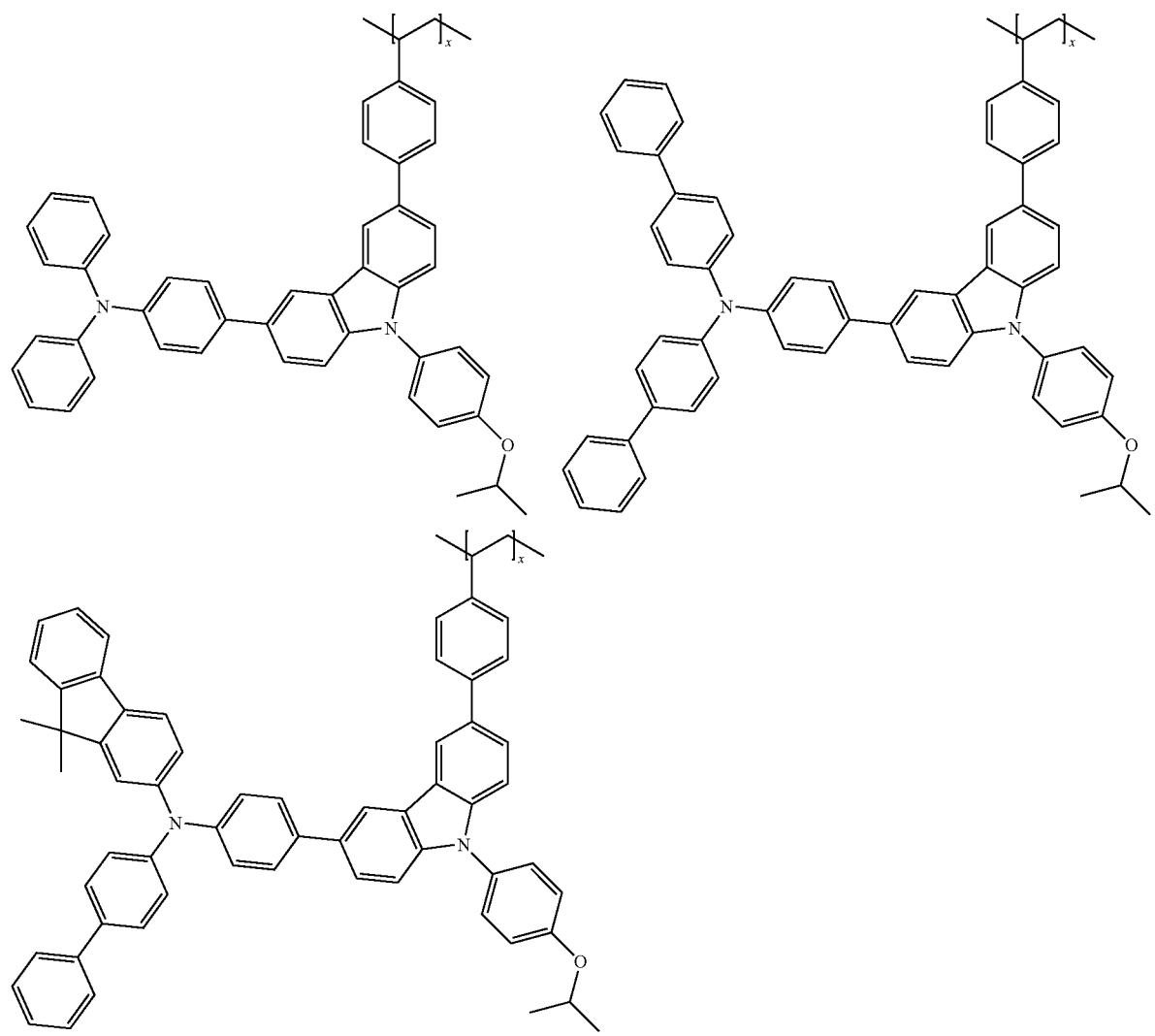

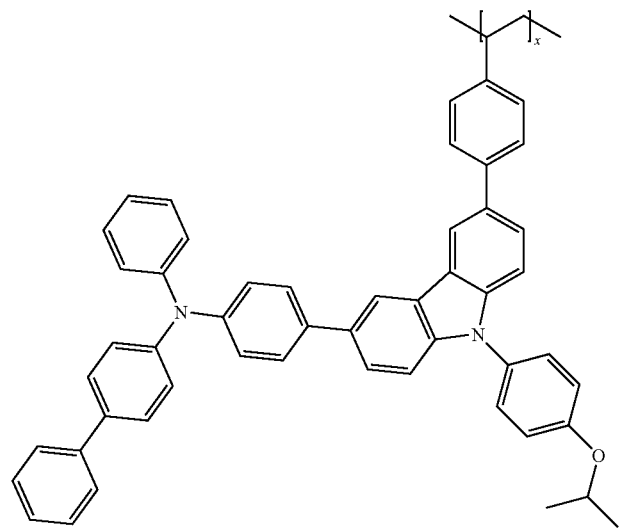
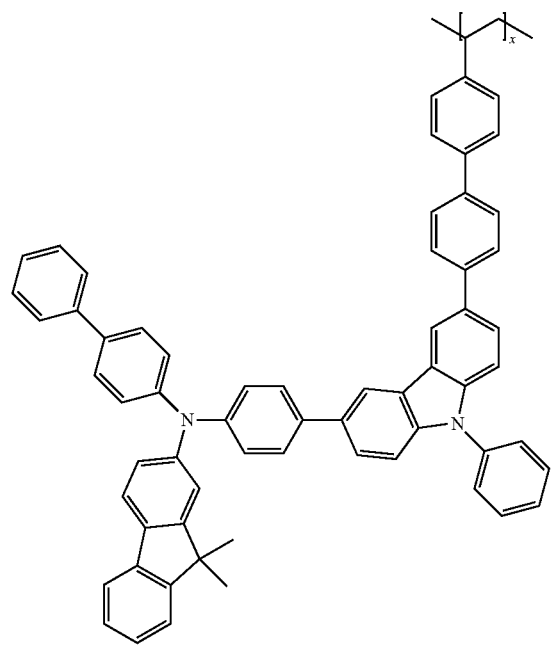

-continued
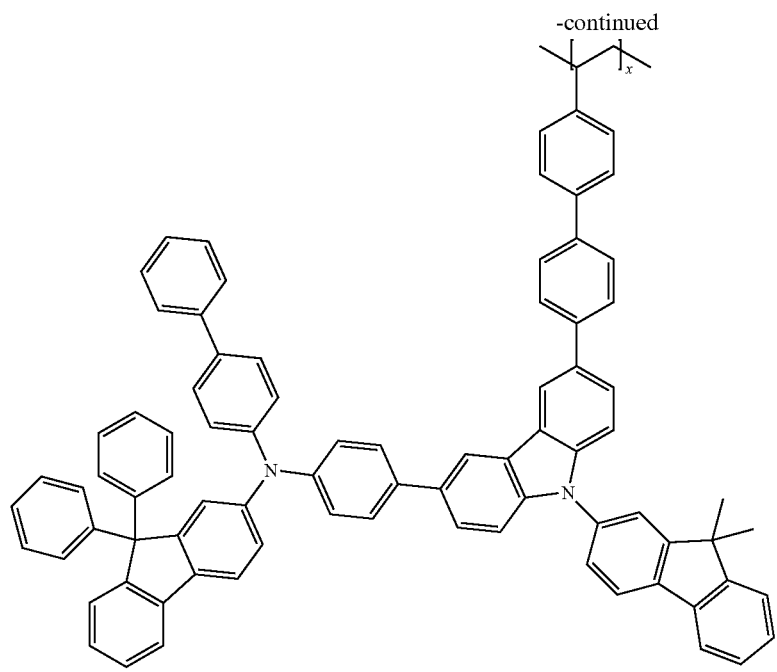
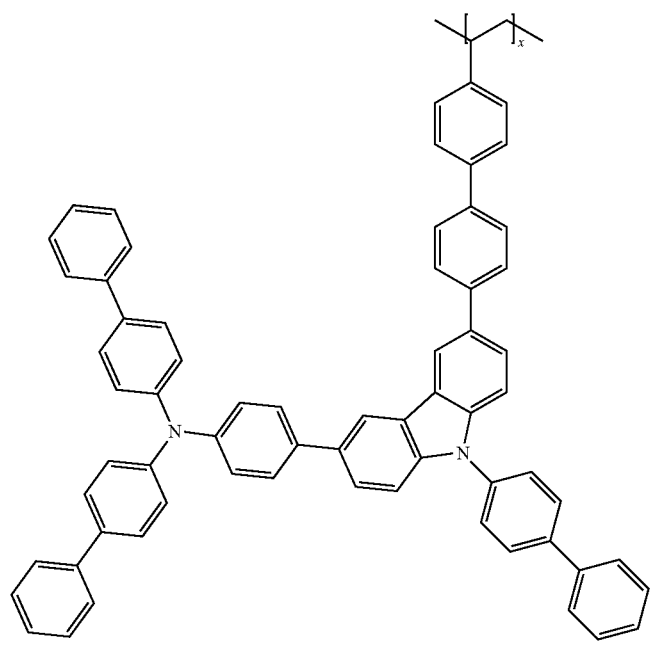

-continued
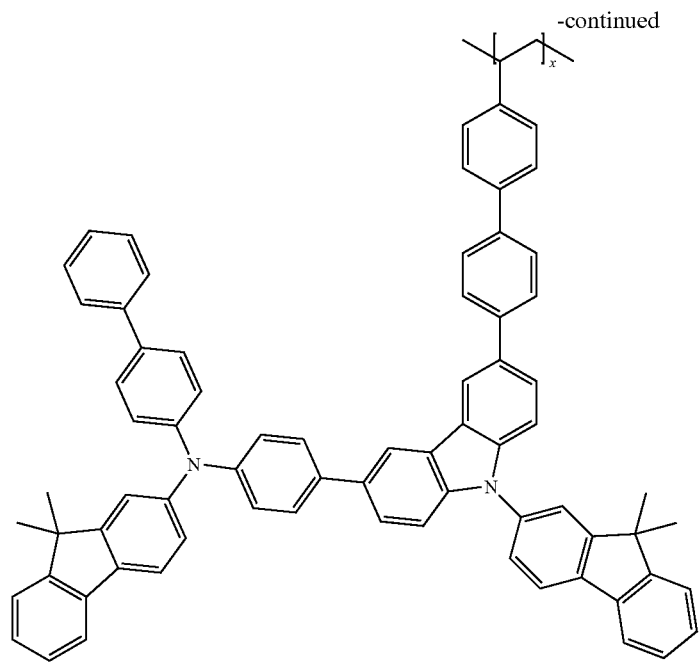
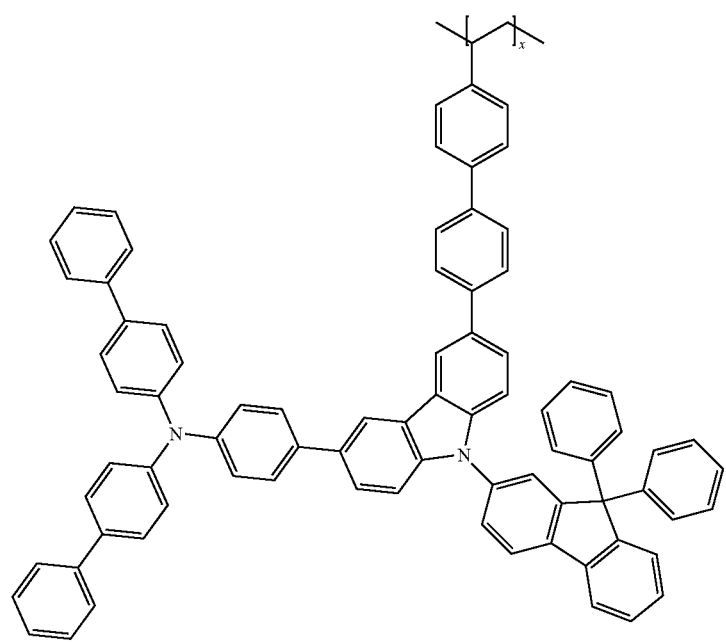

-continued
141
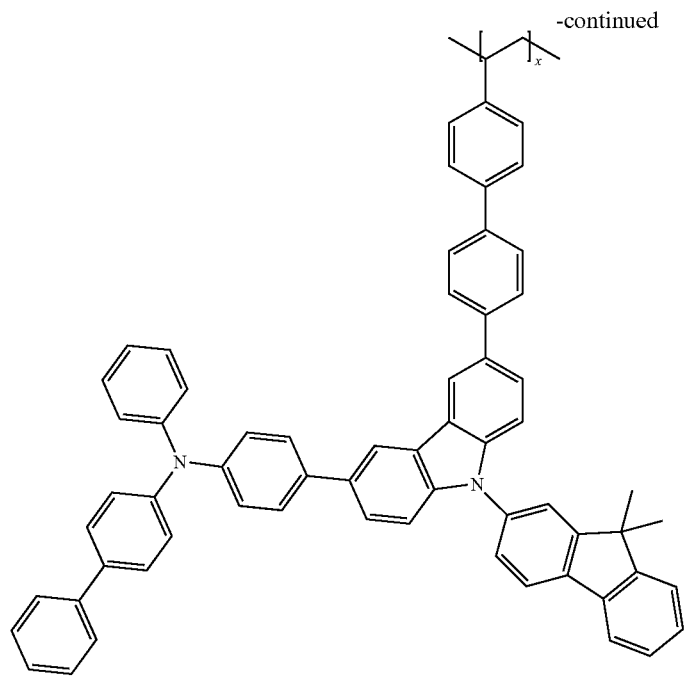
142
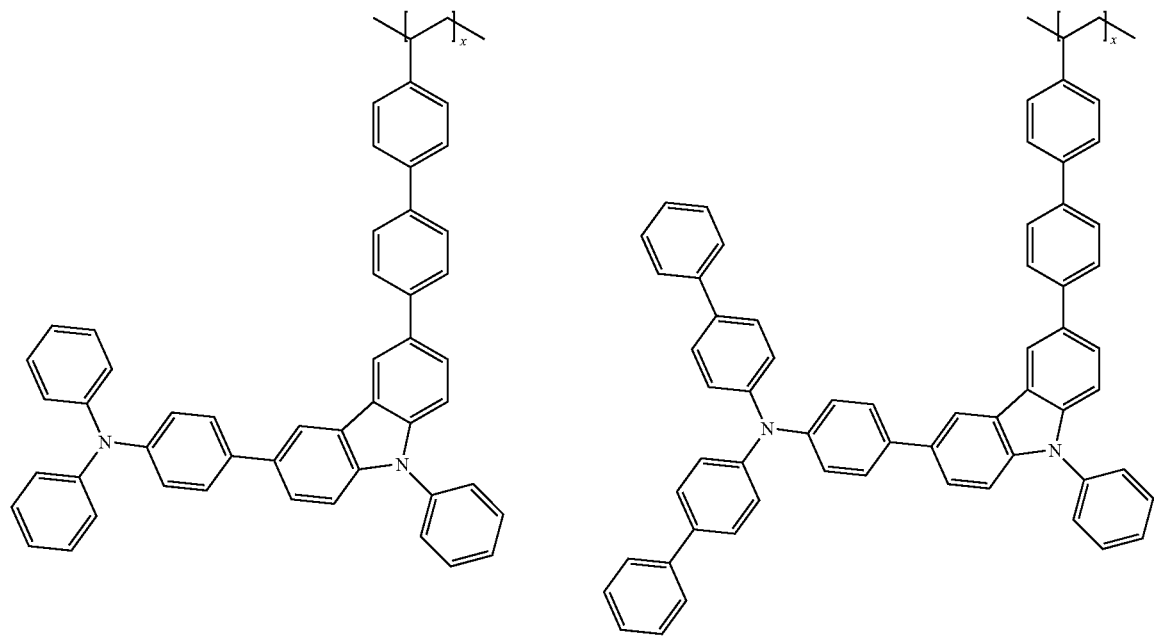

143 144
-continued
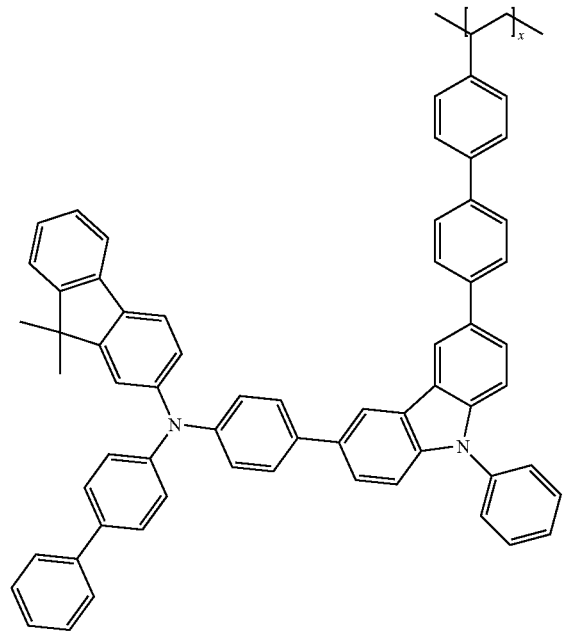
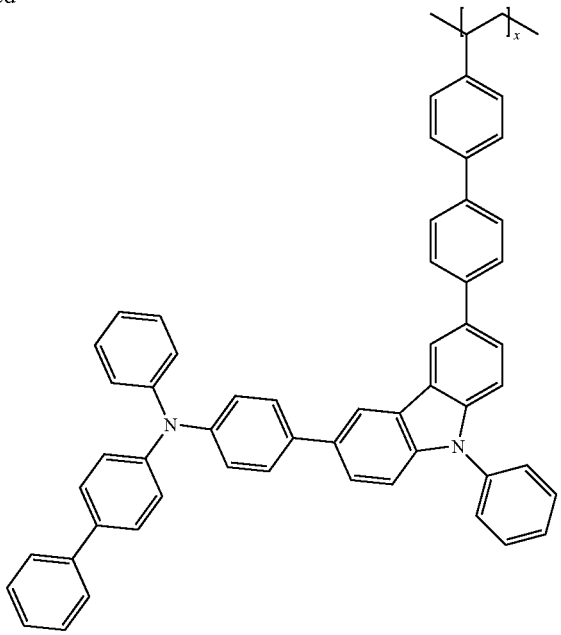
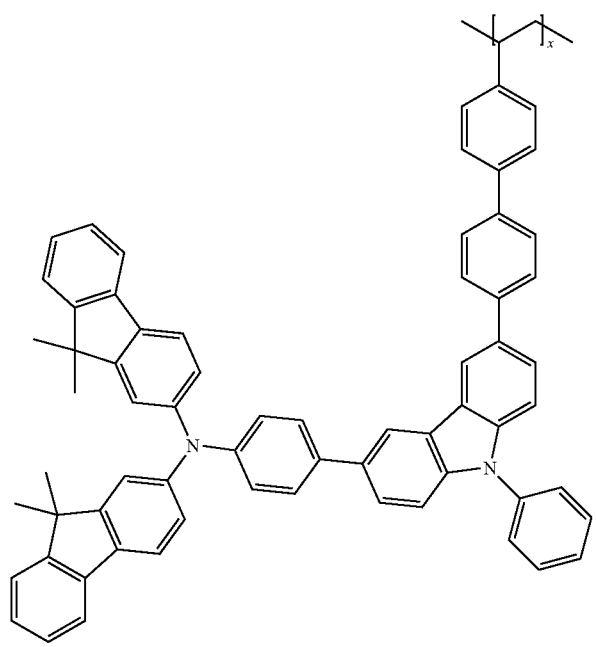

-continued
145
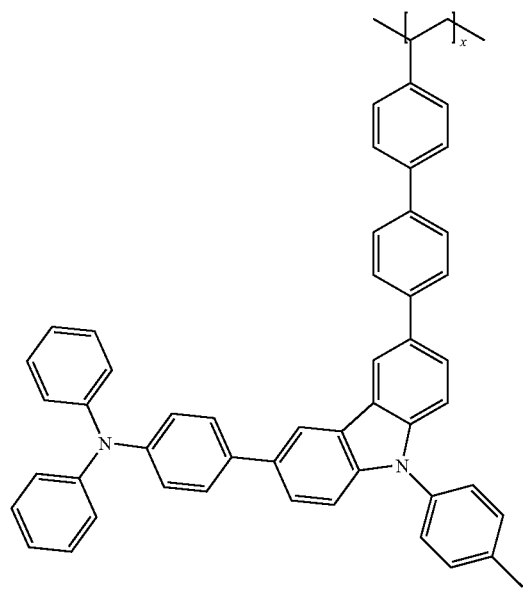
146
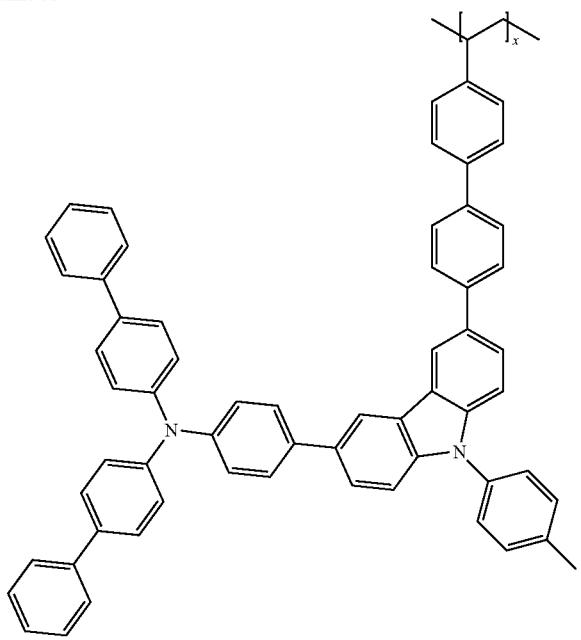
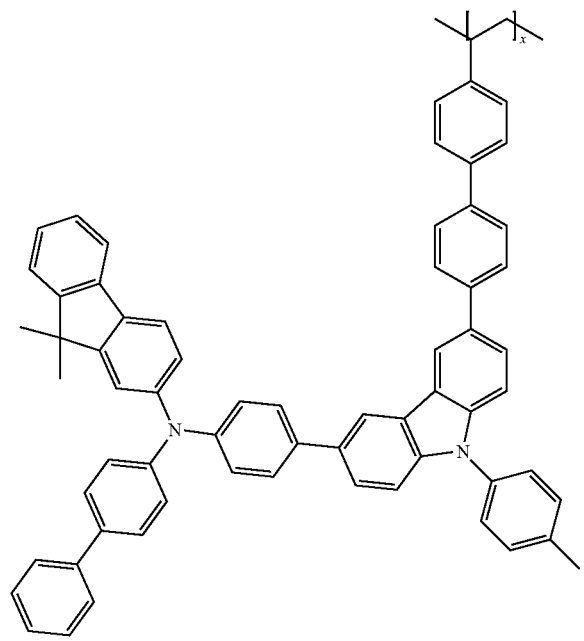
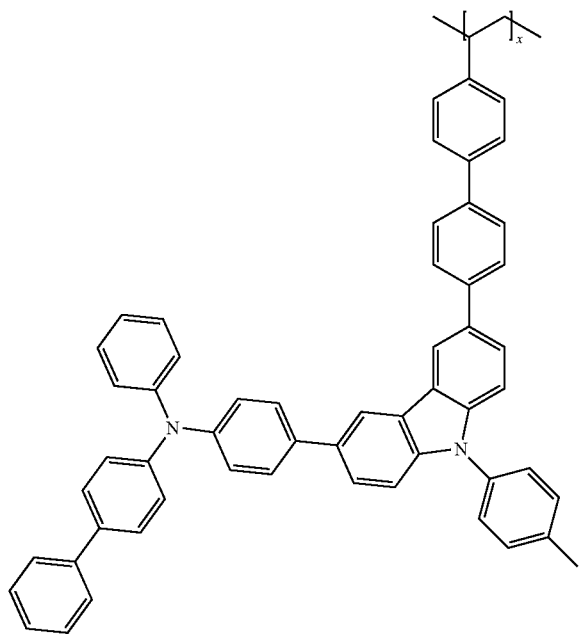

-continued
147 148
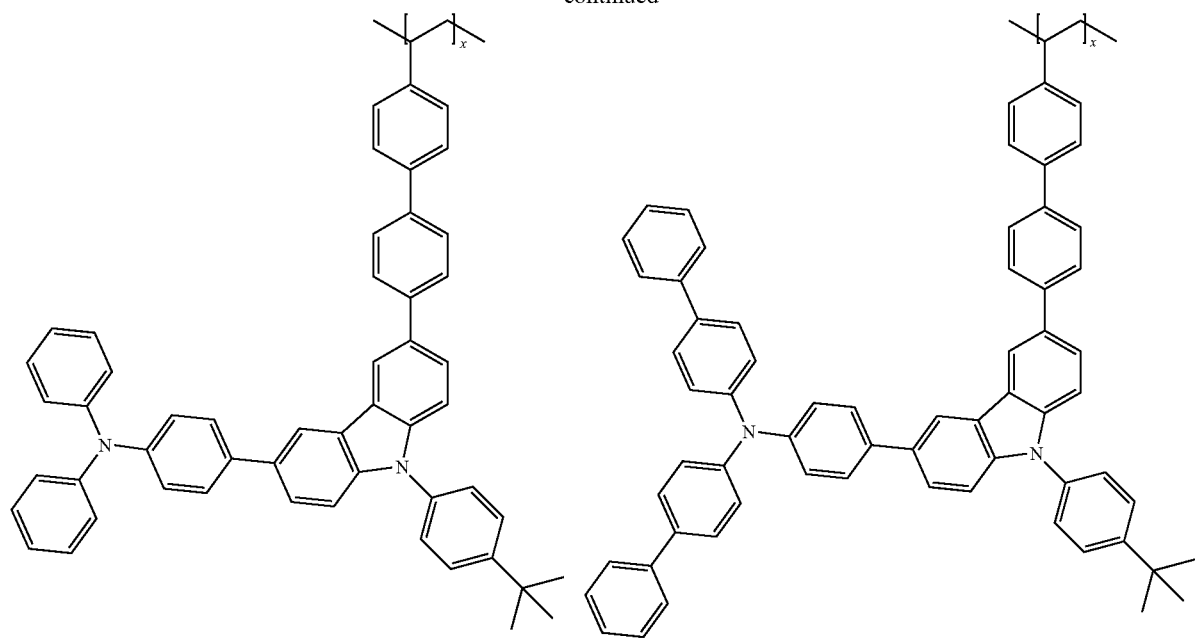
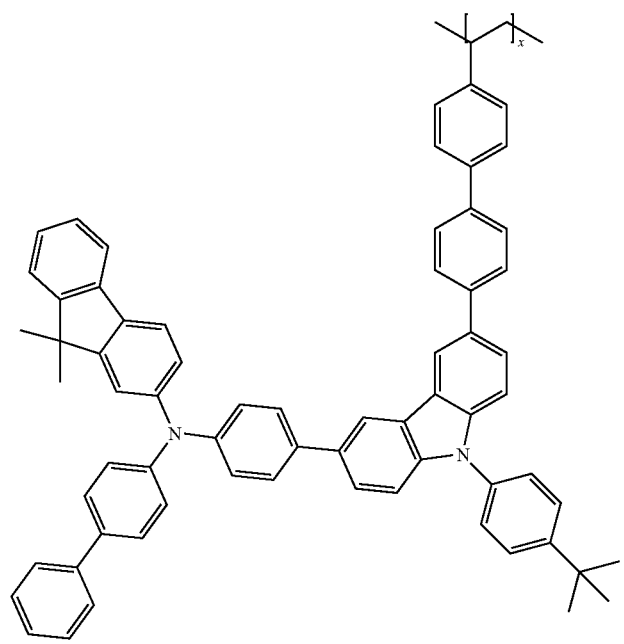

-continued
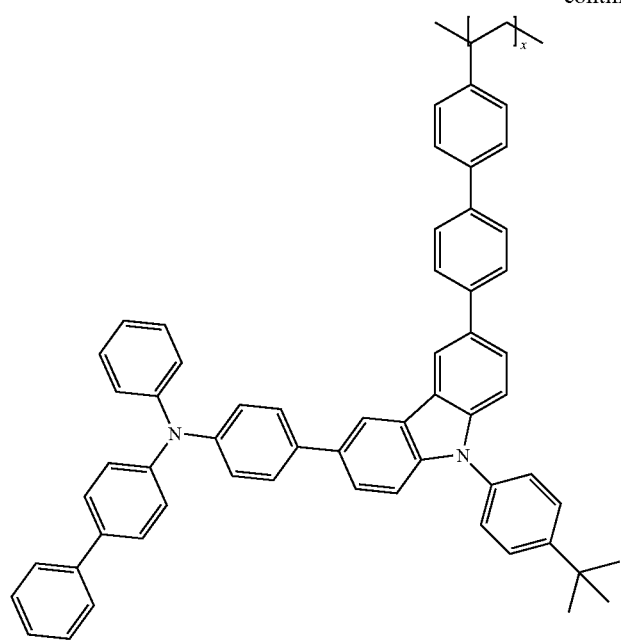
149
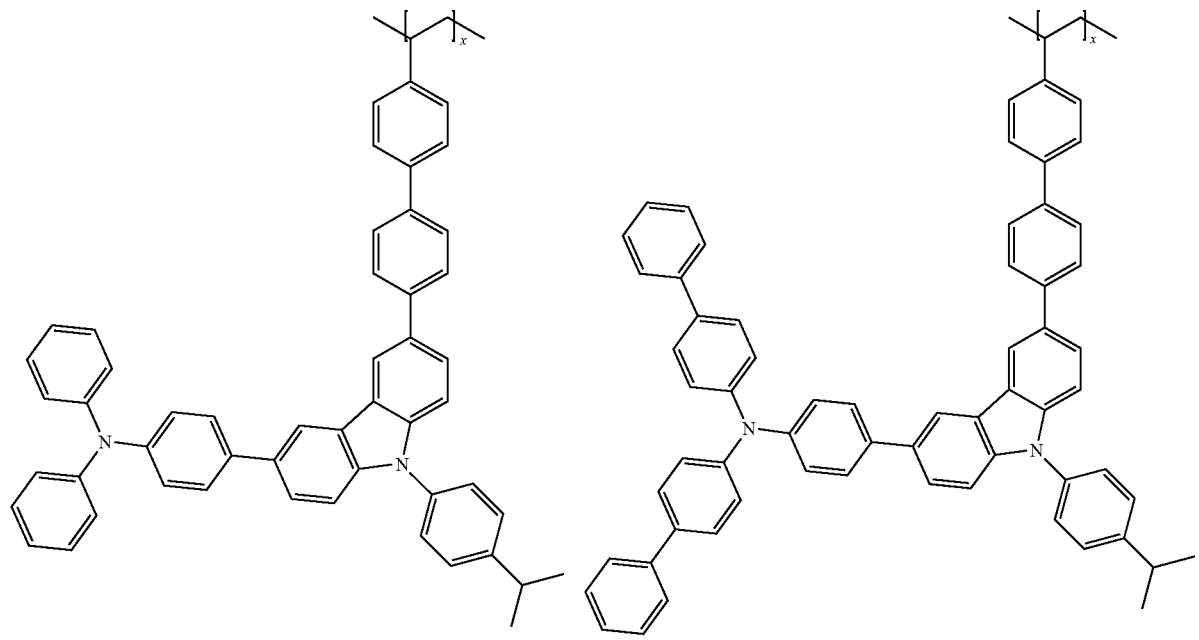
150

-continued
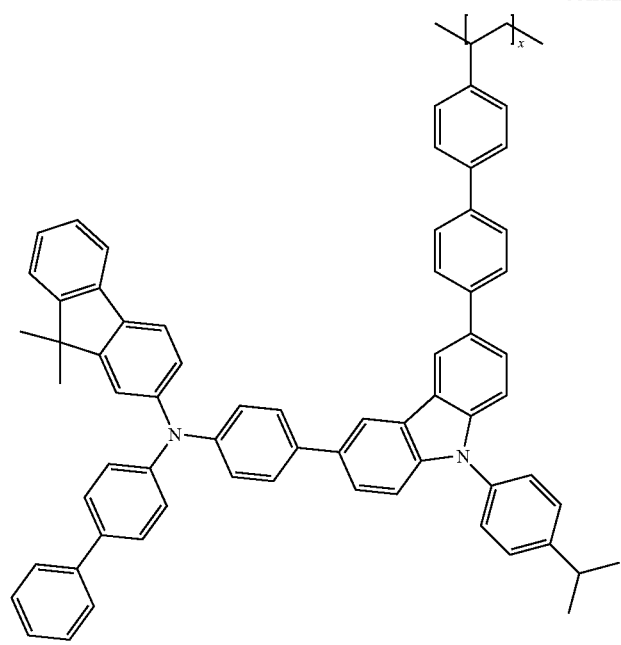
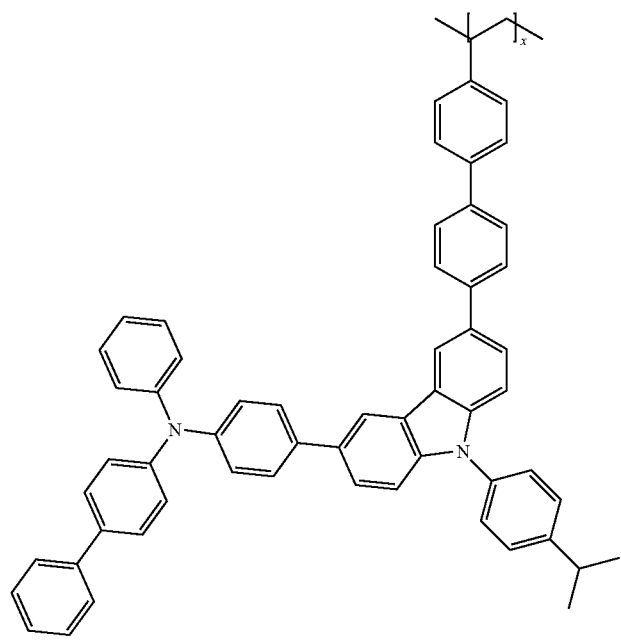

153
154
-continued
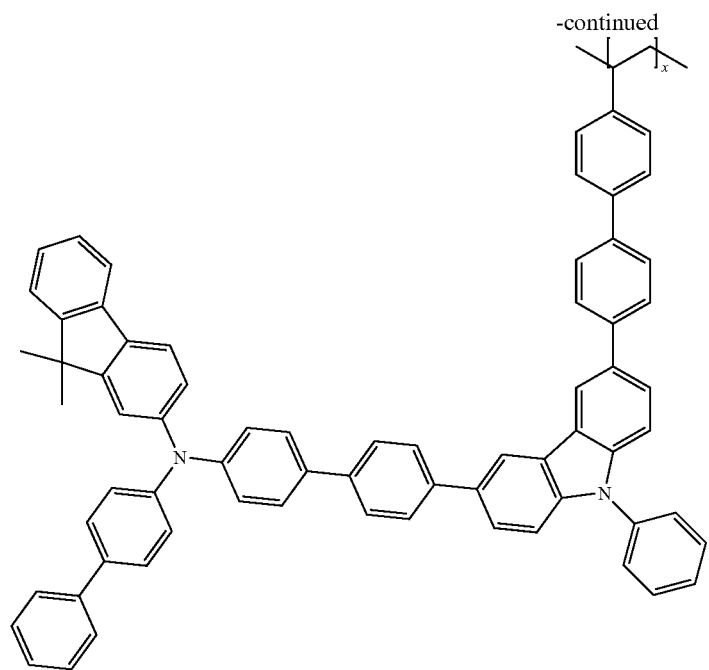
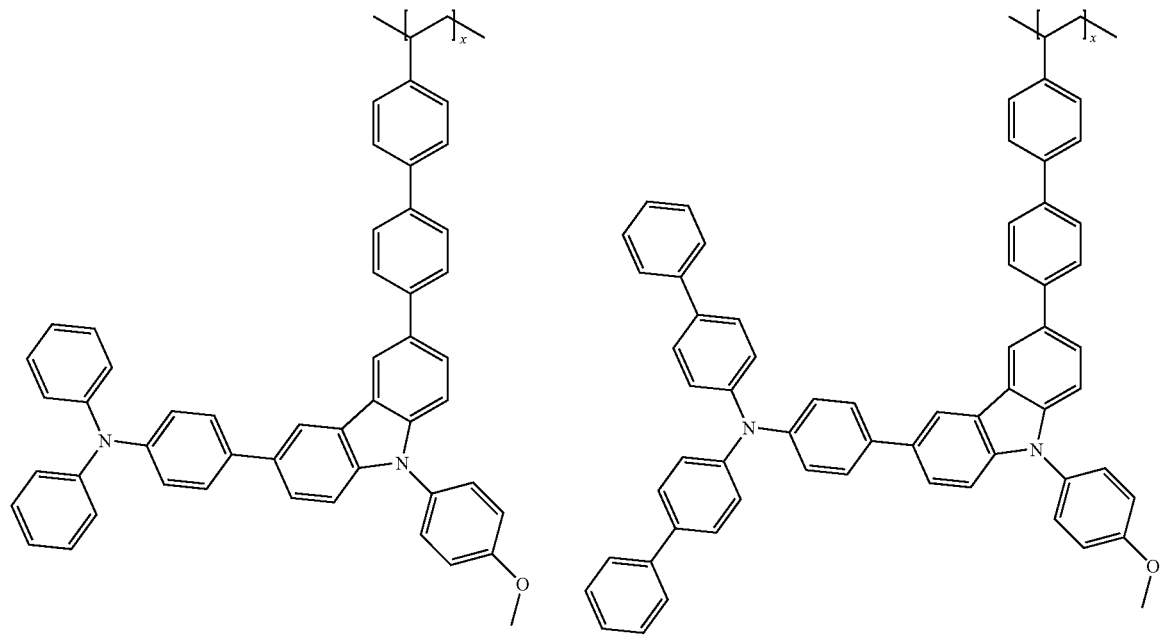

-continued
155
156
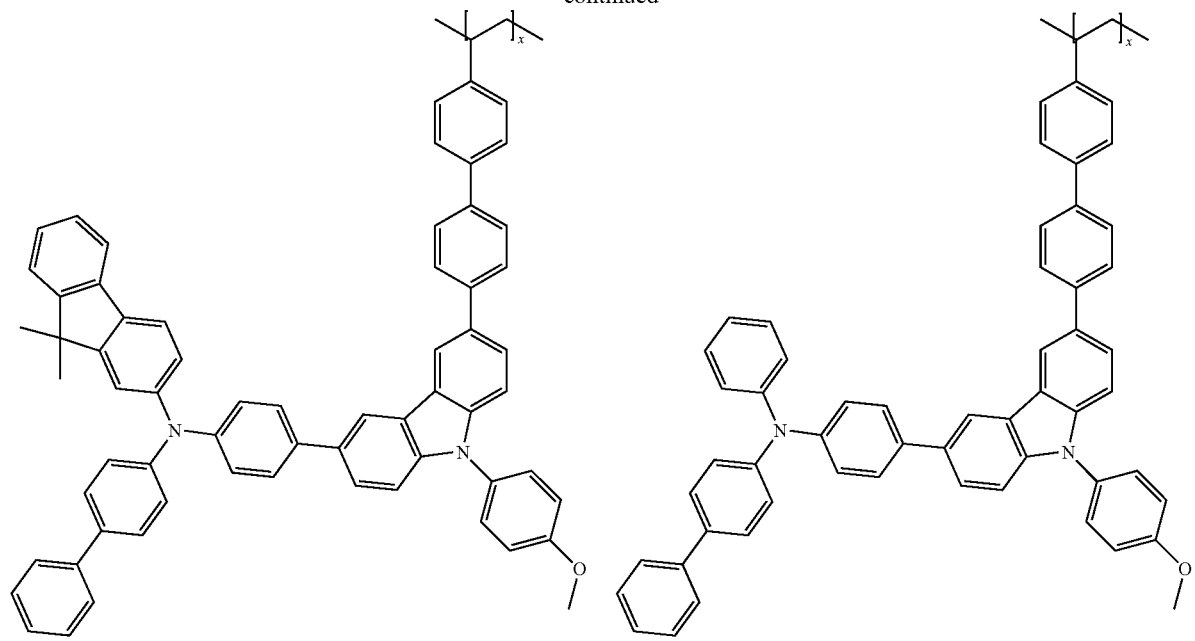
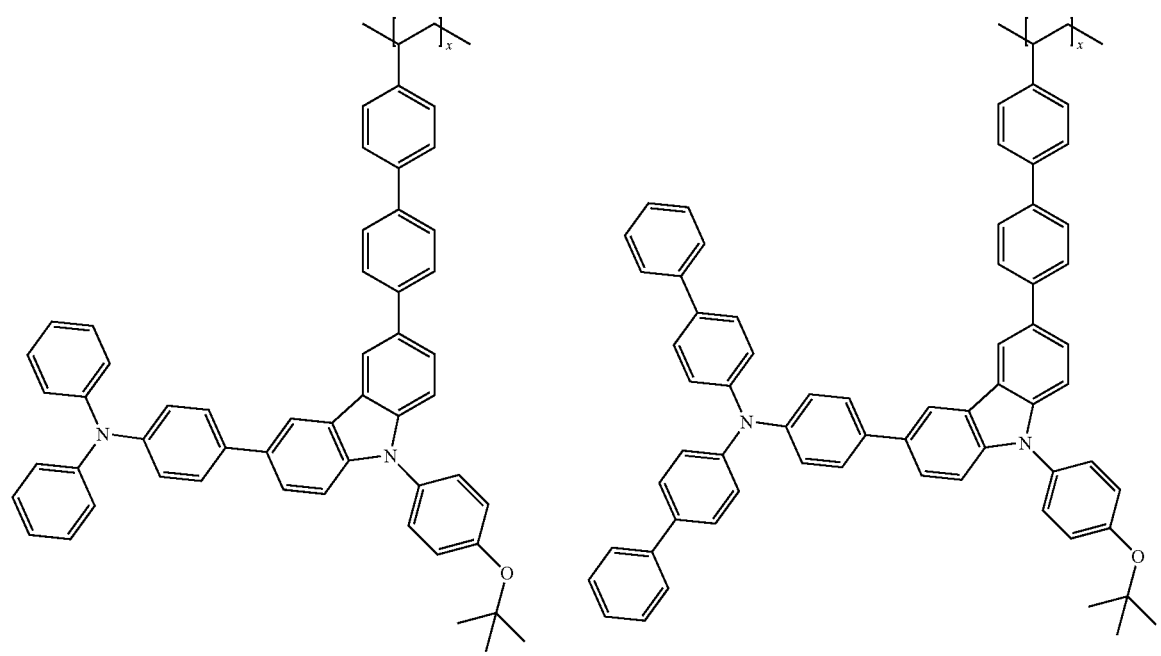

157 158
-continued
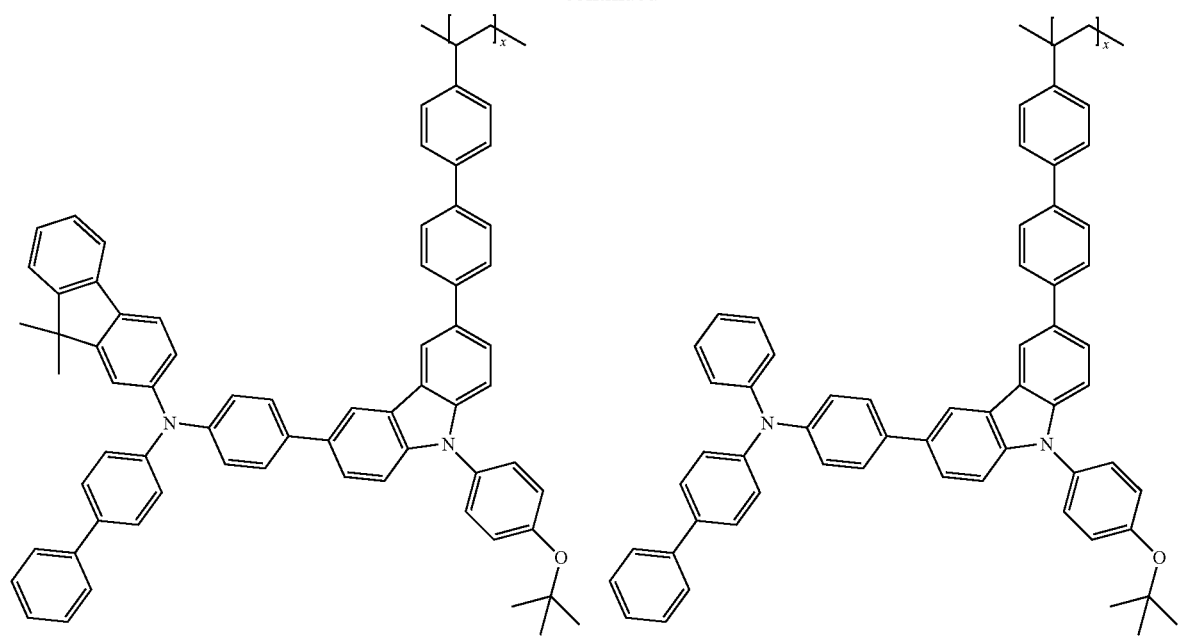
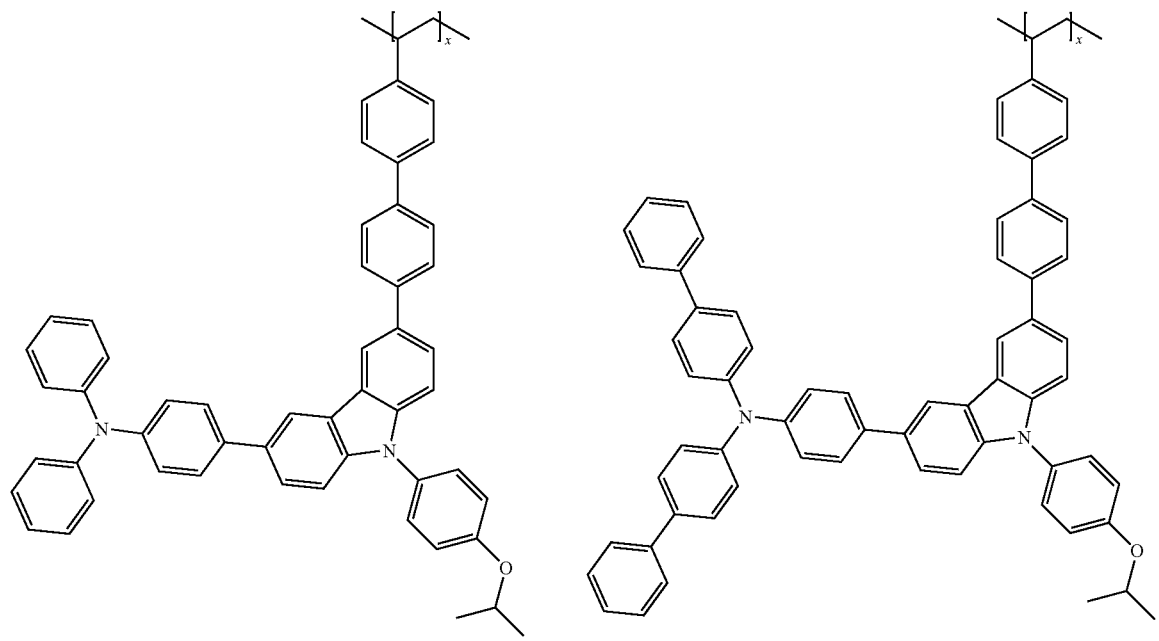

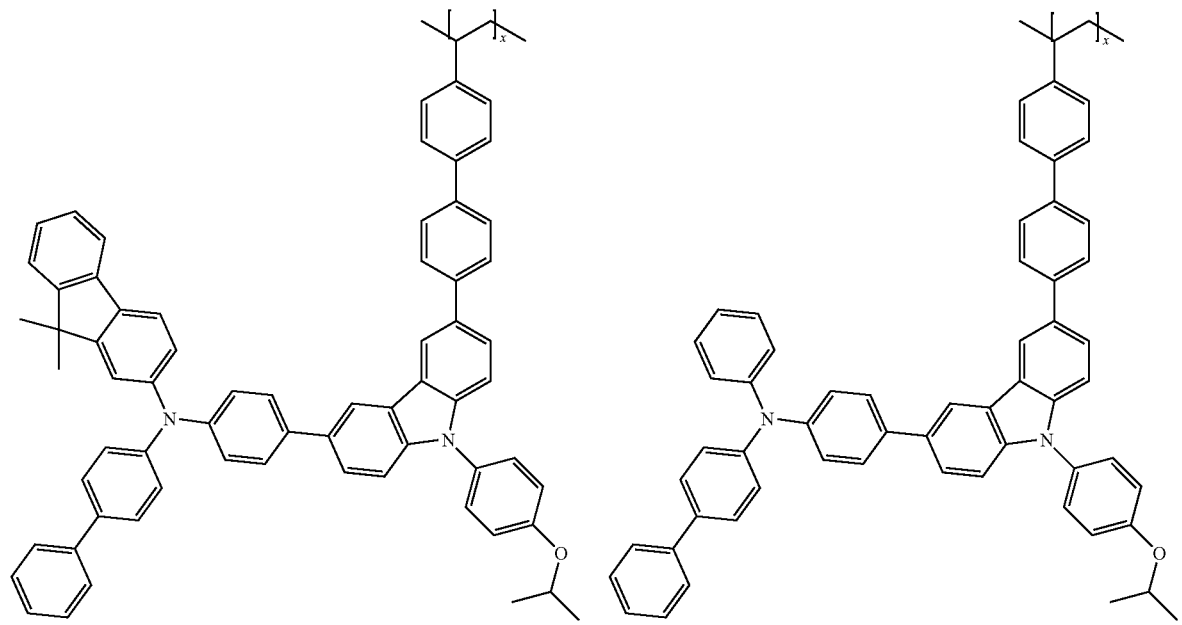
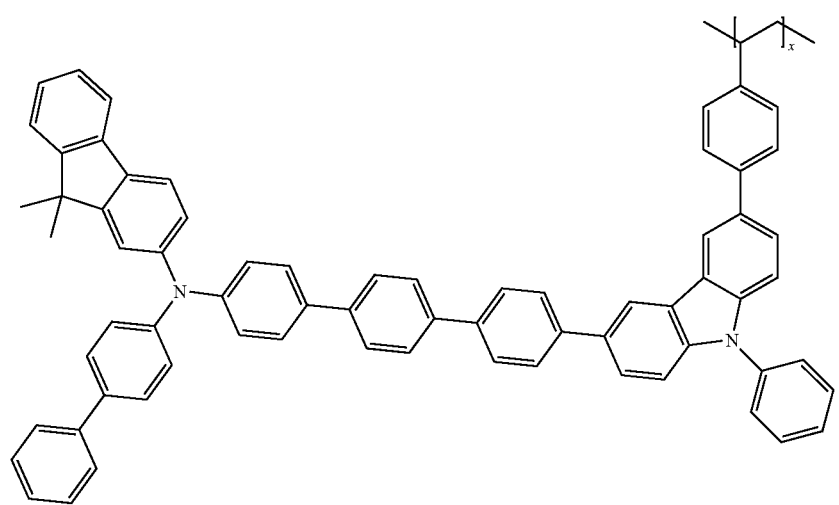

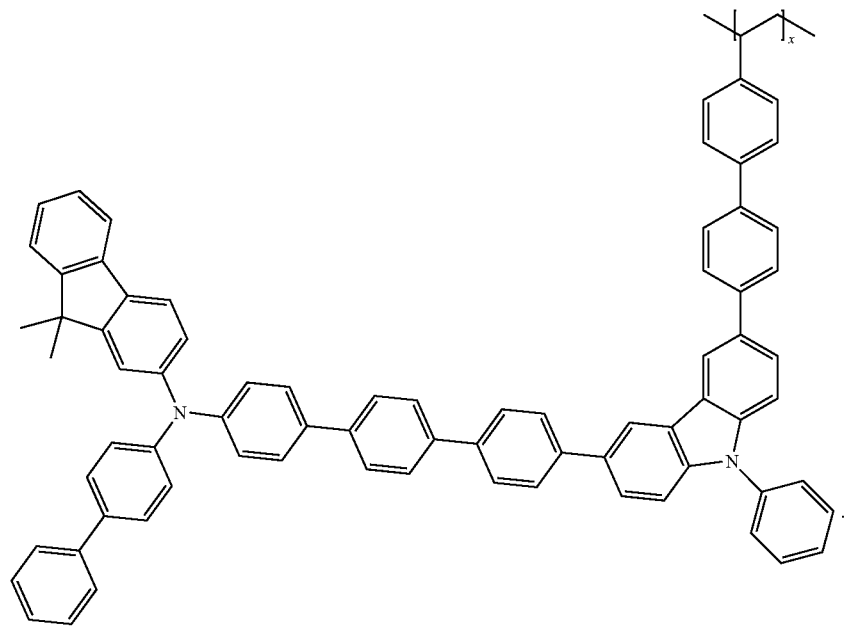

8. The polymer according to claim 1, wherein L₃ is a single bond, phenylene, -(phenylene)-O—, -(phenylene)-O—(butane-1,4-diyl), or biphenylylene.

9. The polymer according to claim 1, wherein
the Chemical Formula 2 is selected from the group consisting of repeating units represented by the following:

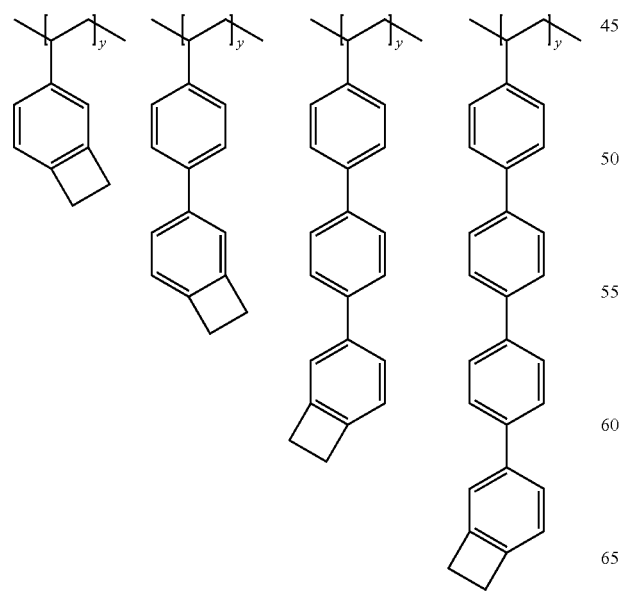

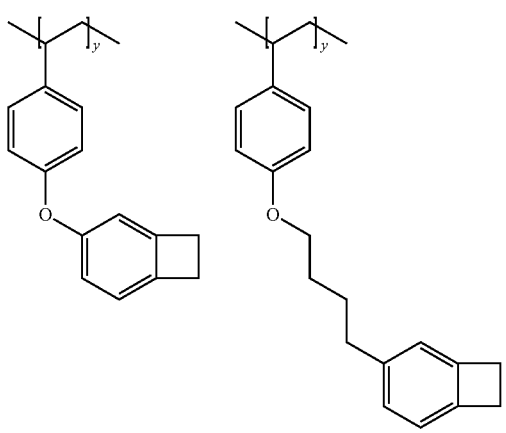

10. The polymer according to claim 1, wherein
L₄ is a single bond, phenylene, or biphenylylene.

11. The polymer according to claim 1, wherein
Ar₄ is cyclopropyl, cyclobutyl, cyclopentyl, cyclohexyl, cycloheptyl, phenyl, phenyl substituted with one or two C₁₋₄ alkyl, or biphenylyl.

12. The polymer according to claim 1, wherein
Ar₅ is hydrogen, phenyl, biphenylyl, terphenylyl, or quarterphenylyl.

13. The polymer according to claim 1, wherein
the Chemical Formula 3 is any one selected from the group consisting of repeating units represented by the following:

163
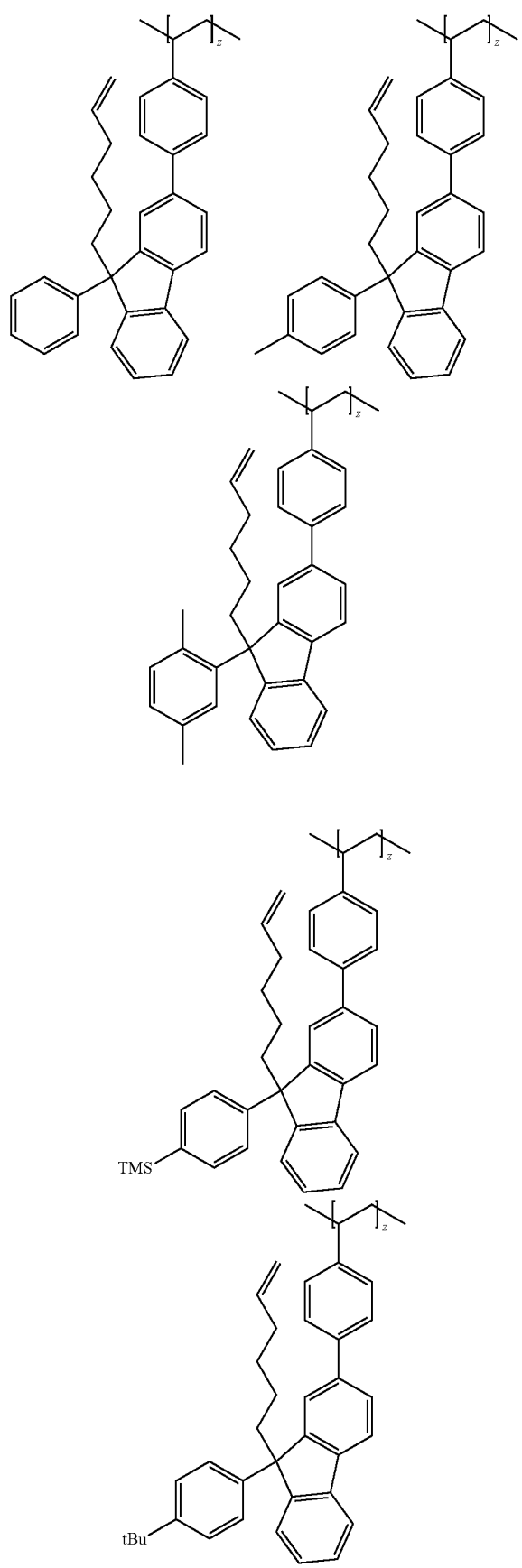
164
-continued
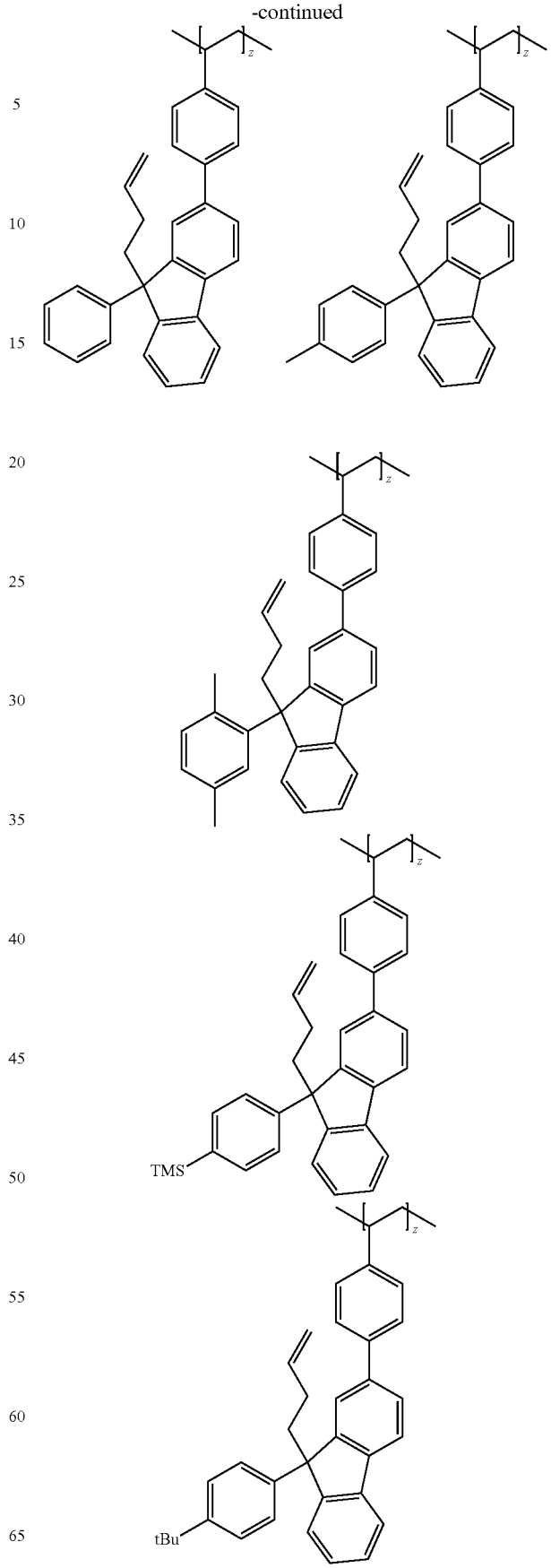

165
-continued
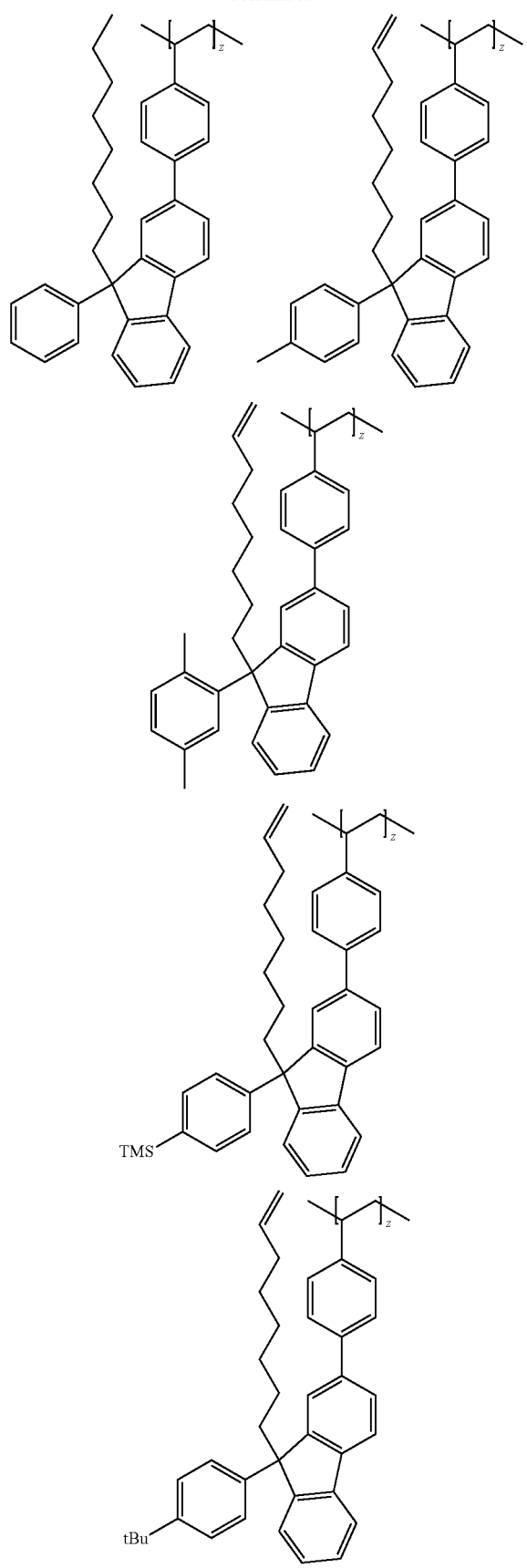
166
-continued
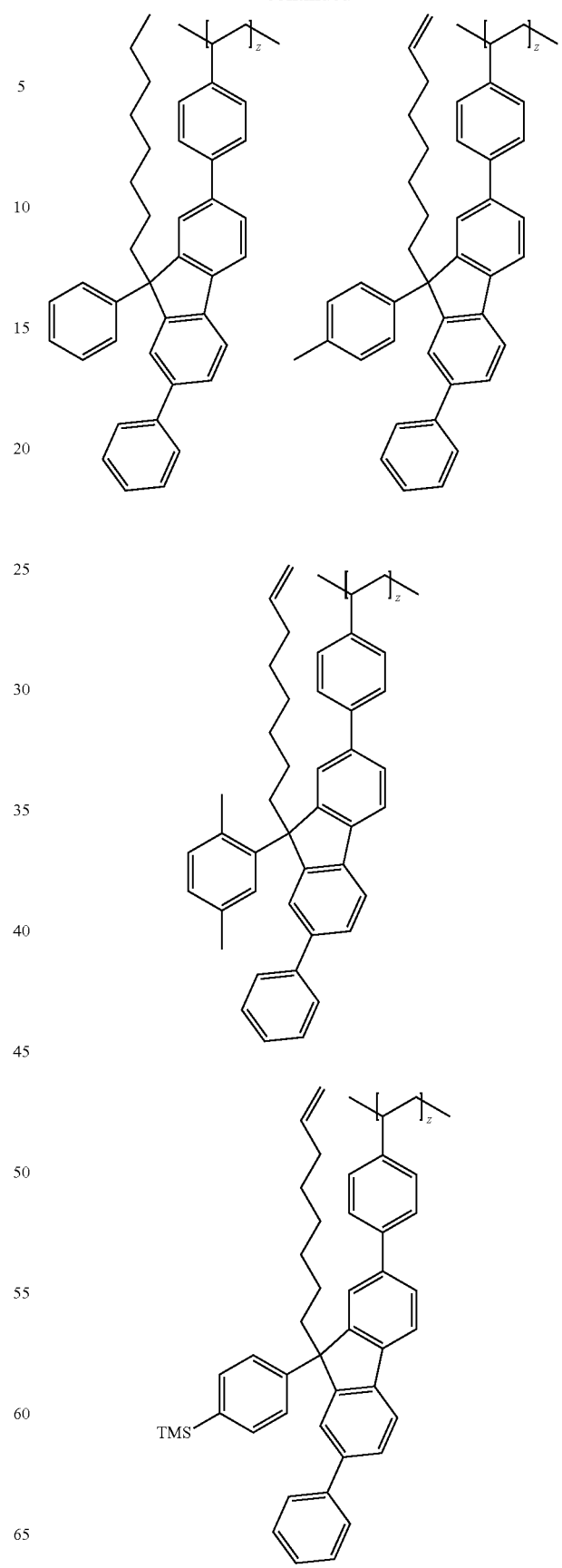

167
-continued
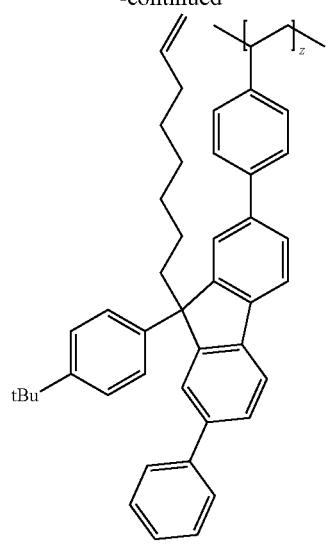
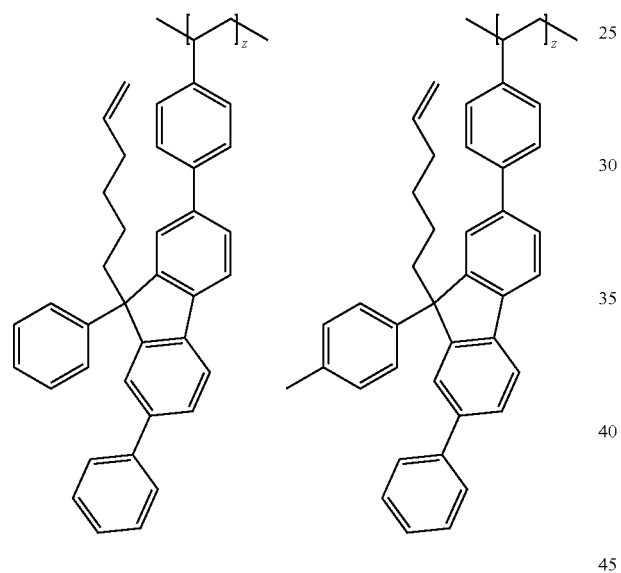
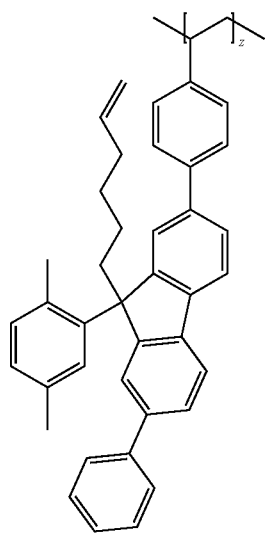
168
-continued
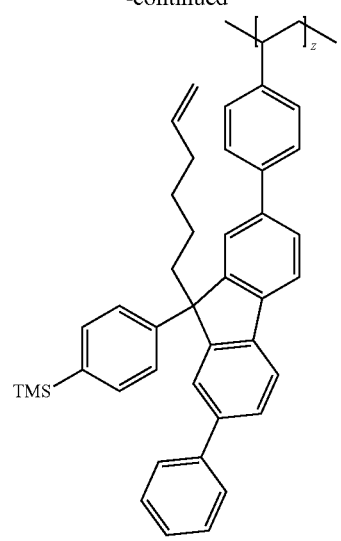
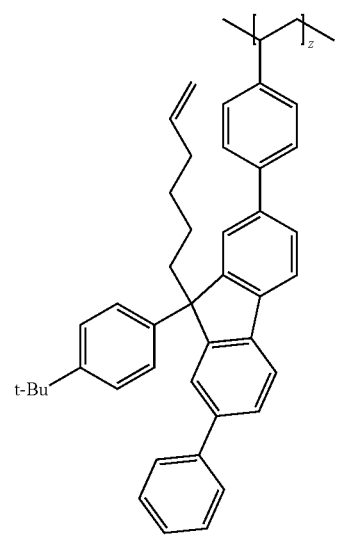
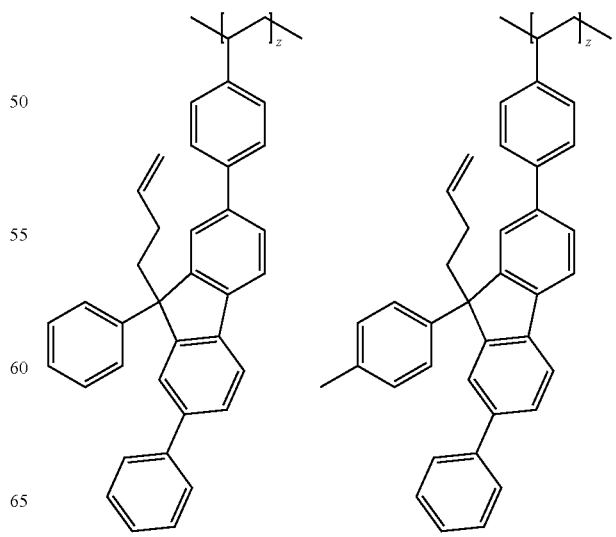

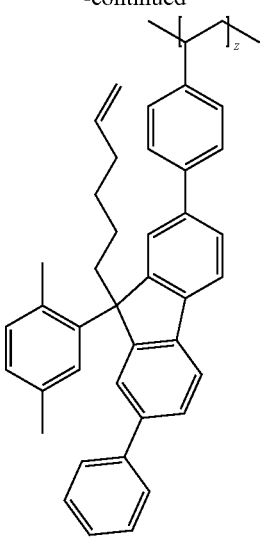

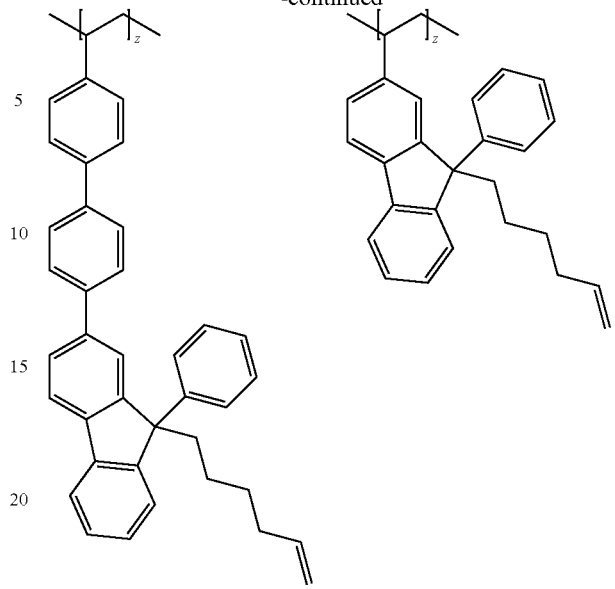

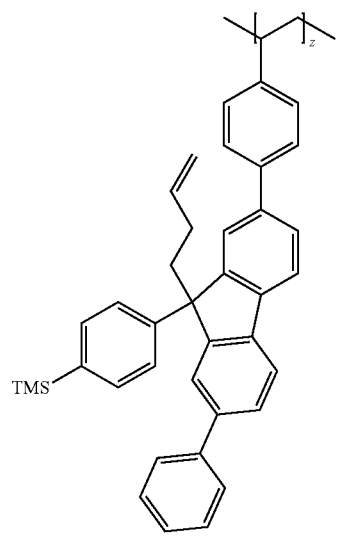

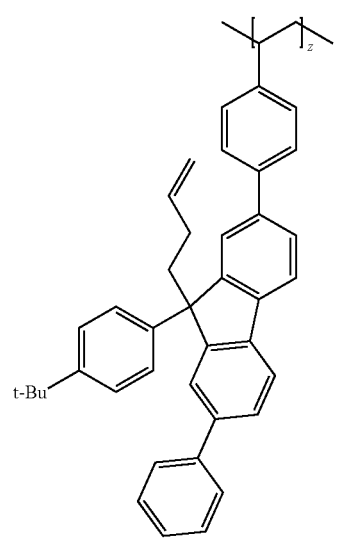

wherein TMS means trimethylsilyl and t-Bu means tert-butyl.

14. The polymer according to claim 1, wherein the weight average molecular weight of the polymer is 5,000 to 1,000,000.

15. An organic light emitting device comprising an anode; a cathode provided opposite to the anode; a light emitting layer provided between the anode and the cathode; and a hole transport layer provided between the anode and the light emitting layer, wherein the hole transport layer includes the polymer according to claim 1.

16. The organic light emitting device of claim 15, further comprising a doping material in the hole transport layer.

17. A method of preparing the polymer of claim 1, comprising polymerizing a monomer represented by Chemical Formula 1-1, a monomer represented by Chemical Formula 2-1, and a monomer represented by Chemical Formula 3-1,

[Chemical Formula 1-1]

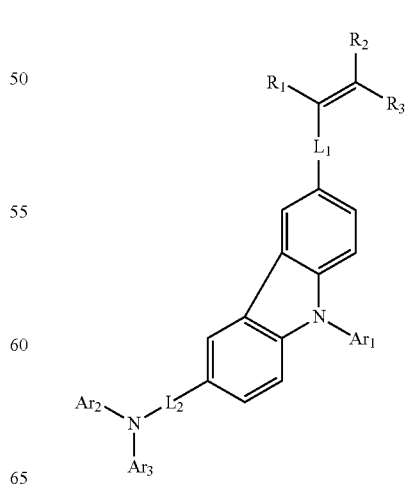

in Chemical Formula 1-1, $R_1$ to $R_3$, $L_1$, $L_2$ and $Ar_1$ to $Ar_3$ are the same as those defined in Chemical Formula 1,

[Chemical Formula 2-1]

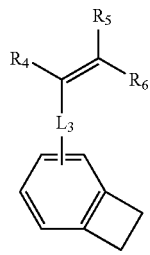

in Chemical Formula 2-1, $R_4$ to $R_6$, and $L_3$ are the same as those defined in Chemical Formula 2,

[Chemical Formula 3-1]

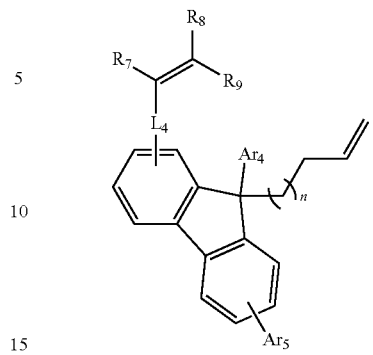

in Chemical Formula 3-1, $R_7$ to $R_9$, $L_4$, $Ar_4$, $Ar_5$, and n are the same as those defined in Chemical Formula 3.

18. A coating material comprising the polymer of claim 1 in an amount of 0.1 wt/v % to 20 wt/v %.

* * * * *